(12) United States Patent
Hu et al.

(10) Patent No.: US 12,387,674 B2
(45) Date of Patent: Aug. 12, 2025

(54) DISPLAY SUBSTRATE, WORKING METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Ming Hu, Beijing (CN); Huijuan Yang, Beijing (CN); Tingliang Liu, Beijing (CN); Yi Zhang, Beijing (CN); Kai Zhang, Beijing (CN); Haijun Qiu, Beijing (CN); Youngyik Ko, Beijing (CN); Tinghua Shang, Beijing (CN); Biao Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/274,477

(22) PCT Filed: Jul. 27, 2022

(86) PCT No.: PCT/CN2022/108286
§ 371 (c)(1),
(2) Date: Jul. 27, 2023

(87) PCT Pub. No.: WO2024/020867
PCT Pub. Date: Feb. 1, 2024

(65) Prior Publication Data
US 2025/0037652 A1    Jan. 30, 2025

(51) Int. Cl.
*G09G 3/3233*   (2016.01)
*H10K 59/121*   (2023.01)
*H10K 59/131*   (2023.01)

(52) U.S. Cl.
CPC ....... *G09G 3/3233* (2013.01); *H10K 59/1213* (2023.02); *H10K 59/131* (2023.02);
(Continued)

(58) Field of Classification Search
CPC .. G09G 3/3233; G09G 3/3258; G09G 3/3208; G09G 3/32
See application file for complete search history.

(56) References Cited

U.S. PATENT DOCUMENTS

2006/0273999 A1    12/2006   Yamazaki et al.
2020/0133040 A1*   4/2020    Bang ................ G02F 1/136227
(Continued)

FOREIGN PATENT DOCUMENTS

CN    111724745 A    9/2020
CN    112102785 A    12/2020
(Continued)

*Primary Examiner* — Yuzhen Shen

(74) *Attorney, Agent, or Firm* — Ling Wu; Stephen Yang; Ling and Yang Intellectual Property

(57) ABSTRACT

A display substrate, a working method thereof, and a display device. The display substrate includes K pixel rows and K is a positive integer greater than 1; at least one pixel row includes an initial signal line, a scan signal line, and a plurality of sub-pixels disposed sequentially along an extension direction of the initial signal line and the scan signal line; the initial signal line includes a third initial signal line, the scan signal line includes a second scan signal line, at least one sub-pixel includes a pixel drive circuit, the pixel drive circuit at least includes a third transistor as a drive
(Continued)

transistor and an eighth transistor as an initialization transistor; in at least a pixel row, the eighth transistor is connected with the third initial signal line, the second scan signal line, and a second electrode of the drive transistor.

18 Claims, 23 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0247* (2013.01)

(56) References Cited

U.S. PATENT DOCUMENTS

| | | | |
|---|---|---|---|
| 2021/0020108 A1 | 1/2021 | Chen et al. | |
| 2021/0027696 A1 | 1/2021 | Kim et al. | |
| 2021/0104196 A1 | 4/2021 | Yuan | |
| 2021/0134917 A1* | 5/2021 | Li | G09G 3/3266 |
| 2021/0183303 A1 | 6/2021 | Kim et al. | |
| 2021/0280127 A1 | 9/2021 | An et al. | |
| 2022/0157238 A1 | 5/2022 | Wang et al. | |
| 2023/0026444 A1 | 1/2023 | Qing | |
| 2023/0038629 A1 | 2/2023 | Zhang | |
| 2023/0070413 A1 | 3/2023 | Xu et al. | |
| 2023/0076760 A1* | 3/2023 | Xu | G09G 3/3241 |
| 2023/0095733 A1 | 3/2023 | Yuan et al. | |
| 2023/0116780 A1 | 4/2023 | Zhang | |
| 2023/0215314 A1* | 7/2023 | Ke | G09G 3/32 345/443 |

FOREIGN PATENT DOCUMENTS

| | | |
|---|---|---|
| CN | 112309316 A | 2/2021 |
| CN | 113272963 A | 8/2021 |
| CN | 113363287 A | 9/2021 |
| CN | 113555404 A | 10/2021 |
| CN | 113571000 A | 10/2021 |
| CN | 113571013 A | 10/2021 |
| CN | 113745254 A | 12/2021 |
| CN | 113763888 A | 12/2021 |
| CN | 113793568 A | 12/2021 |
| WO | 2022017042 A1 | 1/2022 |

\* cited by examiner

DISPLAY SUBSTRATE, WORKING METHOD THEREOF, AND DISPLAY DEVICE

CROSS-REFERENCE TO RELATED APPLICATION

The present application is a U.S. National Phase Entry of International Application No. PCT/CN2022/108286 having an international filing date of Jul. 27, 2022. The above-identified application is hereby incorporated by reference.

TECHNICAL FIELD

The present disclosure relates to, but is not limited to, the field of display technologies, and particularly relates to a display substrate and a working method thereof, and a display device.

BACKGROUND

An Organic Light Emitting Diode (OLED for short) is one of hotspots in the field of display research today. Compared with a Liquid Crystal Display (LCD for short), the OLED has the advantages such as low energy consumption, low production cost, self-illumination, wide viewing angle and fast response speed, and has been widely used in the field of display such as mobile phones, tablet computers and digital cameras.

Unlike the LCD which uses a stable voltage to control brightness, the OLED is driven by current, and the light emission of the OLED is controlled by a stable current. A pixel circuit, as a core technology of an OLED display product, is configured to output to a drive current to the OLED to drive the OLED to emit light.

SUMMARY

The following is a summary of subject matters described herein in detail. The summary is not intended to limit the protection scope of claims.

In a first aspect, an embodiment of the present disclosure provides a display substrate, the display substrate includes K pixel rows, and K is a positive integer greater than 1; at least one pixel row includes an initial signal line, a scan signal line, and a plurality of sub-pixels disposed sequentially along an extension direction of the initial signal line and the scan signal line;

the initial signal line includes a third initial signal line, the scan signal line includes a second scan signal line, and at least one sub-pixel includes a pixel drive circuit, and the pixel drive circuit includes at least a third transistor as a drive transistor and an eighth transistor as an initialization transistor;

in at least one pixel row, the eighth transistor is connected with the third initial signal line, the second scan signal line, and a second electrode of the drive transistor, and the eighth transistor is configured to supply an initial signal of the third initial signal line to the second electrode of the drive transistor under a control of the second scan signal line.

In an exemplary embodiment, third initial signal lines in two adjacent rows provide different initial signals, sub-pixels located in a same row emit light of a same color, and sub-pixels located in two adjacent rows emit light of different colors.

In an exemplary embodiment, the display substrate further includes a plurality of light emitting elements corresponding to the plurality of pixel drive circuits, a first scan signal line, a third scan signal line, a fourth scan signal line, a first initial signal line, a second initial signal line, a first power line, a light emitting control line, and a data signal line;

the pixel drive circuits are configured to drive the light emitting elements to emit light, and the pixel drive circuit includes a first reset sub-circuit, a second reset sub-circuit, a third reset sub-circuit, a write-in sub-circuit, a compensation sub-circuit, a drive sub-circuit and a light emitting sub-circuit;

the first reset sub-circuit is respectively connected with the first initial signal line, the second node and the first scan signal line, and is configured to write an initial signal of the first initial signal line into the second node under a control of the first scan signal line;

the second reset sub-circuit is respectively connected with the second initial signal line, the second scan signal line and the first electrode of the light emitting element, and is configured to write an initial signal of the second initial signal line into the first electrode of the light emitting element under a control of the second scan signal line;

the third reset sub-circuit is respectively connected with the third initial signal line, a third node and the second scan signal line, and is configured to write the initial signal of the third initial signal line into the third node under a control of the second scan signal line;

the write-in sub-circuit is respectively connected with the fourth scan signal line, the data signal line and the third node, and is configured to write a data signal of the data signal line to the third node under a control of the fourth scan signal line;

the compensation sub-circuit is respectively connected with the first power line, the third scan signal line, the first node and the second node, and is configured to provide a signal of the first node to the second node under a control of the third scan signal line until a signal of the second node meets a threshold condition;

the drive sub-circuit is electrically connected with the first node, the second node and the third node respectively, and is configured to provide a drive current to the third node under a control of the first node and the second node;

the light emitting sub-circuit is respectively connected with the first power line, the first node, the third node, the light emitting control line and the first electrode of the light emitting element, and is configured to write a signal of the first power line into the first node and a signal of the third node into the first electrode of the light emitting element under a control of the light emitting control line.

In an exemplary embodiment, the first reset sub-circuit includes a first transistor, the second reset sub-circuit includes a seventh transistor, and the third reset sub-circuit includes the eighth transistor;

a control electrode of the first transistor is connected with the first scan signal line, a first electrode of the first transistor is connected with the first initial signal line, and a second electrode of the first transistor is connected with the second node;

a control electrode of the eighth transistor is connected with the second scan signal line, a first electrode of the eighth transistor is connected with the third initial signal line, and a second electrode of the eighth transistor is connected with the third node;

a control electrode of the seventh transistor is connected with the second scan signal line, a first electrode of the seventh transistor is connected with the second initial signal line, and a second electrode of the seventh transistor is connected with the first electrode of the light emitting element.

In an exemplary embodiment, the write-in sub-circuit includes a fourth transistor;
  a control electrode of the fourth transistor is connected with the fourth scan signal line, a first electrode of the fourth transistor is connected with the data signal line, and a second electrode of the fourth transistor is connected with the third node.

In an exemplary embodiment, the compensation sub-circuit includes the second transistor and a storage capacitor;
  a control electrode of the second transistor is connected with a third scan signal line, a first electrode of the second transistor is connected with the second node, and a second electrode of the second transistor is connected with the first node;
  a first electrode plate of the storage capacitor is connected with the second node and the second electrode plate of the storage capacitor is connected with the first power line.

In an exemplary embodiment, the drive sub-circuit includes the third transistor;
  a control electrode of the third transistor is connected with the second node, a first electrode of the third transistor is connected with the first node, and a second electrode of the third transistor is connected with the third node;

In an exemplary embodiment, the light emitting sub-circuit includes a fifth transistor and a sixth transistor;
  a control electrode of the fifth transistor is connected with the light emitting control line, a first electrode of the fifth transistor is connected with the first power line, and a second electrode of the fifth transistor is connected with the first node;
  a control electrode of the sixth transistor is connected with the light emitting control line, a first electrode of the sixth transistor is connected with the third node, and a second electrode of the sixth transistor is connected with the first electrode of the light emitting element.

In an exemplary embodiment, the first reset sub-circuit includes a first transistor, the second reset sub-circuit includes a seventh transistor, the third reset sub-circuit includes the eighth transistor, the write-in sub-circuit includes a fourth transistor, the compensation sub-circuit includes a second transistor and a storage capacitor, the drive sub-circuit includes the third transistor, and the light emitting sub-circuit includes a fifth transistor and a sixth transistor;
  a control electrode of the first transistor is connected with the first scan signal line, a first electrode of the first transistor is connected with the first initial signal line, and a second electrode of the first transistor is connected with the second node;
  a control electrode of the second transistor is connected with a third scan signal line, a first electrode of the second transistor is connected with the second node, and a second electrode of the second transistor is connected with the first node;
  a control electrode of the third transistor is connected with the second node, a first electrode of the third transistor is connected with the first node, and a second electrode of the third transistor is connected with the third node;
  a control electrode of the fourth transistor is connected with the fourth scan signal line, a first electrode of the fourth transistor is connected with the data signal line, and a second electrode of the fourth transistor is connected with the third node;
  a control electrode of the fifth transistor is connected with the light emitting control line, a first electrode of the fifth transistor is connected with the first power line, and a second electrode of the fifth transistor is connected with the first node;
  a control electrode of the sixth transistor is connected with the light emitting control line, a first electrode of the sixth transistor is connected with the third node, and a second electrode of the sixth transistor is connected with the first electrode of the light emitting element;
  a control electrode of the seventh transistor is connected with the second scan signal line, a first electrode of the seventh transistor is connected with the second initial signal line and a second electrode of the seventh transistor is connected with the first electrode of the light emitting element;
  a control electrode of the eighth transistor is connected with the second scan signal line, a first electrode of the eighth transistor is connected with the third initial signal line, and a second electrode of the eighth transistor is connected with the third node;
  a first electrode plate of the storage capacitor is connected with the second node and the second electrode plate of the storage capacitor is connected with the first power line.

In an exemplary embodiment, the first transistor and the second transistor are oxide transistors, and the third transistor to the eighth transistor are low-temperature poly-crystalline silicon transistors.

In an exemplary embodiment, in a plane perpendicular to the display substrate, the display substrate includes a base substrate and a first semiconductor layer, a first conductive layer, a second conductive layer, a second semiconductor layer, a third conductive layer, a fourth conductive layer and a fifth conductive layer which are sequentially stacked on the base substrate;
  the first semiconductor layer includes an active layer of a plurality of low temperature poly-crystalline silicon transistors; the first conductive layer includes control electrodes of a plurality of poly-crystalline silicon transistors and the first electrode plate of the storage capacitor; the second conductive layer includes the second electrode plate of the storage capacitor; the second semiconductor layer includes active layers of a plurality of oxide transistors; the third conductive layer includes control electrodes of a plurality of oxide transistors; the fourth conductive layer includes first electrodes and second electrodes of a plurality of poly-crystalline silicon transistors, first electrodes and second electrodes of a plurality of oxide transistors, and the third initial signal line; and the fifth conductive layer includes a data signal line and a first power line.

In an exemplary embodiment, in a plane perpendicular to the display substrate, the display substrate includes a base substrate and a shielding layer, a first insulation layer, a first semiconductor layer, a second insulation layer, a first conductive layer, a third insulation layer, a second conductive layer, a fourth insulation layer, a second semiconductor layer, a fifth insulation layer, a third conductive layer, a sixth insulation layer, a fourth conductive layer, a seventh insulation layer, a first planarization layer and a fifth conductive layer which are sequentially stacked on the base substrate;
  the first semiconductor layer includes active layers of the third transistor to the eighth transistor; the first conductive layer includes control electrode of the third transistor to the eighth transistor, the first electrode plate of the storage capacitor, and the first initial signal line; the second conductive layer includes the second electrode plate of the storage capacitor; the second semiconductor includes active layers of the first transistor and the second transistor; the third conductive layer includes a first scan signal line, a third scan signal line, and a second initial signal line; the fourth conductive layer includes first electrodes and second electrodes of the first transistor to the eighth transistor, and a connection electrode of the second electrode plate, and the third initial signal line; the fifth conductive layer includes a data signal line, a first power line and an anode connection electrode of the light emitting element.

In an exemplary embodiment, the shielding layer includes a first shielding structure, a second shielding structure, a third shielding structure, and a shielding block;
  in a plane where the display substrate is located, the first shielding structure is a strip shape extending along the first direction, the first shielding structure is disposed at a side of the shielding block in the first direction and connected with the shielding block; the second shielding structure is a strip shape extending along the second direction, the second shielding structure is disposed at a side of the shielding block in the second direction and connected with the shielding block; the third shielding structure is in a shape of a bend line extending along the second direction, the third shielding structure is disposed on an opposite side of the second direction Y of the shielding block and connected with the shielding block;
  an orthographic projection of the channel region of the active layer of the third transistor on the base substrate is within a range of an orthographic projection of the shielding block on the base substrate.

In an exemplary embodiment, a first shielding structure of each pixel drive circuit is connected with a shielding block of a pixel drive circuit adjacent in the first direction; the second shielding structure of each pixel drive circuit is connected with a third shielding structure of a pixel drive circuit adjacent in the second direction.

In an exemplary embodiment, the active layer of the third transistor to the active layer of the seventh transistor are connected to each other and form an integrated structure;
  a shape of the active layer of the third transistor is an inverted "Ω" shape and a shape of the active layer of the fourth transistor to the active layer of the eighth transistor is an "I" shape;
  in a plane where the first semiconductor is located, in the first direction, the active layer of the fourth transistor, the active layer of the sixth transistor are located on a same side of the active layer of the third transistor, the active layer of the fifth transistor is located on the other side of the active layer of the third transistor, and the active layer of the eighth transistor is located between the active layer of the fifth transistor and the active layer of the seventh transistor; in the second direction, the active layer of the fourth transistor, the active layer 26 of the sixth transistor are located on both sides of the active layer of the third transistor, the active layer of the fifth transistor, the active layer of the sixth transistor, the active layer of the seventh transistor, the active layer of the eighth transistor are located on a same side of the active layer of the third transistor, and the active layer of the seventh transistor is located on a side of the active layer of the sixth transistor away from the active layer of the fourth transistor.

In an exemplary embodiment, in a plane where the first conductive layer is located, the main body parts of the second scan signal line, the light emitting control line, the fourth scan signal line and the first initial signal line extend along the first direction, and in a same pixel drive circuit, the second scan signal line, the light emitting control line, the first electrode plate of the storage capacitor, the fourth scan signal line and the first initial signal line are sequentially arranged along the second direction;
  the first electrode plate is in a shape of a rectangle and corners of the rectangular shape may be chamfered, an orthographic projection of the first electrode plate on the base substrate is overlapped with an orthographic projection of an active layer of the third transistor on the base substrate, and the first electrode plate is multiplexed as the control electrode of the third transistor;
  an overlapping area between the fourth scan signal line and the active layer of the fourth transistor serves as the control electrode of the fourth transistor, an overlapping area between the light emitting control line and the active layer of the fifth transistor serves as the control electrode of the fifth transistor, an overlapping area between the light emitting control line and the active layer of the sixth transistor serves as the control electrode of the sixth transistor, an overlapping area between the second scan signal line and the active layer of the seventh transistor serves as the control electrode of the seventh transistor, and an overlapping area between the second scan signal line and the active layer of the eighth transistor serves as the control electrode of the eighth transistor.

In an exemplary embodiment, the second conductive layer further includes a first shielding line and a second shielding line;
  in a plane where the second conductive layer is located, the main body parts of the first shielding line and the second shielding line extend along the first direction; in the second direction, the second shielding line is located between the first shielding line and the second electrode plate;
  the first shielding line is configured as a shielding layer of the first transistor, shielding a channel of the first transistor; the second shielding line is configured as a shielding layer of the second transistor, shielding a channel of the second transistor;
  the second electrode plate is in a shape of a rectangle and corners of the rectangular shape may be chamfered, an orthographic projection of the second electrode plate on the base substrate is overlapped with an orthographic projection of the first electrode plate on the base substrate.

In an exemplary embodiment, the active layer of the first transistor and the active layer of the second transistor are connected to each other and form an integrated structure;
  a shape of the active layer of the first transistor and the active layer of the second transistor is an "I" shape, the first transistor and the second transistor each includes a first region and a second region, and the second region of the active layer of the first transistor serves as the first region of the active layer of the second transistor;
  in a plane where the display substrate is located, in the first direction, the active layer of the first transistor and the active layer of the second transistor are located on a side of the active layer of the third transistor away from the active layer of the fourth transistor; in the second direction, the active layer of the first transistor and the active layer of the second transistor are located on a side of the active layer of the third transistor away from the active layer of the fifth transistor, and the active layer of the first transistor is located on a side of the active layer of the second transistor away from the active layer of the third transistor.

In an exemplary embodiment, in a plane where the third conductive layer is located, the main body parts of the first scan signal line, the third scan signal line, and the second initial signal line extend along the first direction, in the second direction, the third scan signal line is located between the first scan signal line and the second initial signal line;

an overlapping area between the first scan signal line and the active layer of the first transistor serves as a control electrode of the first transistor and an overlapping area between the third scan signal line and the active layer of the second transistor serves as a control electrode of the second transistor.

In an exemplary embodiment, the second electrode of the first transistor and the first electrode of the second transistor are of an integrated structure and the second electrode of the first transistor is connected with the first electrode plate through a via; the first electrode of the first transistor is connected with the first initial signal line through a via; the second electrode of the second transistor, the first electrode of the third transistor, and the second electrode of the fifth transistor are of an integrated structure; the first electrode of the fourth transistor is connected with the data signal line through a via; the second electrode of the fourth transistor, the second electrode of the third transistor, the first electrode of the sixth transistor, and the second electrode of the eighth transistor are of an integrated structure; the fifth connection electrode is connected with the first power line through a via; the second electrode of the sixth transistor and the second electrode of the seventh transistor are of an integrated structure, the second electrode of the sixth transistor and the second electrode of the seventh transistor are connected with the anode connection electrode of the light emitting element through a via; the first electrode of the seventh transistor is connected with the second initial signal line through a via; the second electrode plate is connected with the first power line through a via; the third initial signal line serves as a first electrode of the eighth transistor.

In an exemplary embodiment, in a plane where the fifth conductive layer is located, the data signal line is in a shape of a bend line in which the main body part extends along the second direction, and the data signal line is connected with the first electrode of the fourth transistor through a via; the first power line is in a shape of a bend line in which the main body part extends along the second direction and the first power line is connected with the second electrode plate and the first electrode of the fifth transistor through a via; the anode connection electrode is connected with the second electrode of the sixth transistor and the second electrode of the seventh transistor through a via.

In an exemplary embodiment, in a plane where the display substrate is located, the main body parts of the first scan signal line and the third initial signal line extend along the first direction, in the second direction, in a same pixel row, orthographic projections of the third initial signal line and the first scan signal line on the base substrate is located on both sides of an orthographic projection of the storage capacitor on the base substrate.

In an exemplary embodiment, the second electrode plate is provided with an opening, the opening is located in the middle of the second electrode plate, the opening is rectangular and makes the second electrode plate form an annular structure, the opening exposes a third insulation layer covering the first electrode plate, and an orthographic projection of the first electrode plate on the base substrate includes an orthographic projection of the opening on the base substrate;

the active layers of the first transistor to the eighth transistor each includes a first region and a second region; the fifth insulation layer and the sixth insulation layer are provided with a first via, a second via, and a third via; the second insulation layer, the third insulation layer, the fourth insulation layer, the fifth insulation layer and the sixth insulation layer are provided with a fourth via, a fifth via, a sixth via, a seventh via, an eighth via, a ninth via, a tenth via, and an eleventh via; the third insulation layer, the fourth insulation layer, the fifth insulation layer, and the sixth insulation layer are provided with a twelfth via and a fourteenth via; the fourth insulation layer, the fifth insulation layer, and the sixth insulation layer are provided with a thirteenth via; the sixth insulation layer is provided with a fifteenth via; the seventh insulation layer and the first planarization layer are provided with a sixteenth via, a seventeenth via, an eighteenth via, and a nineteenth via;

the first via exposes a first region of the active layer of the first transistor, the second via exposes a second region of the active layer of the second transistor, and the third via exposes a first region of the active layer of the second transistor and the second region of the active layer of the first transistor; the fourth via exposes a second region of the active layer of the third transistor, a first region of the active layer of the sixth transistor, and a second region of the active layer of the fourth transistor; the fifth via exposes a first region of the active layer of the fourth transistor; the sixth via exposes a first region of the active layer of the fifth transistor; the seventh via exposes a second region of the active layer of the fifth transistor and a first region of the active layer of the third transistor; the eighth via exposes a second region of the active layer of the sixth transistor and a second region of the active layer of the seventh transistor; the ninth via exposes a first region of the active layer of the seventh transistor; the tenth via exposes a first region of the active layer of the eighth transistor; the eleventh via exposes a second region of the active layer of the eighth transistor; the twelfth via exposes the first electrode plate; the thirteenth via exposes the second electrode plate; the fourteenth via exposes the first initial signal line; the fifteenth via exposes the second initial signal line; the sixteenth via exposes the first electrode of the fourth transistor; the seventeenth via exposes the connection electrode of the second electrode plate; the eighteenth via exposes the second electrode of the sixth transistor and the second electrode of the seventh transistor; the nineteenth via exposes the first electrode of the fifth transistor;

the first electrode of the first transistor is connected with the active layer of the first transistor through the first via; the second electrode of the second transistor is connected with the active layer of the second transistor through the second via; the second electrode of the first transistor is connected with the active layer of the first transistor through the third via and the first electrode of the second transistor is connected with the active layer of the second transistor through the third via; the second electrode of the third transistor is connected with the active layer of the third transistor through the fourth via, the second electrode of the fourth transistor is connected with the active layer of the fourth transistor through the fourth via, the first electrode of the sixth transistor is connected with the active layer of the sixth transistor through the fourth via, and the first electrode of the active layer of the fourth transistor is connected with the active layer of the fourth transistor through the fifth via; the first electrode of the fifth transistor is connected with the active layer of the fifth transistor through the sixth via; the second electrode of the fifth transistor is connected with the active layer of the fifth transistor through the seventh via and the first electrode of the third transistor is connected with the active layer of the third transistor through the seventh via; the second electrode of the sixth transistor is connected with the active layer of the sixth transistor through the eighth via and the second electrode of the seventh transistor is connected with the active layer of the seventh transistor through the eighth via; the first electrode of the seventh transistor is connected with the active layer of the seventh transistor through the ninth via; the third initial signal line is connected with the active layer of the eighth transistor through the tenth via; the second electrode of the eighth transistor is connected with the active layer of the eighth transistor through the eleventh via; the second electrode of the first transistor is connected with the first electrode plate through the twelfth via; the connection electrode of the second electrode plate is connected with the second electrode plate through the thirteenth via; the first electrode of the first transistor is connected with the first initial signal line through the fourteenth via; the first electrode of the seventh transistor is connected with the first initial signal line through the fifteenth via; the data signal line is connected with the first electrode of the fourth transistor through the sixteenth via; the first power line is connected with the connection electrode of the second electrode plate through the seventeenth via; the second electrode of the sixth transistor and the second electrode of the seventh transistor are connected with the anode connection electrode through the eighteenth via; the first power line is connected with the first electrode of the fifth transistor through the nineteenth via.

In a second aspect, an embodiment of the present disclosure further provides a display device, including the display substrate according to any one of the embodiments described above.

In a third aspect, an embodiment of the present disclosure further provides a working method of a display substrate, the display substrate includes K pixel rows and K is a positive integer greater than 1; at least one pixel row includes an initial signal line, a scan signal line, and a plurality of sub-pixels disposed sequentially along an extension direction of the initial signal line and the scan signal line; the initial signal line includes a third initial signal line, the scan signal line includes a second scan signal line, and at least one sub-pixel includes a pixel drive circuit, the pixel drive circuit at least includes a third transistor as a drive transistor and an eighth transistor as an initialization transistor; in at least a pixel row, the eighth transistor is connected with the third initial signal line, the second scan signal line, and a second electrode of the drive transistor; the working method including:

the eighth transistor provides an initial signal of the third initial signal line to the second electrode of the drive transistor under the control of the second scan signal line.

Other aspects may be understood upon reading and understanding the drawings and detailed description.

BRIEF DESCRIPTION OF DRAWINGS

The drawings are intended to provide a further understanding for the technical solutions of the present disclosure and form a part of the specification, and are used to explain the technical solutions of the present disclosure together with embodiments of the present disclosure, and do not form limitations on the technical solutions of the present disclosure. Shapes and sizes of each component in the drawings do not reflect actual scales, and are only intended to schematically illustrate contents of the present disclosure.

DETAILED DESCRIPTION

Figure 1:
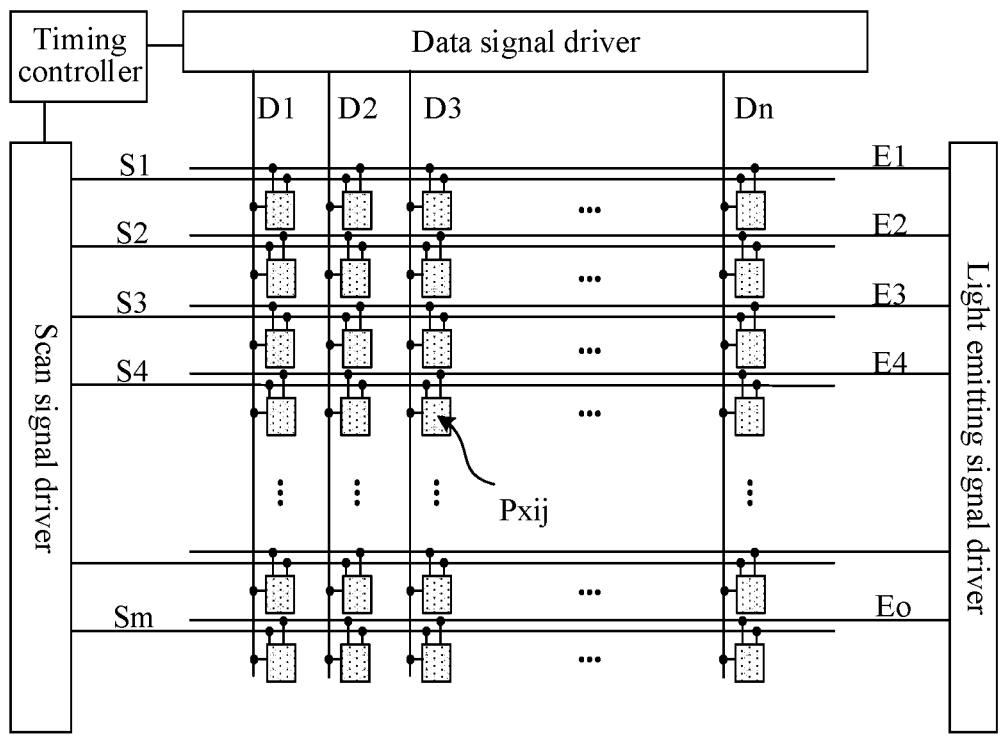
FIG. 1 is a schematic diagram of a structure of a display device.

The embodiments of the present disclosure will be described in detail below with reference to the drawings. Embodiments may be implemented in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in following embodiments only. The embodiments in the present disclosure and features in the embodiments may be combined randomly with each other if there is no conflict. In order to keep the following description of the examples of the present disclosure clear and concise, detailed descriptions of a portion of known functions and known components are omitted in the present disclosure. The drawings in the examples of the present disclosure relate only to the structures involved in the examples of the present disclosure, and other structures may be described with reference to conventional designs.

Scales of the drawings in the present disclosure may be used as a reference in the actual process, but are not limited thereto. For example, a thickness and a pitch of each film layer, and a width and a pitch of each signal line may be adjusted according to an actual situation. The drawings described in the present disclosure are only schematic diagrams of structures, and one implementation of the present disclosure is not limited to shapes or numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to a direction which is used for describing each constituent element. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel area between the drain electrode (drain electrode terminal, drain area, or drain) and the source electrode (source electrode terminal, source area, or source), and a current can flow through the drain electrode, the channel area, and the source electrode. It is to be noted that, in the specification, the channel area refers to an area through which the current mainly flows.

In the specification, a first electrode may be a drain electrode, and a second electrode may be a source electrode; alternatively, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification. In an embodiment of the present disclosure, the gate electrode may be referred to as a control electrode.

In the specification, "electrical connection" includes a case that constituent elements are connected together through an element with a certain electrical effect. The "element with a certain electrical effect" is not particularly limited as long as electrical signals may be sent and received between the connected constituent elements. Examples of the "element with a certain electrical effect" not only include electrodes and wirings, but also include switch elements such as transistors, resistors, inductors, capacitors, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In an embodiment of the present disclosure, "about" refers to a value allowed within the range of process and measurement error that is not strictly limited.

The drive circuit of a display product occupies a large area, which is not conducive to the achievement of a narrow frame of the display product, and the brightness display is abnormal when switching between black and white.

FIG. 1 is a schematic diagram of a structure of a display device, a display substrate may include a timing controller, a data signal driver, a scan signal driver, a light emitting signal driver and a pixel array. The timing controller is connected with the data signal driver, the scan signal driver and the light emitting signal driver, respectively, the data signal driver is connected with a plurality of data signal lines (D1 to Dn) respectively, the scan signal driver is connected with a plurality of scan signal lines (S1 to Sm) respectively, and the light emitting signal driver is connected with a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected with the circuit unit, and the circuit unit may include at least one scan signal line, at least one data signal line, at least one light emitting signal line, and a pixel drive circuit. In an exemplary implementation, the timing controller may provide the data signal driver with a gray-scale value and a control signal suitable for a specification of the data signal driver, may provide the scan signal driver with a clock signal, a scan starting signal, etc., suitable for a specification of the scan signal driver, and may provide the light emitting signal driver with a clock signal, an emission stopping signal, etc., suitable for a specification of the light emitting signal driver. The data signal driver may generate data voltages to be provided to the data signal lines D1, D2, D3, . . . , and Dn using a gray scale value and a control signal that are received from the timing controller. For example, the data signal driver may sample the gray scale value using a clock signal and apply a data voltage corresponding to the gray scale value to the data signal lines D1 to Dn by taking a pixel row as a unit, wherein n may be a natural number. The scan signal driver may generate scan signals to be provided to the scan signal lines S1, S2, S3, . . . , and Sm by receiving the clock signal and a scan initial signal from the timing controller. For example, the scan signal driver may sequentially provide a scan signal with an on-level pulse to the scan signal lines S1 to Sm. For example, the scan signal driver may be constructed in a form of a shift register and generate a scan signal in a manner of sequentially transmitting a scan start signal provided in a form of an on-level pulse to a next-stage circuit under control of the clock signal, wherein m may be a natural number. The light emitting signal driver may receive a clock signal, a transmit stop signal, etc., from the timing controller to generate a transmit signal to be provided to the light emitting signal lines E1, E2, E3, . . . , and Eo. For example, the light emitting signal driver may sequentially provide a transmit signal with an off-level pulse to the light emitting signal lines E1 to Eo. For example, the light emitting driver may be constructed in a form of a shift register, and may generate a transmit signal in a manner in which the transmit stop signal provided in a form of an off-level pulse is transmitted to a next-stage circuit sequentially under the control of the clock signal, wherein o may be a natural number.

Figure 2:
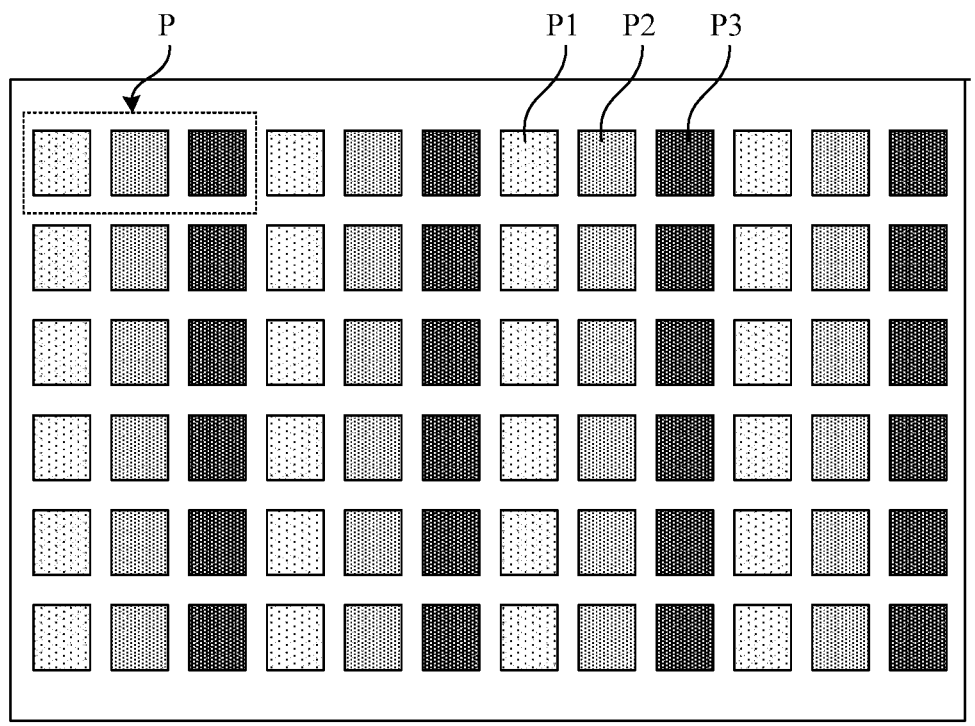
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light emitting device. Pixel drive circuits in the first sub-pixel P1, the second sub-pixel P2, and the third sub-pixel P3 are connected with a scan signal line, a data signal line, and a light emitting signal line respectively. A pixel drive circuit is configured to receive a data voltage transmitted by a data signal line under control of a scan signal line and a light emitting signal line, and output a corresponding current to a light emitting device. A light emitting device in each of the first sub-pixel P1, the second sub-pixel P2, and the third sub-pixel P3 is connected with a pixel drive circuit of a sub-pixel where the light emitting device is located, and is configured to emit light with corresponding brightness in response to a current output by the pixel drive circuit of the sub-pixel where the light emitting device is located.

In an exemplary embodiment, a red (R) sub-pixel, a green (G) sub-pixel, and a blue (B) sub-pixel may be included in a pixel unit P. In an exemplary embodiment, a sub-pixel in the pixel unit may be in a shape of a rectangle, a rhombus, a pentagon, or a hexagon. Three sub-pixels may be arranged side by side horizontally, side by side vertically, or in a manner like a Chinese character "品", which is not limited in the present disclosure.

Figure 3:
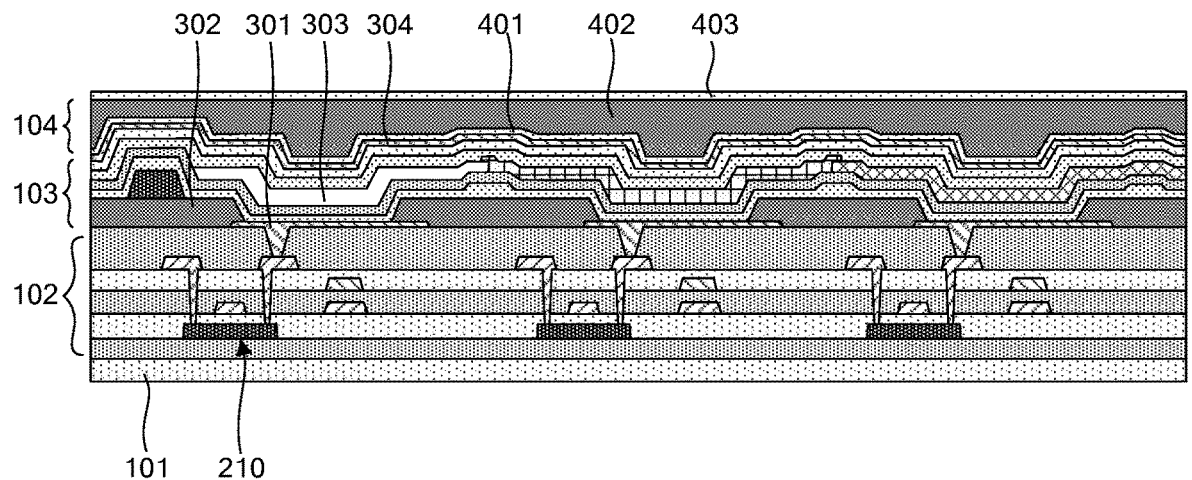
FIG. 3 is a schematic diagram of a cross-sectional structure of a display substrate.

FIG. 3 is a schematic diagram of a cross-sectional structure of a display substrate, which illustrates a structure of three sub-pixels of an OLED display substrate. As shown in FIG. 3, on a plane perpendicular to the display substrate, the display substrate may include a drive circuit layer 102 disposed on a base substrate 101, a light emitting structure layer 103 disposed on a side of the drive circuit layer 102 away from the base substrate 101, and an encapsulation layer 104 disposed on a side of the light emitting structure layer 103 away from the base substrate 101. In some possible implementations, the display substrate may include other film layers, such as a post spacer, which is not limited in the present disclosure.

In an exemplary embodiment, the base substrate 101 may be a flexible base substrate, or may be a rigid base substrate. The drive circuit layer 102 of each sub-pixel may include a plurality of transistors and a storage capacitor forming a pixel drive circuit. The light emitting structure layer 103 may include an anode 301, a pixel definition layer 302, an organic emitting layer 303, and a cathode 304. The anode 301 is connected with a drain electrode of a drive transistor 210 through a via. The organic emitting layer 303 is connected with the anode 301. The cathode 304 is connected with the organic light emitting layer 303. The organic emitting layer 303 is driven by the anode 301 and the cathode 304 to emit light of a corresponding color. The encapsulation layer 104 may include a first encapsulation layer 401, a second encapsulation layer 402, and a third encapsulation layer 403 that are stacked, the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 so as to prevent external water vapor from entering the light emitting structure layer 103.

In an exemplary embodiment, the organic emitting layer 303 may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) which are stacked. In an exemplary embodiment, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, light emitting layers of adjacent sub-pixels may be overlapped slightly or may be isolated from each other, and electron block layers of adjacent sub-pixels may be overlapped slightly or may be isolated from each other.

In an exemplary embodiment, the pixel drive circuit may be in a 3T1C, 4T1C, 5T1C, 5T2C, 6T1C, or 7T1C structure. FIG. 4 is a schematic diagram of an equivalent circuit of a pixel drive circuit. As shown in FIG. 4, the pixel drive circuit may include seven transistors (a first transistor T1 to a seventh transistor T7) and one storage capacitor C, and the pixel drive circuit may be connected with seven signal lines (a data signal line D, a first scan signal line S1, a second scan signal line S2, a light emitting signal line E, an initial signal line INIT, a first power line VDD, and a second power line VSS).

In an exemplary embodiment, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor T1, a first electrode of the second transistor T2, a control electrode of the third transistor T3, and a first electrode plate of the storage capacitor C, and the third node N3 is respectively connected with a second electrode of the second transistor T2, a second electrode of the third transistor T3, and a first electrode of the sixth transistor T6.

In an exemplary embodiment, a second electrode plate of the storage capacitor C is connected with the first power line VDD, and the first electrode plate of the storage capacitor C is connected with the second node N2, i.e., the first electrode plate of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected to the second electrode of the third transistor T3.

The control electrode of the third transistor T3 is connected to the second node N2, i.e., the control electrode of the third transistor T3 is connected with the first electrode plate of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines a magnitude of a drive current flowing between the first power line VDD and the second power line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and the second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power line VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power line VDD and the second power line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary embodiment, a second electrode of the light emitting device is connected with the second power line VSS, a signal of the second power line VSS is a low-level signal, and a signal of the first power line VDD is a high-level signal continuously provided. The first scan signal line S1 is a scan signal line in a pixel drive circuit in a current display row, and the second scan signal line S2 is a scan signal line in a pixel drive circuit in a previous display row, that is, for the n-th display row, the first scan signal line S1 is S(n), and the second scan signal line S2 is S(n−1). The second scan signal line S2 in the pixel drive circuit in the current display row and the first scan signal line S1 in the pixel drive circuit in the previous display row are the same signal line, such that signal lines of a display panel can be reduced, so as to achieve a narrow bezel of the display panel.

Figure 4A:
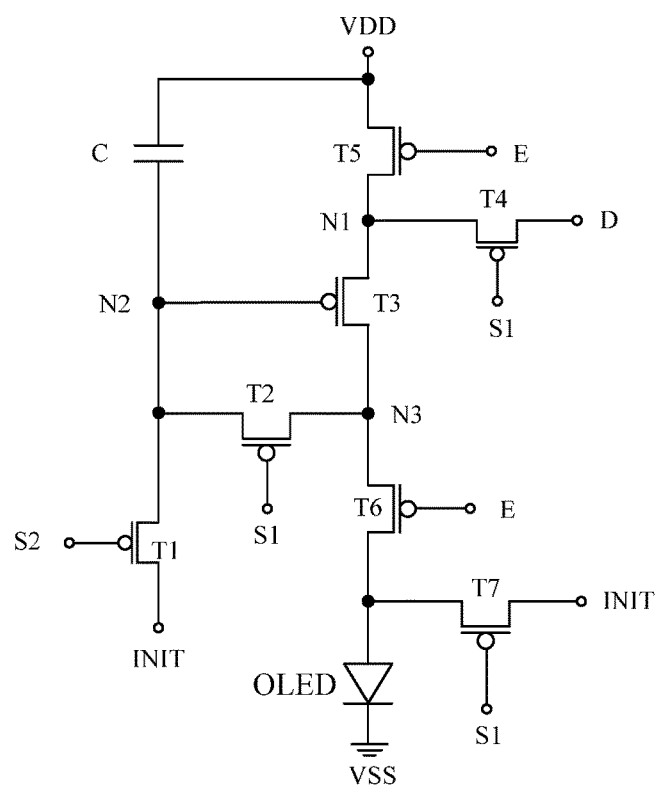
FIG. 4a is a schematic diagram of an equivalent circuit of a pixel drive circuit.
Figure 4B:
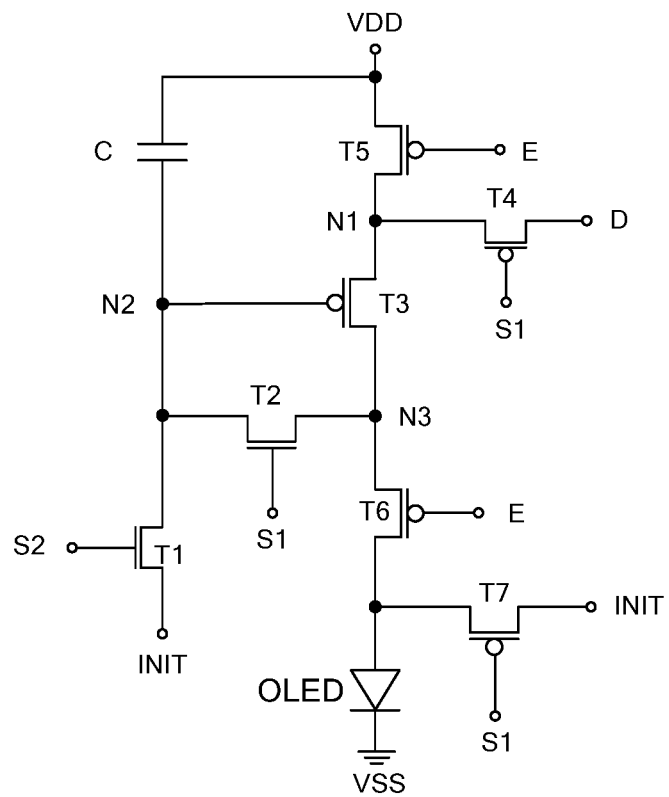
FIG. 4b is a schematic diagram of an equivalent circuit of a pixel drive circuit.

In an exemplary embodiment, as shown in FIG. 4, the first transistor T1 to seventh transistor T7 may be P-type transistors or may be N-type transistors. Use of a same type of transistors in a pixel drive circuit may simplify a process flow, reduce process difficulties of a display panel, and improve a product yield. In some possible implementations, as shown in FIG. 4b, the first to seventh transistors T1 to T7 may include P-type transistors and N-type transistors. For example, the first transistor T1 to the seventh transistor T7 shown in FIG. 4a are all P-type transistors; in FIG. 4b, the first transistor T1 and the second transistor T2 are N-type transistors, and the third transistors T3 to the seventh transistors T7 are P-type transistors.

In an exemplary embodiment, the first scan signal line S1, the second scan signal line S2, the light emitting signal line E, and the initial signal line INIT extend in a horizontal direction, and the second power line VSS, the first power line VDD, and the data signal line D extend in a vertical direction.

In an exemplary embodiment, the light emitting device may be an organic light emitting diode (OLED), including a first electrode (anode), an organic emitting layer, and a second electrode (cathode) that are stacked.

As shown in FIG. 4, the pixel drive circuit includes seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power line VDD, and a second power line VSS).

Figure 5:
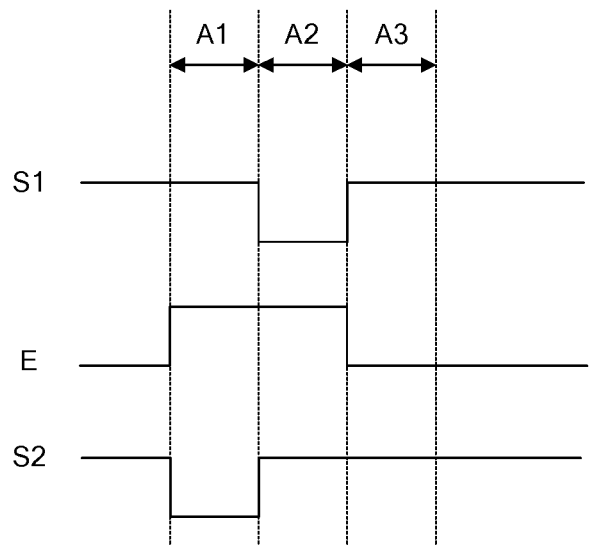
FIG. 5 is a working timing diagram of a pixel drive circuit.

FIG. 5 is a working timing diagram of a pixel drive circuit and the following illustrates an exemplary embodiment through the working process of the pixel drive circuit illustrated in FIG. 4a:

In an exemplary embodiment, the working process of the pixel drive circuit shown in FIG. 4a may include:

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signal, so that the first transistor T1 is turned-on, and a signal of the initial signal line INIT is provided to a second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned-off. An OLED does not emit light in this stage.

In a second stage A2, referred to as a data write-in stage or a threshold compensation stage, the signal of the first scan signal line S1 is a low-level signal, signals of the second scan signal line S2 and the light emitting signal line E are high-level signals, and the data signal line D outputs a data voltage. In this stage, because the first electrode plate of the storage capacitor C is at a low level, the third transistor T3 is turned-on. The signal of the first scan signal line S1 is the low-level signal, so that the second transistor T2, the fourth transistor T4, and the seventh transistor T7 are turned-on. The second transistor T2 and the fourth transistor T4 are turned-on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the first electrode plate (the second node N2) of the storage capacitor C is Vd−|Vth|, wherein Vd is the data voltage output by the data signal line D, and Vth is the threshold voltage of the third transistor T3. The seventh transistor T7 is turned-on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. The signal of the second scan signal line S2 is a high-level signal, so that the first transistor T1 is turned-off. The signal of the light emitting signal line E is a high-level signal, so that the fifth transistor T5 and the sixth transistor T6 are turned-off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is the low-level signal, so that the fifth transistor T5 and the sixth transistor T6 are turned-on, and a power voltage output by the first power line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows:

$$I = K*(Vgs - Vth)^2 = K*[(Vdd - Vd + |Vth|) - Vth]^2 = K*[(Vdd - Vd)]^2.$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power line VDD.

In an exemplary embodiment, in order to avoid leakage of electricity of the second node N2 in the light emitting stage, in the pixel drive circuit as shown in FIG. 4b, both the first transistor T1 and the second transistor T2 are N-type transistors, the third transistors T3 to the seventh transistors T7 are P-type transistors, the first transistor T1 and the second transistor T2 are IGZO (Indian Gallium Zinc Oxide) TFT (Thin Film Transistor), and a leakage current of IGZO TFT is far less than a leakage current of LTPS (Low Temperature Poly-Silicon) TFT, wherein the leakage current of IGZO TFT is in a 1E-16 level and the leakage current of LTPS TFT is in a 1E-12 level.

Although in the circuit structure shown in FIG. 4b, the first transistor T1 and the second transistor T2 connected with the second node N2 are N-type transistors to avoid light leakage of the second node N2 at the light emitting stage, the large layout size of the N-type transistor results in tight design space for high PPI display substrates, which is not conducive to the achievement of low power consumption and narrow bezel of the display product. In practical application, there are defects that the source and drain electrodes of the third transistor T3 cannot be reset, and there is display abnormality in the case of black-and-white switching.

Figure 6A:
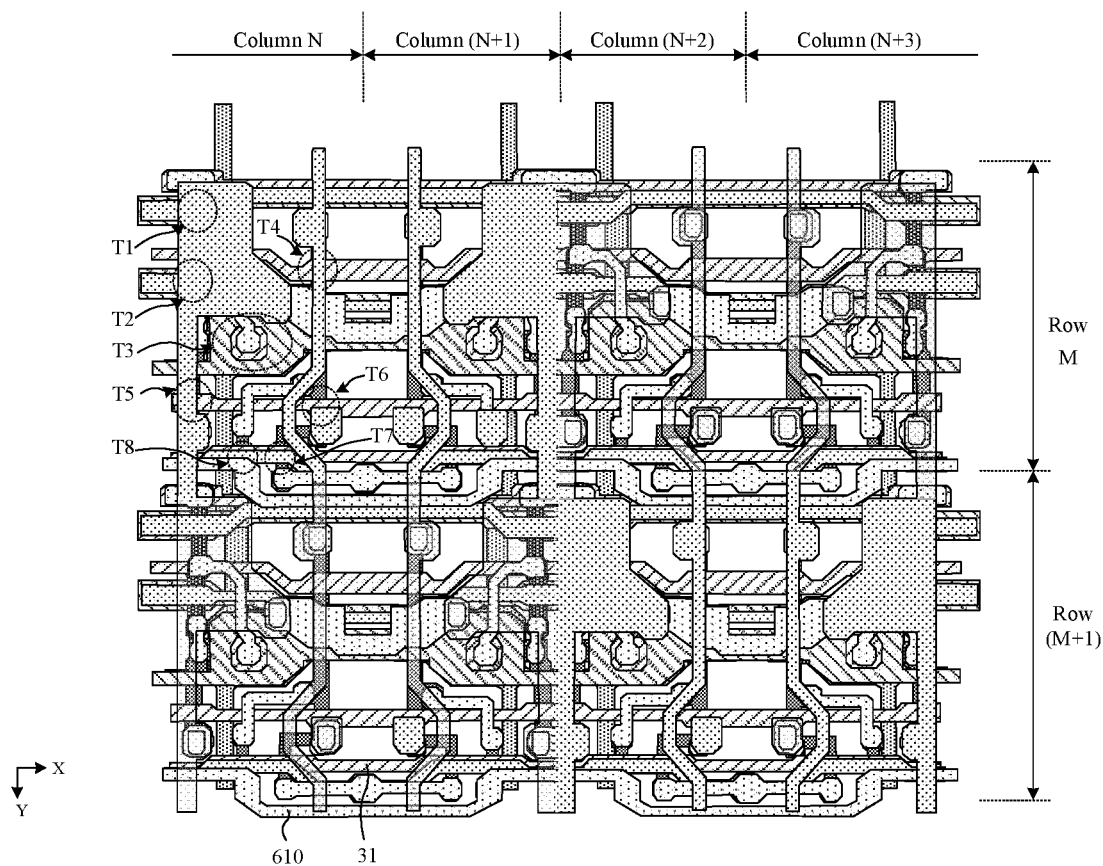
FIG. 6a is a schematic diagram of a planar structure of a display substrate according to an exemplary embodiment of the present disclosure.

An exemplary embodiment of the present disclosure provides a display substrate, as shown in FIG. 6a, which may include K pixel rows, wherein K is a positive integer greater than 1; at least one pixel row includes an initial signal line, a scan signal line, and a plurality of sub-pixels disposed sequentially along an extension direction of the initial signal line and the scan signal line;

the initial signal line may include a third initial signal line 610, the scan signal line may include a second scan signal line 31, at least one sub-pixel may include a pixel drive circuit, and the pixel drive circuit at least includes a third transistor T3 as a drive transistor and an eighth transistor T8 as an initialization transistor;

in at least one pixel row, the eighth transistor T8 is connected with the third initial signal line 610, the second scan signal line 31, and the second electrode of the drive transistor (a third transistor T3), and is configured to supply the initial signal of the third initial signal line 610 to the second electrode of the drive transistor (the third transistor T3) under a control of the second scan signal line 31.

The display substrate provided by an embodiment of the present disclosure includes a third initial signal line, a second scan signal line and a plurality of sub-pixels, at least one sub-pixel includes a pixel drive circuit, the pixel drive circuit includes a third transistor as a drive transistor and an eighth transistor as an initialization transistor, the eighth transistor is connected with the third initial signal line, the second scan signal line and a second electrode of the drive transistor, and is configured to supply the initial signal of the third initial signal line to the second electrode of the drive transistor under a control of the second scan signal line. A solution provided by an embodiment of the present disclosure, the eighth transistor as an initialization transistor supplies an initial signal of the third initial signal line to the second electrode of the drive transistor under the control of the second scan signal line, which can overcome the display abnormality in the case of black-and-white switching, improve a hysteresis deviation caused by a gray level difference between adjacent pixels, and reduce the hysteresis deviation.

Figure 6B:
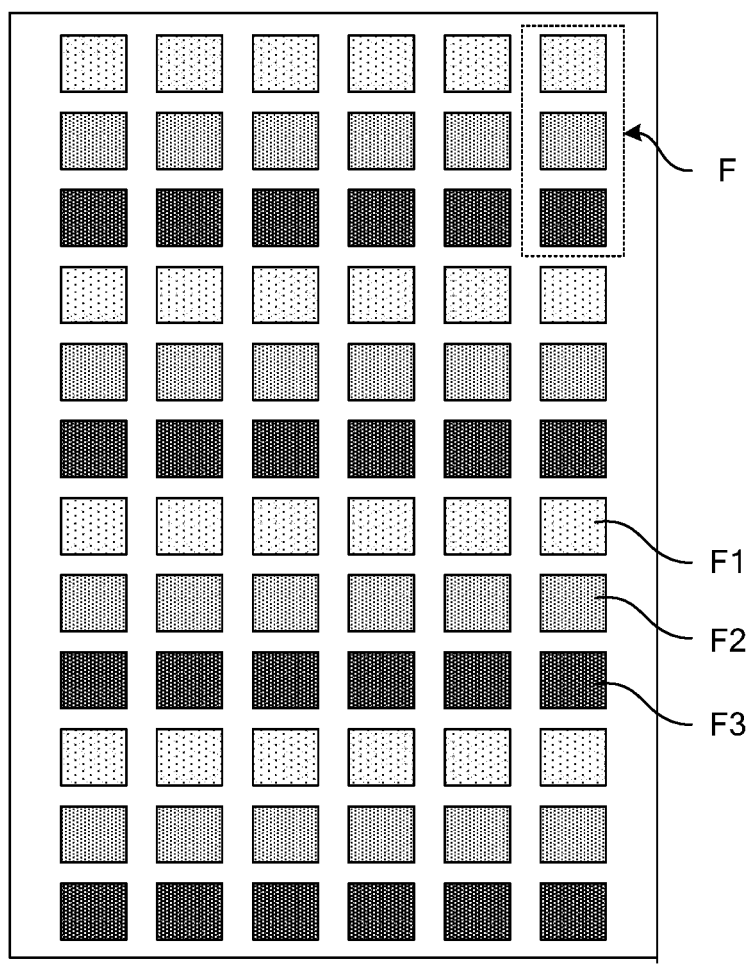
FIG. 6b is a schematic diagram of a planar structure of a display substrate provided by an exemplary embodiment of the present disclosure.

In an exemplary embodiment, initial signals provided by two adjacent rows of third initial signal lines may be different, sub-pixels located in a same row emit light of a same color, and sub-pixels of two adjacent rows emit light of different colors. In an exemplary embodiment, the display substrate may include K rows and L columns of sub-pixels, and sub-pixels of two adjacent rows in a same column may emit light of different colors, as shown in FIG. 6a, illustrating sub-pixels of columns N to N+3 and rows M to M+1, where N+3 is less than or equal to L and M+1 is less than or equal to K. As shown in FIG. 6b, a plurality of sub-pixels of K rows and L columns are divided into a plurality of pixel units F, at least one of pixel units includes a first sub-pixel F1 emitting a first color light, a second sub-pixel F2 emitting a second color light, and a third sub-pixel F3 emitting a third color light. The first sub-pixel F1, the second sub-pixel F2, and the third sub-pixel F3 each includes a pixel drive circuit and a light emitting element. The initial signals provided by the third initial signal lines 610 in the first sub-pixel F1, the second sub-pixel F2, and the third sub-pixel F3 are different, and the initial signals provided by the third initial signal line 610 can be determined according to a magnitude of the drive current required for the sub-pixel to emit light. As shown in FIG. 6b, a plurality of sub-pixels in a same row emit light of a same color and sub-pixels in two adjacent rows emit light of different colors.

Figure 7A:
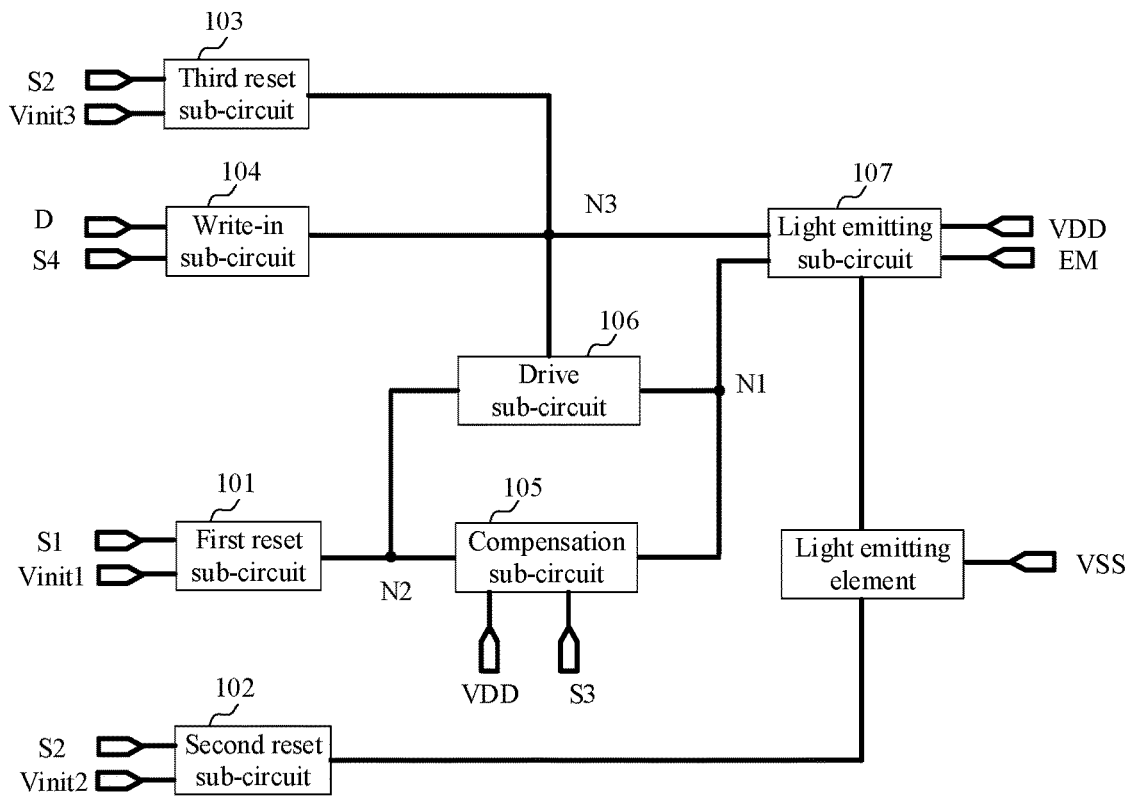
FIG. 7a is a schematic diagram of a structure of a pixel drive circuit provided by an exemplary embodiment of the present disclosure.
Figure 7B:
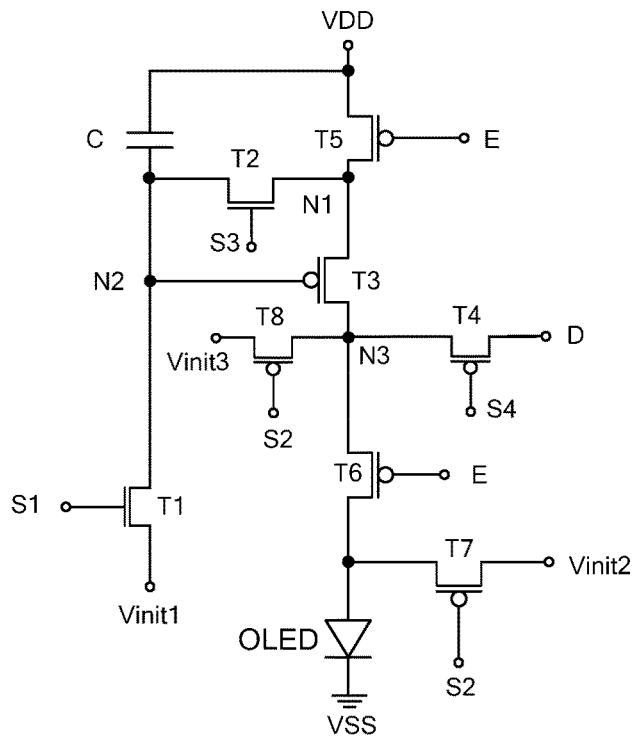
FIG. 7b is an equivalent circuit diagram of a shift register according to an embodiment of the present disclosure.

In an exemplary embodiment, as shown in FIG. 7a and FIG. 7b, the display substrate may further include a plurality of light emitting elements corresponding to a plurality of pixel drive circuits, a first scan signal line S1, a third scan signal line S3, a fourth scan signal line S4, a first initial signal line vinit1, a second initial signal line vinit2, a first power line VDD, a light emitting control line E, and a data signal line D;

the pixel drive circuit is configured to drive the light emitting element to emit light. The pixel drive circuit includes a first reset sub-circuit 101, a second reset sub-circuit 102, a third reset sub-circuit 103, a write-in sub-circuit 104, a compensation sub-circuit 105, a drive sub-circuit 106, and a light emitting sub-circuit 107;

the first reset sub-circuit 101 is connected with the first initial signal line vinit1, the second node N2, and the first scan signal line S1, respectively, and configured to write an initial signal of the first initial signal line vinit1 to the second node N2 under a control of the first scan signal line S1;

the second reset sub-circuit 102 is connected with the second initial signal line vinit2, the second scan signal line S2, and the first electrode of the light emitting element, respectively, and configured to write an initial signal of the second initial signal line vinit2 to the first electrode of the light emitting element under a control of the second scan signal line S2;

the third reset sub-circuit 103 is connected with the third initial signal line vinit3, the third node N3, and the second scan signal line S2, respectively, and configured to write an initial signal of the third initial signal line vinit3 to the third node N3 under a control of the second scan signal line S2;

the write-in sub-circuit 104 is connected with the fourth scan signal line S4, the data signal line D and the third node N3, respectively, and configured to write a data signal of the data signal line D to the third node N3 under a control of the fourth scan signal line S4;

the compensation sub-circuit 105 is connected with the first power line VDD, the third scan signal line S3, the first node N1 and the second node N2, respectively, and configured to supply the signal of the first node N1 to the second node N2 under the control of the third scan signal line S3 until the signal of the second node N2 satisfies a threshold condition;

the drive sub-circuit is connected with a first node N1, a second node N2, and a third node N3 respectively, and is configured to provide a drive current for the third node N3 under a control of signals of the first node N1 and the second node N2.

The light emitting sub-circuit 107 is connected with the first power line VDD, the first node N1, the third node N3, the light emitting control line E and the first electrode of the light emitting element, respectively, and is configured to write the signal of the first power line VDD to the first node N1 and write the signal of the third node N3 to the first electrode of the light emitting element under a control of the light emitting control line E.

In an exemplary embodiment, as shown in FIG. 7b, in an equivalent circuit diagram of a pixel drive circuit, the first reset sub-circuit 101 includes a first transistor T1, the second reset sub-circuit 102 includes a seventh transistor T7, and the third reset sub-circuit 103 includes an eighth transistor T8;

a control electrode of the first transistor T1 is connected with the first scan signal line S1, a first electrode of the first transistor T1 is connected with a first initial signal line vinit1, and a second electrode of the first transistor T1 is connected with the second node N2;

a control electrode of the eighth transistor T8 is connected with the second scan signal line S2, a first electrode of the eighth transistor T8 is connected with a third initial signal line vinit3, and a second electrode of the eighth transistor T8 is connected with the fourth node N3;

the control electrode of the seventh transistor T7 is connected with the second scan signal line S2, a first electrode of the seventh transistor T7 is connected with a second initial signal line vinit2, and a second electrode of the seventh transistor T7 is connected with the first electrode of a light emitting element OLED.

In an exemplary embodiment, as shown in FIG. 7b, a write-in sub-circuit 104 includes a fourth transistor T4;

A control electrode of the fourth transistor T4 is connected with the fourth scan signal line S4, a first electrode of the fourth transistor T4 is connected with the data signal line D, and a second electrode of the fourth transistor T4 is connected with the third node N3.

In an exemplary embodiment, as shown in FIG. 7b, the compensation sub-circuit 105 includes a second transistor T2 and a storage capacitor C;
- a control electrode of the second transistor T2 is connected with the third scan signal line S3, the first electrode of the second transistor T2 is connected with the second node N2, and the second electrode of the second transistor T2 is connected with the first node N1;
- the first electrode plate of the storage capacitor C is connected with the second node N2, and the second electrode plate of the storage capacitor is connected with the first power line VDD.

In an exemplary embodiment, as shown in FIG. 7b, a drive sub-circuit includes a third transistor T3.

A control electrode of the third transistor T3 is connected with the second node N2, a first electrode of the third transistor T3 is connected with a first node N1, and a second electrode of the third transistor T3 is connected with the third node N3.

In an exemplary embodiment, as shown in FIG. 7b, the light emitting sub-circuit 107 includes a fifth transistor T5 and a sixth transistor T6;
- a control electrode of the fifth transistor T5 is connected with the light emitting control line E, a first electrode of the fifth transistor T5 is connected with the first power line VDD, and a second electrode of the fifth transistor T5 is connected with the first node N1;
- a control electrode of the sixth transistor T6 is connected with the light emitting control line E, a first electrode of the sixth transistor T6 is connected with the third node N3, and a second electrode of the sixth transistor T6 is connected with a first electrode of a light emitting device OLED.

In an exemplary embodiment, as shown in FIG. 7b, the first reset sub-circuit 101 includes a first transistor T1, the second reset sub-circuit 102 includes a seventh transistor T7, the third reset sub-circuit 103 includes an eighth transistor T8, the write-in sub-circuit 104 includes a fourth transistor T4, the compensation sub-circuit 105 includes a second transistor T2 and a storage capacitor C, the drive sub-circuit 106 includes a third transistor T3, and the light emitting sub-circuit 107 includes a fifth transistor T5 and a sixth transistor T6;
- a control electrode of the first transistor T1 is connected with the first scan signal line S1, a first electrode of the first transistor T1 is connected with the first initial signal line vinit1, and the second electrode of the first transistor T1 is connected with the second node N2;
- a control electrode of the second transistor T2 is connected with the third scan signal line S3, the first electrode of the second transistor T2 is connected with the second node N2, and the second electrode of the second transistor T2 is connected with the first node N1;
- a control electrode of the third transistor T3 is connected with the second node N2, a first electrode of the third transistor T3 is connected with a first node N1, and a second electrode of the third transistor T3 is connected with the third node N3;
- a control electrode of the fourth transistor T4 is connected with the fourth scan signal line S4, a first electrode of the fourth transistor T4 is connected with the data signal line D, and a second electrode of the fourth transistor T4 is connected with the third node N3;
- a control electrode of the fifth transistor T5 is connected with the light emitting control line E, a first electrode of the fifth transistor T5 is connected with the first power line VDD, and a second electrode of the fifth transistor T5 is connected with the first node N1;
- a control electrode of the sixth transistor T6 is connected with the light emitting control line E, a first electrode of the sixth transistor T6 is connected with the third node N3, and a second electrode of the sixth transistor T6 is connected with a first electrode of a light emitting element OLED;
- a control electrode of the seventh transistor T7 is connected with the second scan signal line S2, a first electrode of the seventh transistor T7 is connected with the second initial signal line vinit2, and a second electrode of the seventh transistor T7 is connected with the first electrode of the light emitting element OLED;
- a control electrode of the eighth transistor T8 is connected with the second scan signal line S2, a first electrode of the eighth transistor T8 is connected with a third initial signal line vinit3, and a second electrode of the eighth transistor T8 is connected with the third node N3;
- the first electrode plate of the storage capacitor C is connected with the second node N2, and the second electrode plate of the storage capacitor is connected with the first power line VDD.

In an exemplary embodiment, the first transistor T1 and the second transistor T2 are oxide transistors, and the third transistor T3 to the eighth transistor T8 are low-temperature poly-crystalline silicon transistors.

In an exemplary embodiment, in a plane perpendicular to the display substrate, the display substrate includes a base substrate and a first semiconductor layer, a first conductive layer, a second conductive layer, a second semiconductor layer, a third conductive layer, a fourth conductive layer and a fifth conductive layer that are sequentially stacked on the base substrate;
- the first semiconductor layer includes active layers of a plurality of low-temperature poly-crystalline silicon transistors; the first conductive layer includes control electrodes of a plurality of poly-crystalline silicon transistors and a first electrode plate of a storage capacitor; the second conductive layer includes a second electrode plate of the storage capacitor; the second semiconductor layer includes active layers of a plurality of oxide transistors; the third conductive layer includes control electrodes of a plurality of oxide transistors; the fourth conductive layer includes first electrodes and second electrodes of a plurality of poly-crystalline silicon transistors, first electrodes and second electrodes of a plurality of oxide transistors, and a third initial signal line; the fifth conductive layer includes a data signal line and a first power line.

In an exemplary embodiment, in a plane perpendicular to the display substrate, the display substrate includes a base substrate and a shielding layer, a first insulation layer, a first semiconductor layer, a second insulation layer, a first conductive layer, a third insulation layer, a second conductive layer, a fourth insulation layer, a second semiconductor layer, a fifth insulation layer, a third conductive layer, a sixth insulation layer, a fourth conductive layer, a seventh insulation layer, a first planarization layer and a fifth conductive layer that are sequentially stacked on the base substrate;

the first semiconductor layer includes active layers of a third transistor to an eighth transistor; the first conductive layer includes control electrodes of the third transistor to the eighth transistor, a first electrode plate of the storage capacitor, and a first initial signal line; the second conductive layer includes a second electrode plate of the storage capacitor; the second semiconductor layer includes active layers of the first transistor and the second transistor; the third conductive layer includes a first scan signal line, a third scan signal line, and a second initial signal line; the fourth conductive layer includes first electrodes and second electrodes of the first transistor to the eighth transistor, a connection electrode of the second electrode plate, and a third initial signal line; the fifth conductive layer includes a data signal line, a first power line and an anode connection electrode of the light emitting element.

Figure 9:
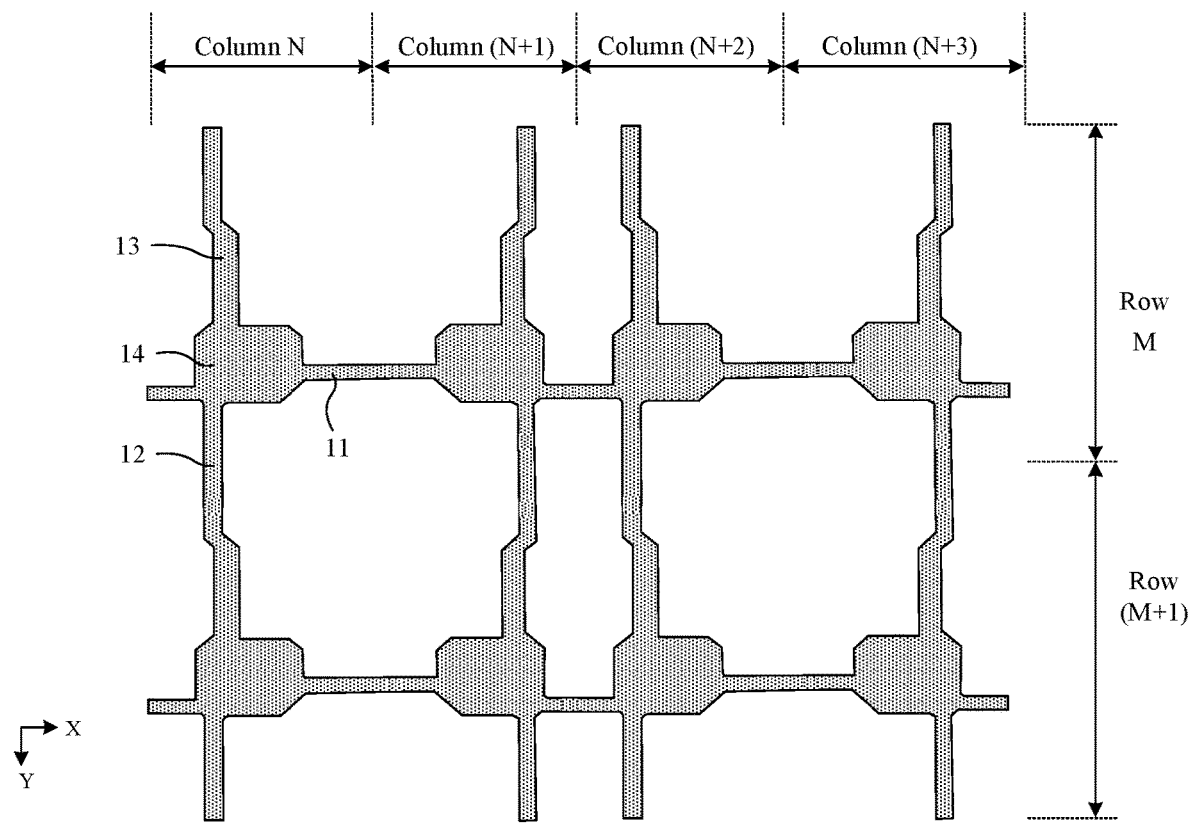
FIG. 9 is a schematic diagram after a shielding layer pattern is formed provided by an exemplary embodiment of the present disclosure.

In an exemplary embodiment, as shown in FIG. 9, the shielding layer includes a first shielding structure 11, a second shielding structure 12, a third shielding structure 13 and a shielding block 14;

in a plane where the display substrate is located, the first shielding structure 11 has a strip shape extending along the first direction X, the first shielding structure 11 is disposed on a side of the shielding block 14 in the first direction X, and is connected with the shielding block 14; the second shielding structure 12 is in a strip shape extending along the second direction Y, the second shielding structure 12 is disposed on a side of the shielding block 14 in the second direction Y, and is connected with the shielding block 14; the third shielding structure 13 is in a shape of a bend line extending along the second direction Y, is disposed on a side opposite to the second direction Y of the shielding block 14, and is connected with the shielding block 14;

an orthographic projection of the channel region of an active layer of the third transistor T3 on the base substrate is within the range of an orthographic projection of the shielding block 14 on the base substrate.

In an exemplary embodiment, the first shielding structure 11 of each pixel drive circuit is connected with a shielding block 14 of an adjacent pixel drive circuit in the first direction X; the second shielding structure 12 of each pixel drive circuit is connected with the third shielding structure 13 of the adjacent pixel drive circuit in the second direction Y.

Figure 10A:
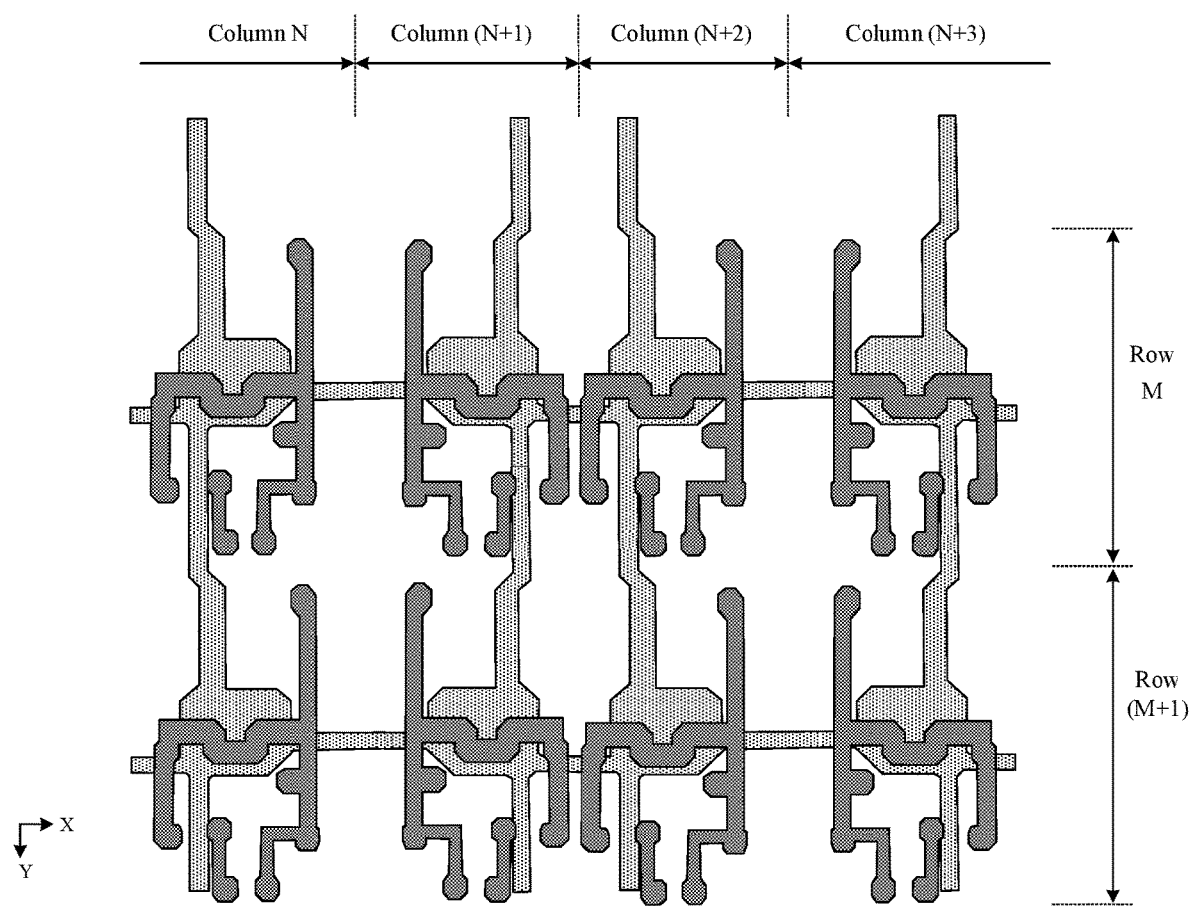
FIG. 10a to FIG. 10b are schematic diagrams after a first semiconductor layer pattern is formed according to an exemplary embodiment of the present disclosure.
Figure 10B:
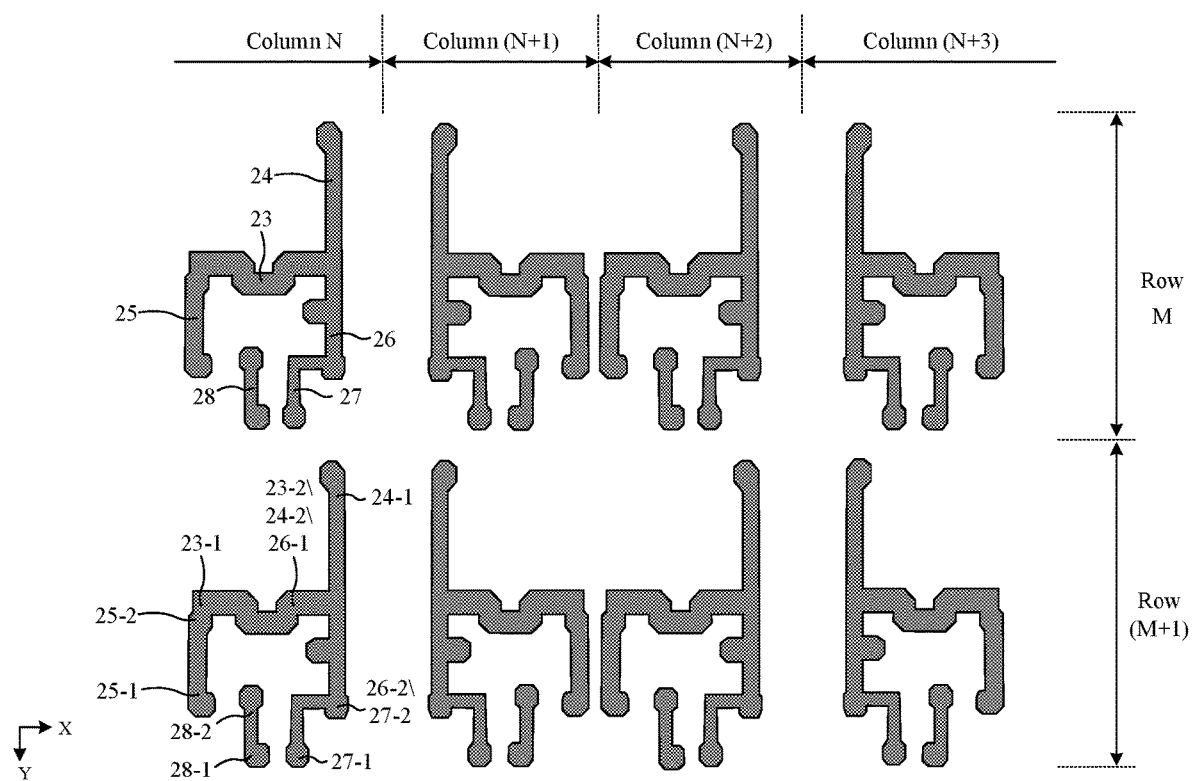

In an exemplary embodiment, as shown in FIG. 10a and FIG. 10b, the active layer 23 of the third transistor T3 to the active layer 27 of the seventh transistor T7 are connected with each other to form an integrated structure;

a shape of the active layer 23 of the third transistor T3 is an inverted "Ω" shape, and a shape of the active layer 24 of the fourth transistor T4 to the active layer 28 of the eighth transistor T8 is an "I" shape;

in a plane where the first semiconductor layer is located, in the first direction X, an active layer 24 of the fourth transistor T4 and an active layer 26 of the sixth transistor T6 are located on a same side of an active layer 23 of the third transistor T3, an active layer 25 of the fifth transistor T5 is located on the other side of an active layer 23 of the third transistor T3, and an active layer 28 of the eighth transistor T8 is located between an active layer 25 of the fifth transistor T5 and an active layer 27 of the seventh transistor T7; in the second direction Y, an active layer 24 of the fourth transistor T4 and an active layer 26 of the sixth transistor T6 are located on both sides of an active layer 23 of the third transistor T3, an active layer 25 of the fifth transistor T5, an active layer 26 of the sixth transistor T6, an active layer 27 of the seventh transistor T7 and an active layer 28 of the eighth transistor T8 are located on a same side of an active layer 23 of the third transistor T3, and an active layer 27 of the seventh transistor T7 is located on a side of an active layer 26 of the sixth transistor T6 away from an active layer 24 of the fourth transistor T4.

Figure 11A:
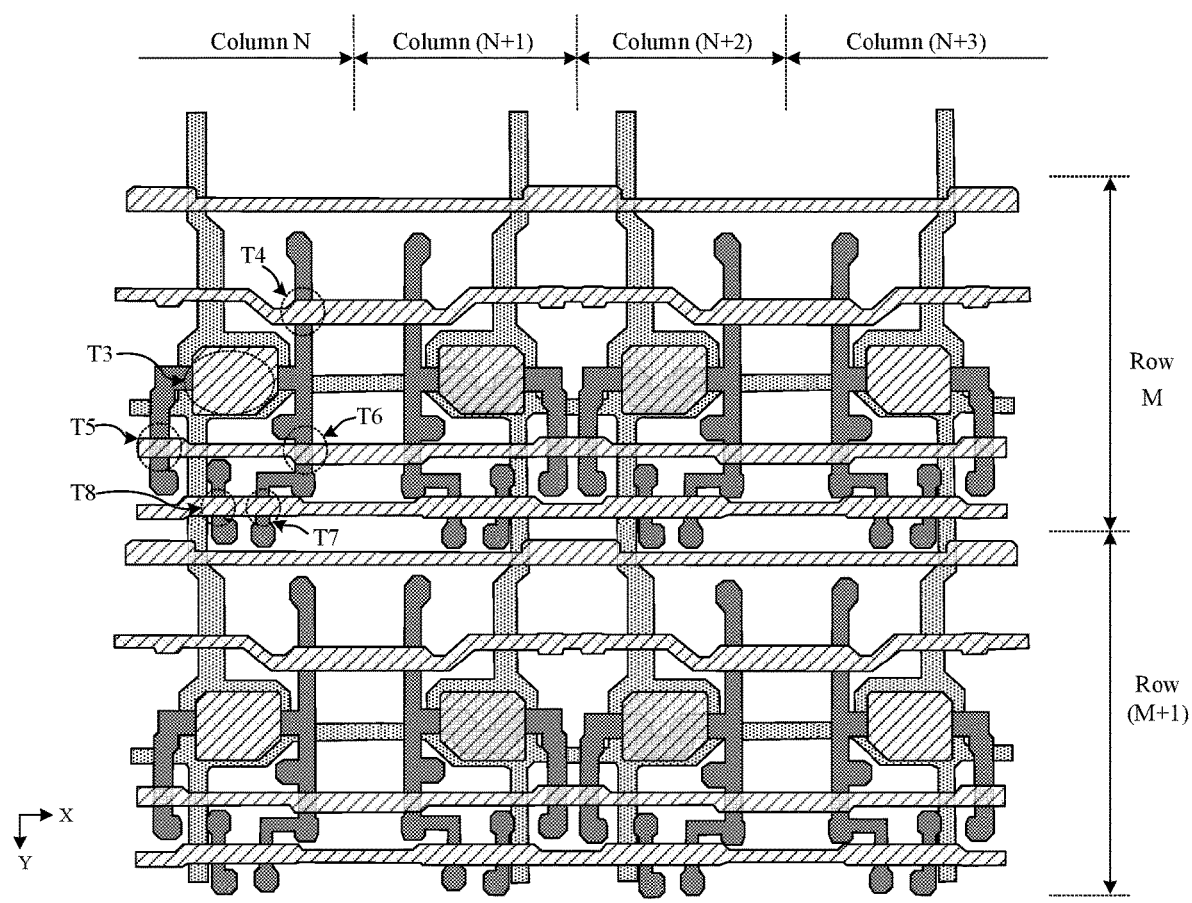
FIG. 11a to FIG. 11b are schematic diagrams after a first conductive layer pattern is formed according to an exemplary embodiment of the present disclosure.
Figure 11B:
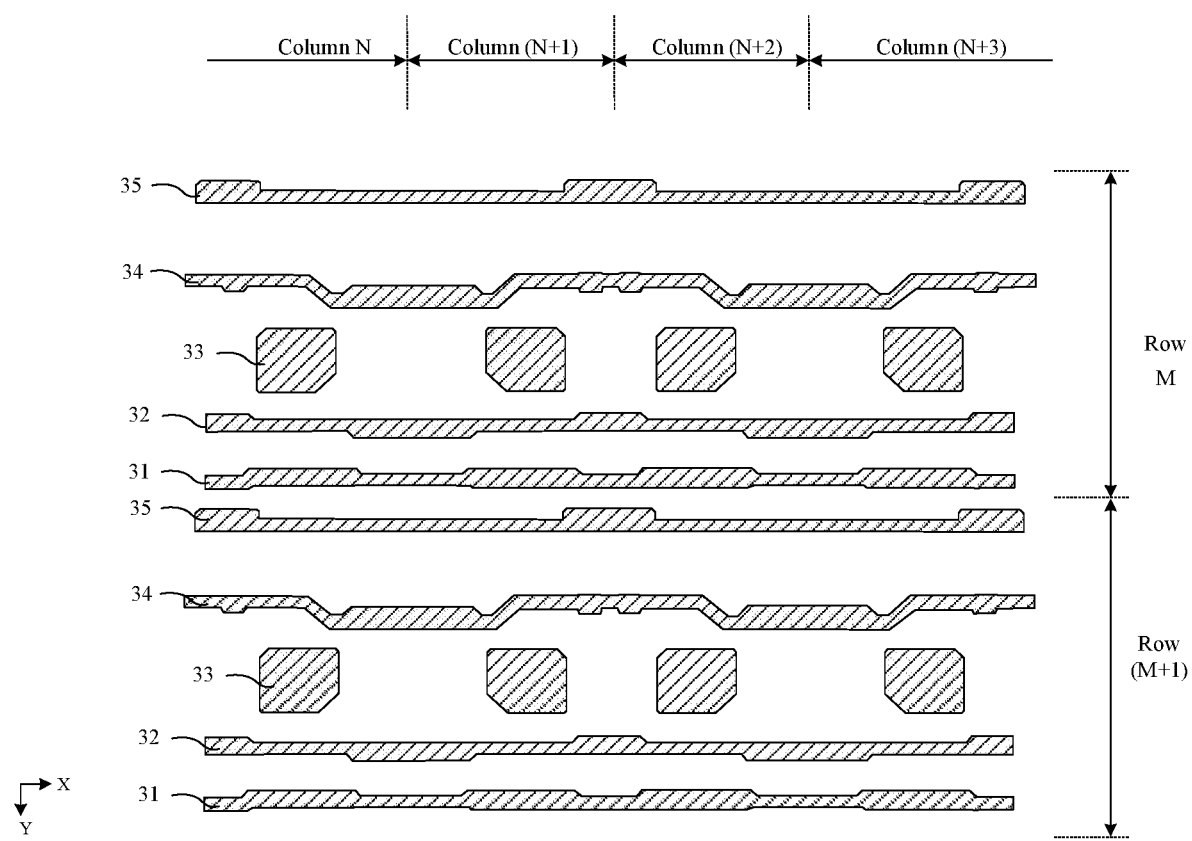

In an exemplary embodiment, as shown in FIG. 11a and FIG. 11b, in a plane where the first conductive layer is located, the main body parts of the second scan signal line 31, the light emitting control line 32 (i.e., the aforementioned light emitting control line E), a fourth scan signal line 34 (i.e., the aforementioned fourth scan signal line S4) and a first initial signal line 35 (i.e., the aforementioned first initial signal line vinit1) extend along the first direction X, in a same pixel drive circuit, a second scan signal line 31, a light emitting control line 32, a first electrode plate 33 of the storage capacitor, a fourth scan signal line 34, and a first initial signal line 35 are sequentially arranged along the second direction Y;

the first electrode plate 33 is in a shape of rectangular, and corners of the rectangular shape are provided to be chamfered, an orthographic projection of the first electrode plate 33 on the base substrate is overlapped with an orthographic projection of a third active layer of the third transistor T3 on the base substrate, and the first electrode plate 33 is multiplexed as the control electrode of the third transistor T3;

an overlapping area between the fourth scan signal line 34 and the active layer of the fourth transistor T4 serves as the control electrode of the fourth transistor T4, an overlapping area between the light emitting control line 32 and the active layer of the fifth transistor T5 serves as the control electrode of the fifth transistor T5, an overlapping area between the light emitting control line 32 and the active layer of the sixth transistor T6 serves as the control electrode of the sixth transistor T6, an overlapping area between the second scan signal line 31 and the active layer of the seventh transistor T7 serves as the control electrode of the seventh transistor T7, and an overlapping area between the second scan signal line 31 and the active layer of the eighth transistor T8 serves as the control electrode of the eighth transistor T8.

Figure 12A:
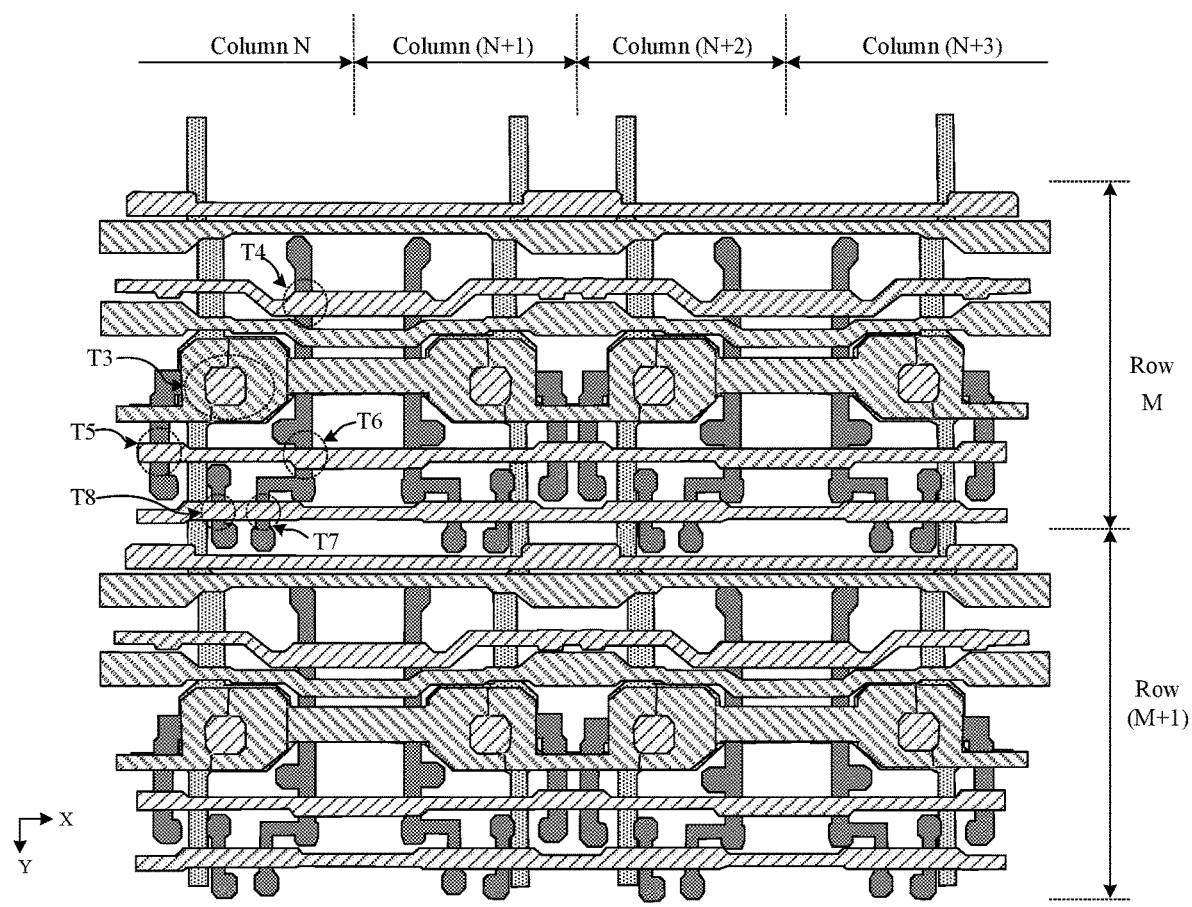
FIG. 12a to FIG. 12b are schematic diagrams after a second conductive layer pattern is formed according to an exemplary embodiment of the present disclosure.
Figure 12B:
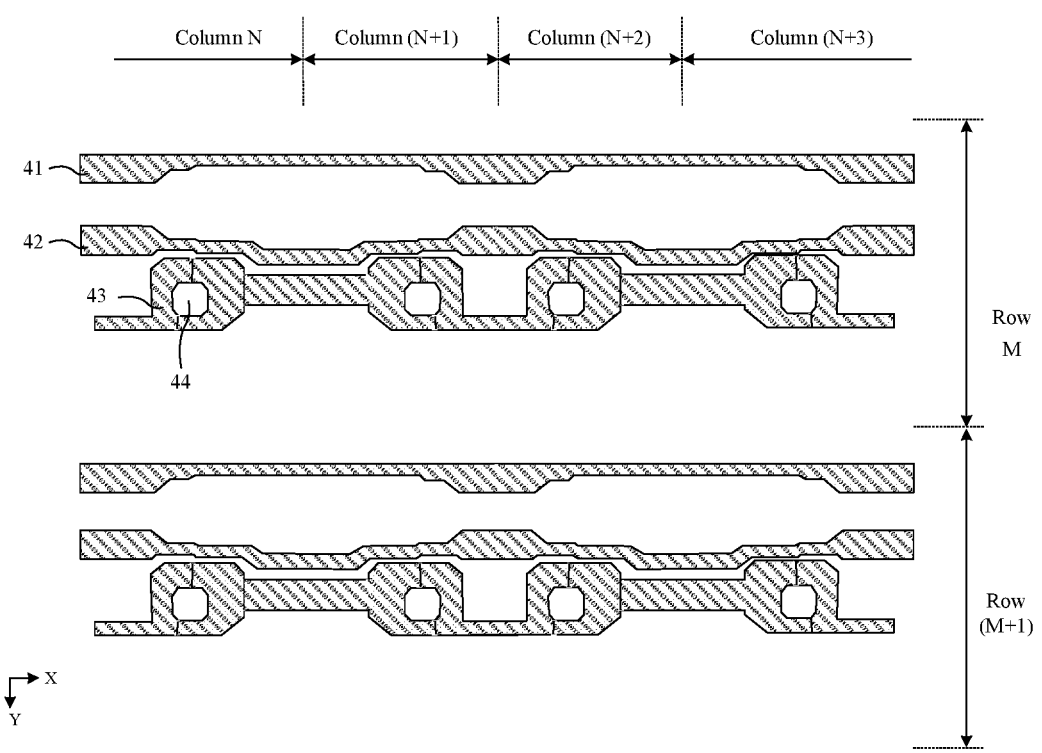

In an exemplary embodiment, as shown in FIG. 12a and FIG. 12b, the second conductive layer further includes a first shielding line 41 and a second shielding line 42;

in a plane where the second conductive layer is located, the main body parts of the first shielding line 41 and the second shielding line 42 extend along the first direction X; in the second direction Y, the second shielding line 42 is located between the first shielding line 41 and the second electrode plate 43;

The first shielding line 41 is disposed as a shielding layer of the first transistor T1 and shields a channel of the first transistor T1; the second shielding line 42 is disposed as a shielding layer of the second transistor T2 and shields a channel of the second transistor T2;

the second electrode plate 43 is in a shape of rectangular, and corners of the rectangular shape are provided to be chamfered, an orthographic projection of the second electrode plate 43 on the base substrate is overlapped with an orthographic projection of the first electrode plate 33 on the base substrate.

Figure 13A:
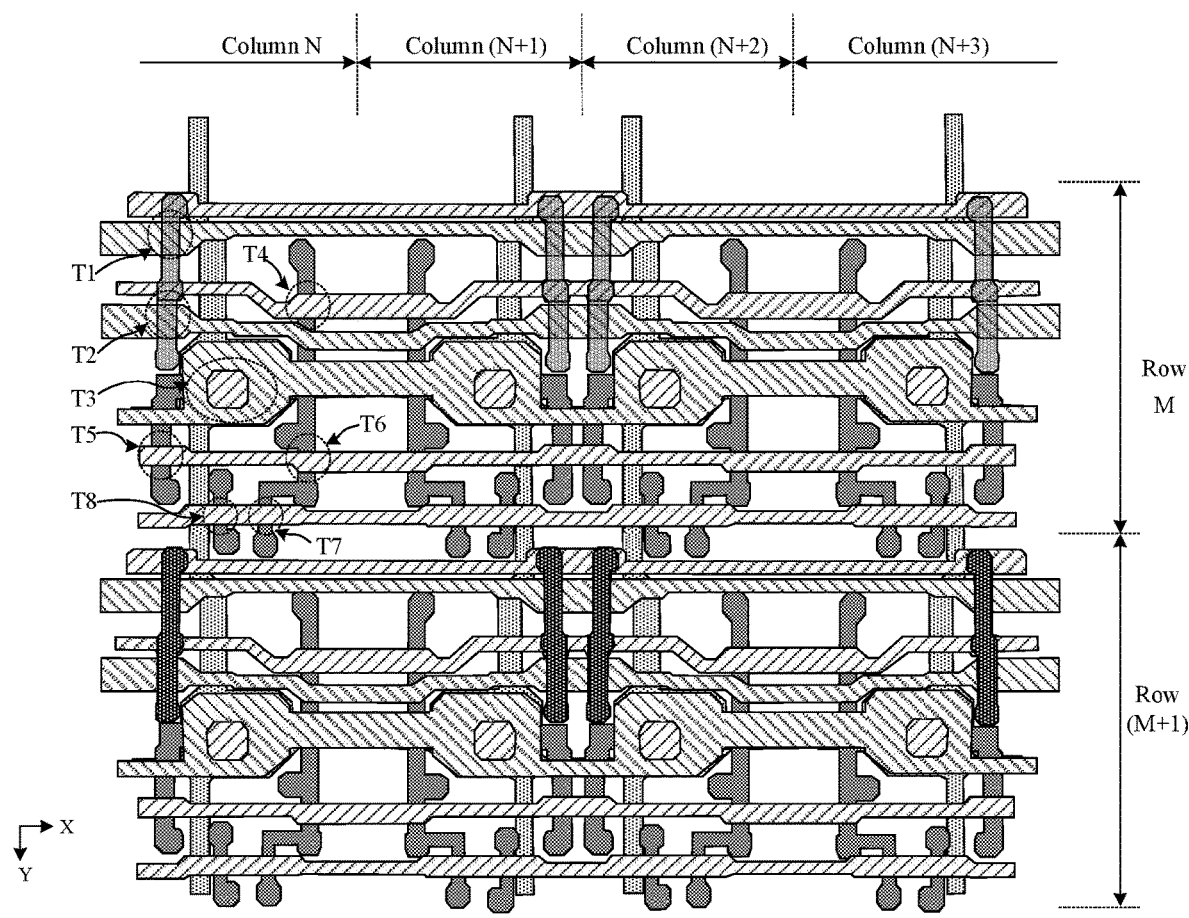
FIG. 13a to FIG. 13b are schematic diagrams after a second semiconductor layer pattern is formed according to an exemplary embodiment of the present disclosure.
Figure 13B:
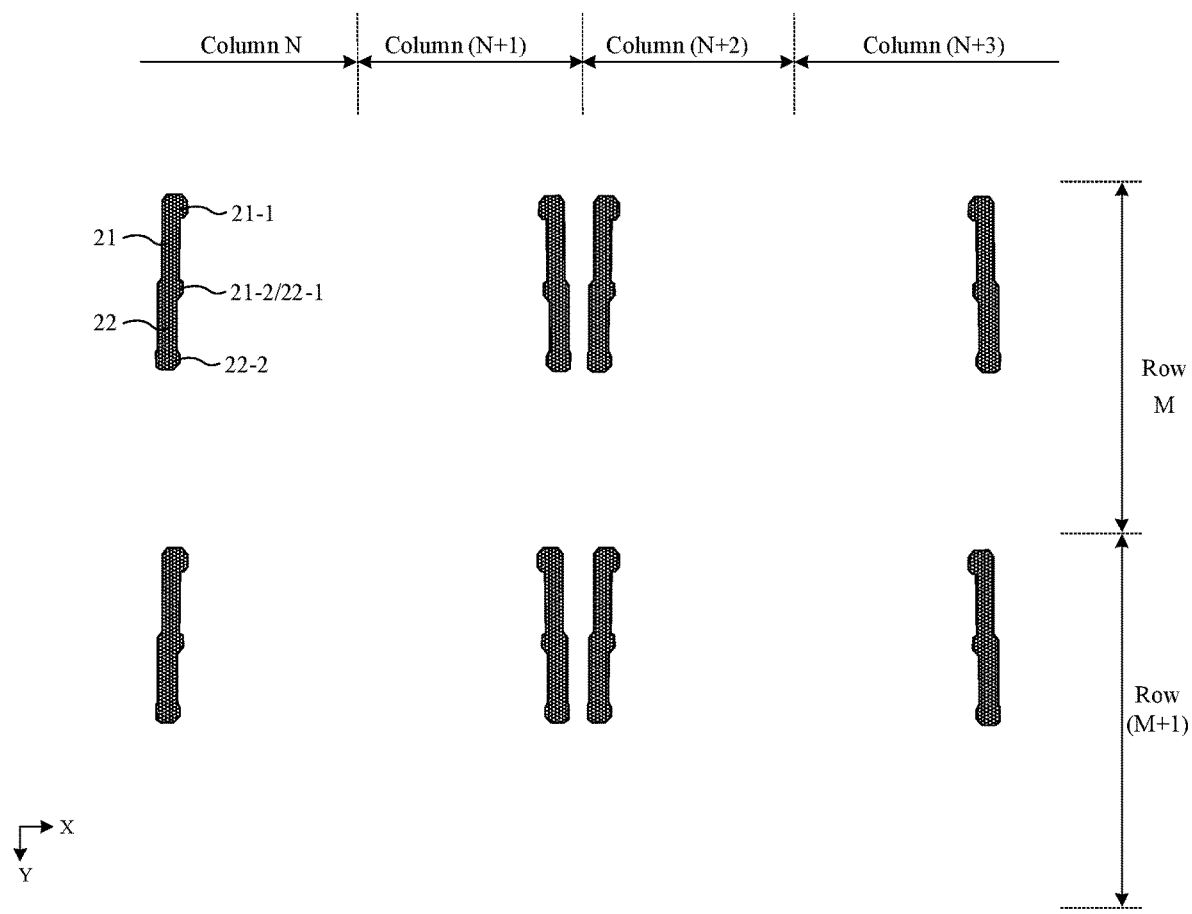

In an exemplary embodiment, as shown in FIG. 13a and FIG. 13b, the active layer 21 of the first transistor T1 and the active layer 22 of the second transistor T2 are connected with each other to form an integrated structure;

a shape of the active layer 21 of the first transistor T1 and the active layer 22 of the second transistor T2 is an "I" shape, the first transistor T1 and the second transistor T2 each includes a first region and a second region, and the second region of the active layer 21 of the first transistor T1 serves as the first region of the active layer 22 of the second transistor T2;

in a plane where the display substrate is located, in the first direction X, the active layers 22 of the first transistor T1 and the second transistor T2 are located on a side of the active layer of the third transistor T3 away from the active layer of the fourth transistor T4; in the second direction Y, the active layers 22 of the first transistor T1 and the second transistor T2 are located on a side of the active layer of the third transistor T3 away from the active layer of the fifth transistor T5, and the active layer 21 of the first transistor T1 is located on a side of the active layer 22 of the second transistor T2 away from the active layer of the third transistor T3.

Figure 14A:
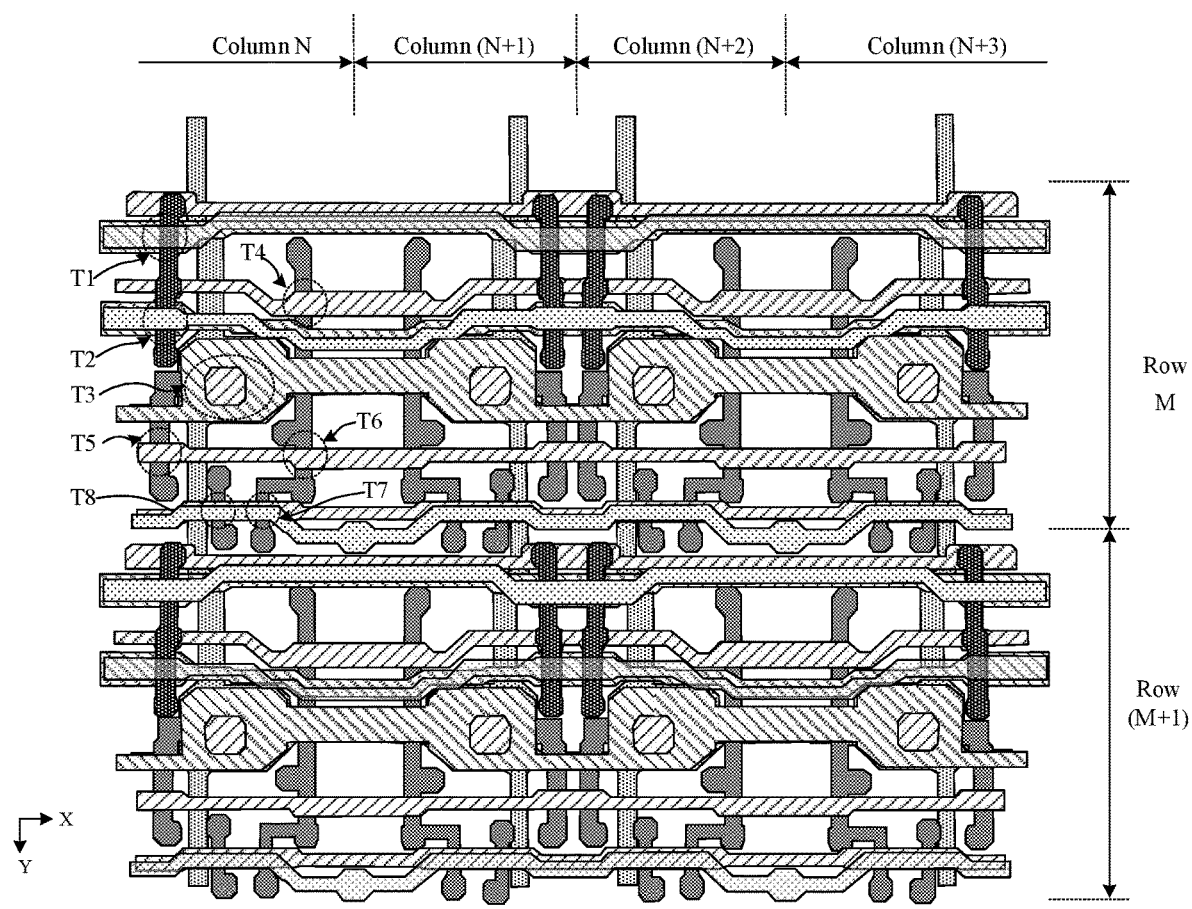
FIG. 14a to FIG. 14b are schematic diagrams after a third conductive layer pattern is formed according to an exemplary embodiment of the present disclosure.
Figure 14B:
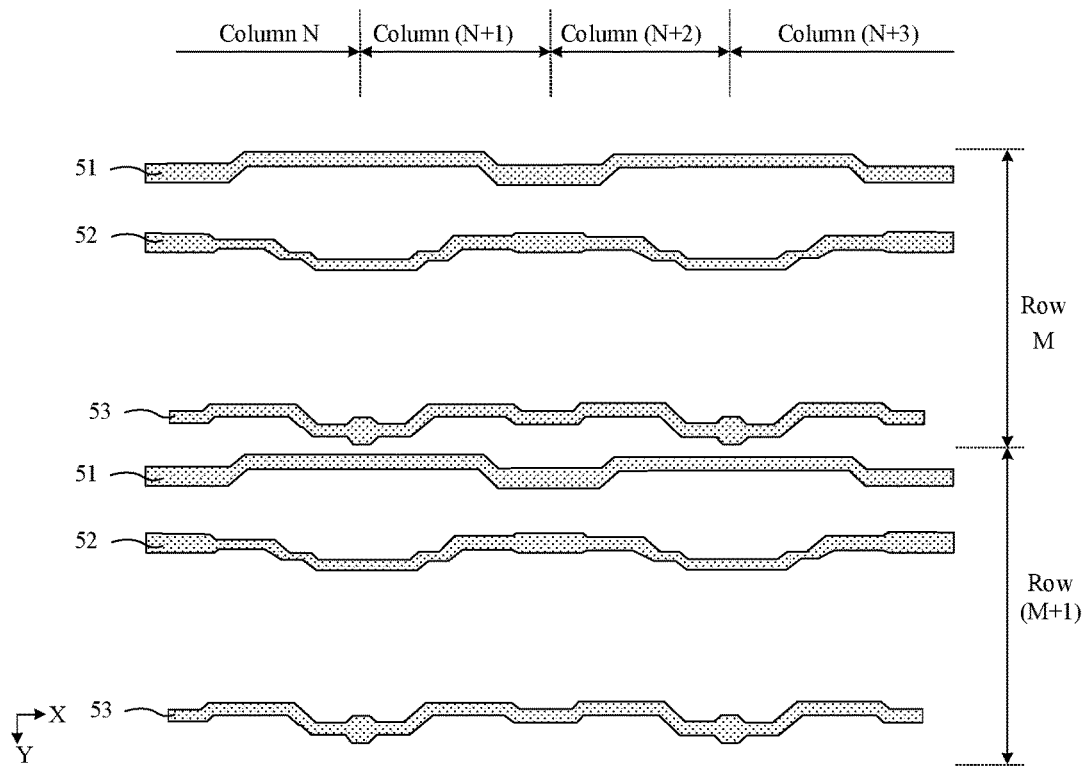

In an exemplary embodiment, as shown in FIG. 14a and FIG. 14b, in a plane where the third conductive layer is located, the main body parts of the first scan signal line 51, the third scan signal line 52, and the second initial signal line 53 (i.e., the aforementioned second initial signal line vinit2) extend along the first direction X, in the second direction Y, a third scan signal line 52 is located between the first scan signal line 51 and the second initial signal line 53;

an overlapping area between the first scan signal line 51 and the active layer of the first transistor T1 serves as the control electrode of the first transistor T1 and an overlapping area between the third scan signal line 52 and the active layer of the second transistor T2 serves as the control electrode of the second transistor T2.

Figure 16A:
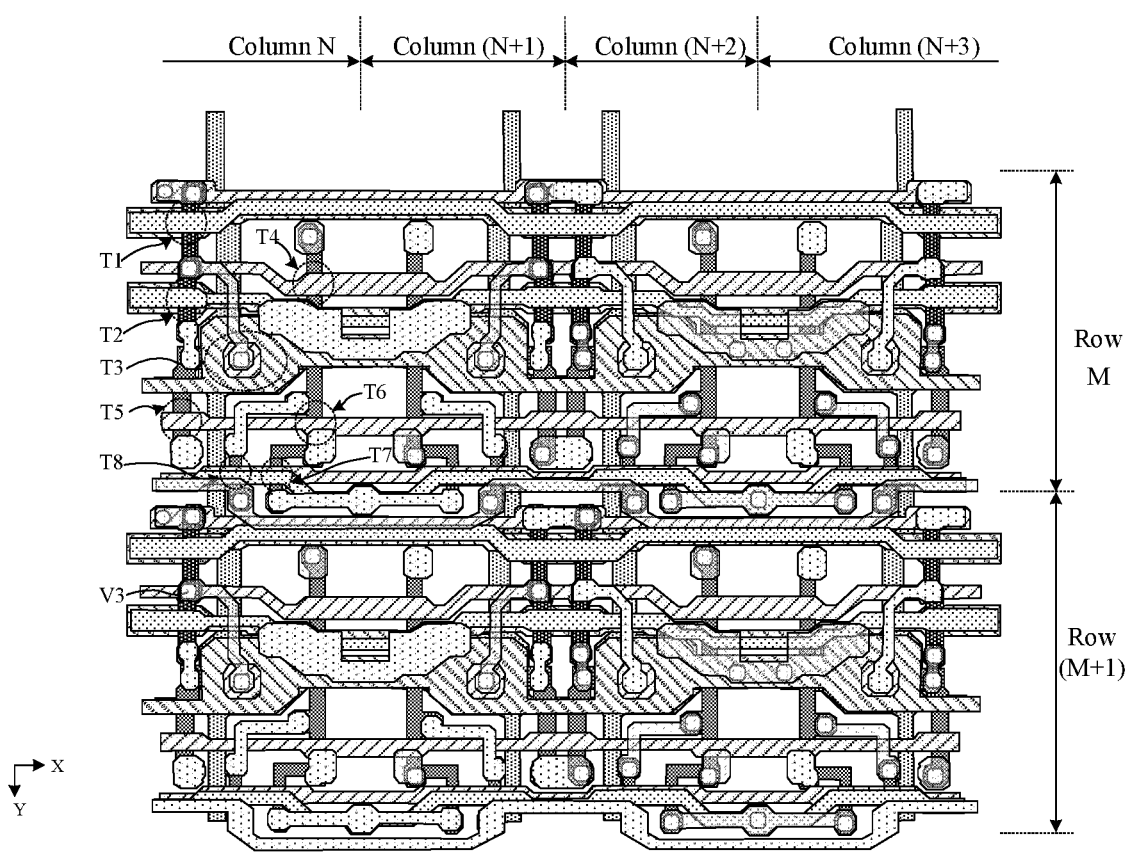
FIG. 16a to FIG. 16b are schematic diagrams after a fourth conductive layer pattern is formed according to an exemplary embodiment of the present disclosure.
Figure 16B:
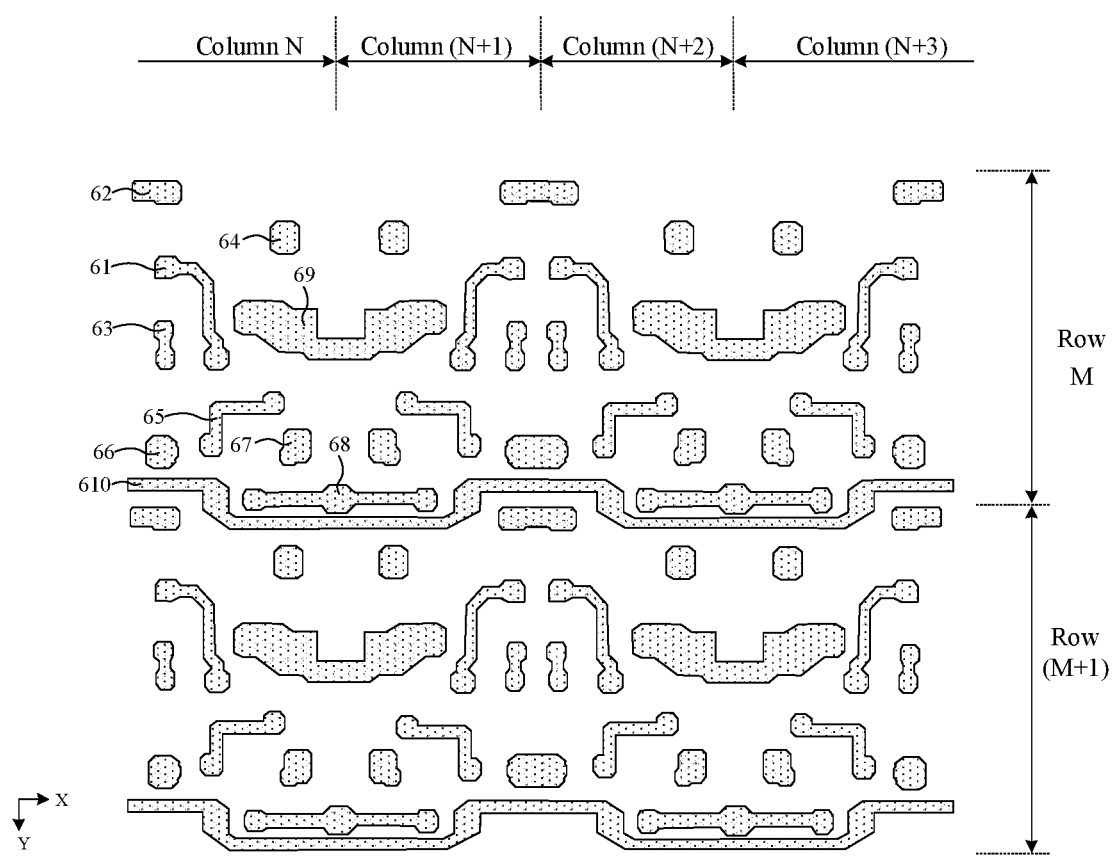

In an exemplary embodiment, as shown in FIG. 16a and FIG. 16b, the second electrode of the first transistor T1 and the first electrode of the second transistor T2 are of an integrated structure and the second electrode of the first transistor T1 is connected with the first electrode plate 33 through a via; the first electrode of the first transistor T1 is connected with the first initial signal line 35 through a via; the second electrode of the second transistor T2, the first electrode of the third transistor T3, and the second electrode of the fifth transistor T5 are of an integrated structure; the first electrode of the fourth transistor T4 is connected with the data signal line 71 through a via; the second electrode of the fourth transistor T4, the second electrode of the third transistor T3, and the first electrode of the sixth transistor T6 and the second electrode of the eighth transistor T8 are of an integrated structure; the fifth connection electrode is connected with the first power line 72 through a via; the second electrode of the sixth transistor T6 and the second electrode of the seventh transistor T7 are of an integrated structure and the second electrode of the sixth transistor T6 and the second electrode of the seventh transistor T7 are connected with the anode connection electrode of the light emitting element through a via; the first electrode of the seventh transistor T7 is connected with the second initial signal line 53 through a via; the second electrode plate 43 is connected with the first power line 72 through a via; the third initial signal line 610 serves as the first electrode of the eighth transistor T8.

Figure 18A:
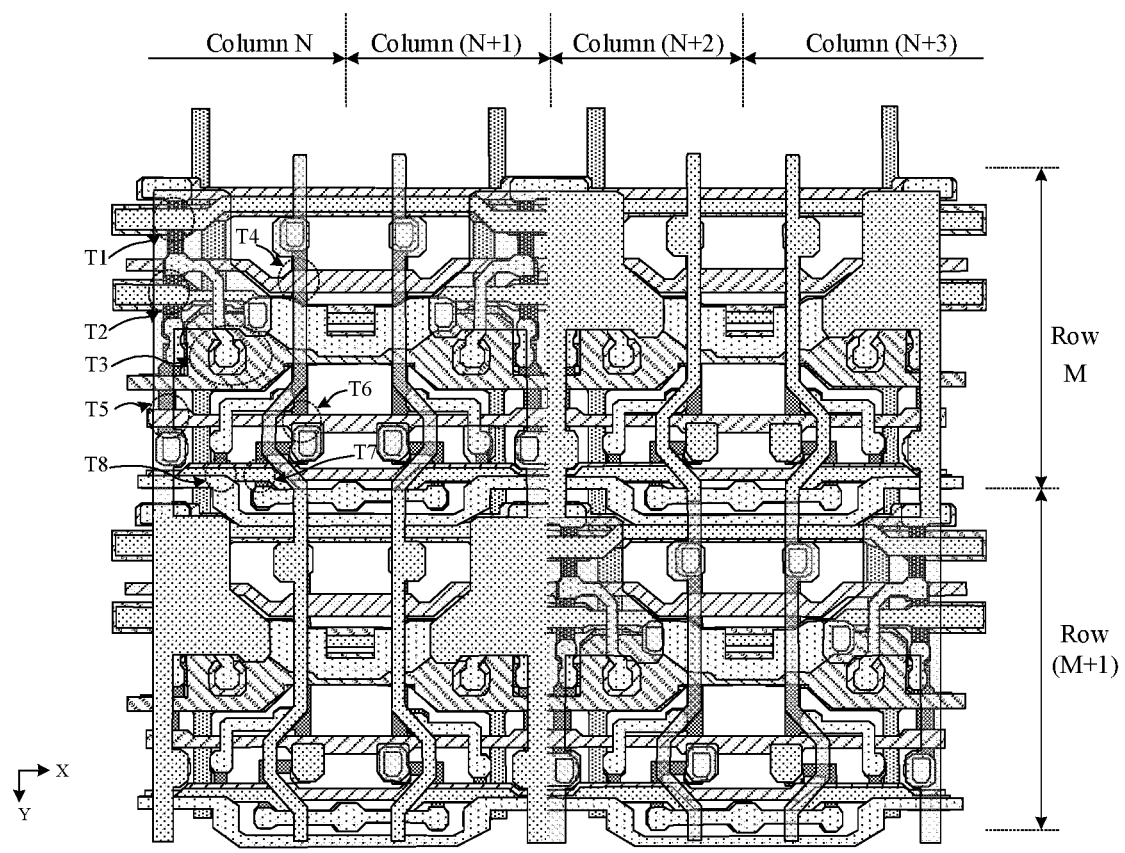
FIG. 18a to FIG. 18b are schematic diagrams after a fifth conductive layer pattern is formed according to an exemplary embodiment of the present disclosure.
Figure 18B:
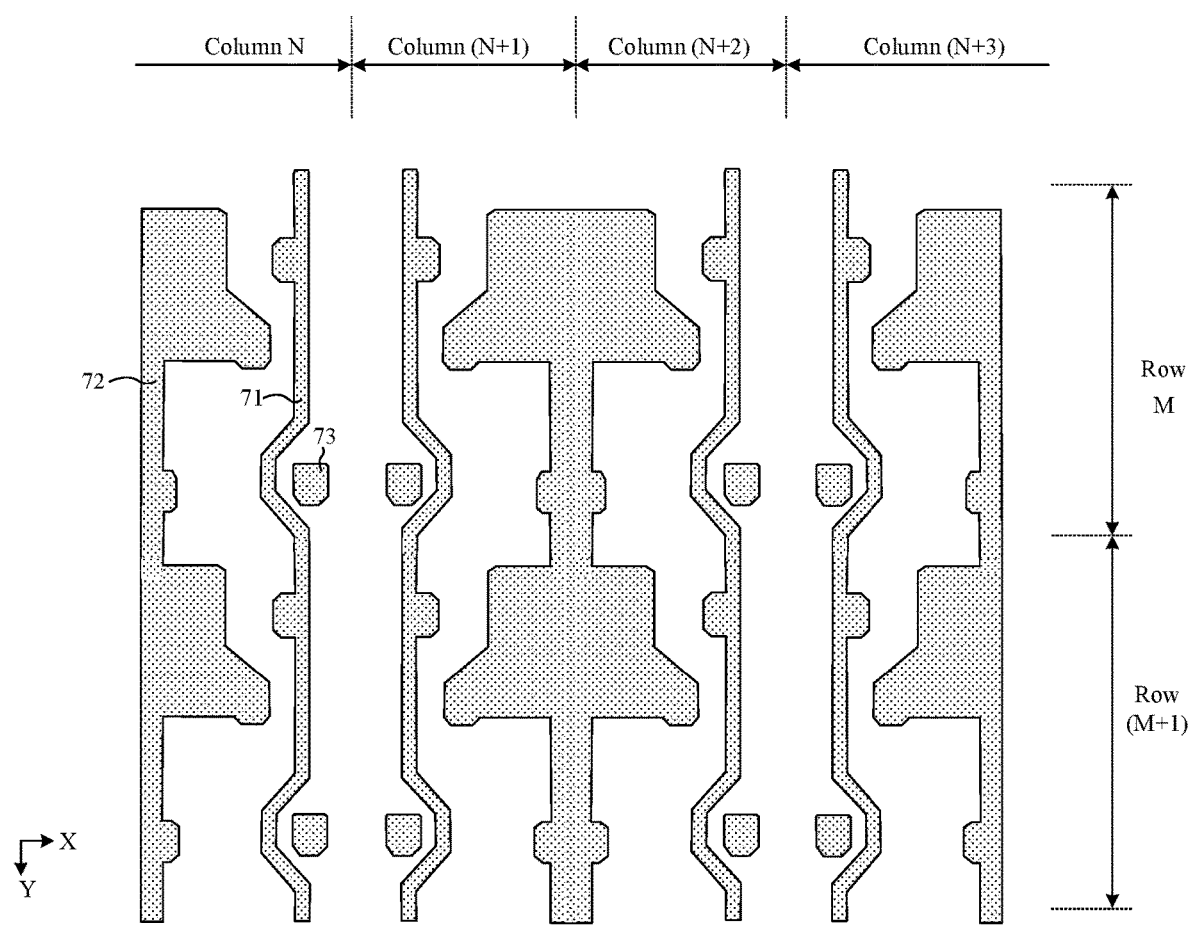

In an exemplary embodiment, as shown in FIG. 18a and FIG. 18b, in a plane where the fifth conductive layer is located, the data signal line 71 is in a shape of a bend line in which the main body part extends along the second direction Y and the data signal line 71 is connected with the first electrode of the fourth transistor T4 through a via; the first power line 72 is in a shape of a bend line in which the main body part extends along the second direction Y and the first power line 72 is connected with the second electrode plate 43 and the first electrode of the fifth transistor T5 through a via; the anode connection electrode is connected with the second electrode of the sixth transistor and the second electrode of the seventh transistor T7 through a via.

In an exemplary embodiment, as shown in FIG. 14 to FIG. 18, in a plane where the display substrate is located, the main body parts of the first scan signal line 51 and the third initial signal line 610 extend in along the first direction X, in the second direction Y and in a same pixel row, an orthographic projection of the third initial signal line 610 and the first scan signal line 51 on the base substrate is located on both sides of an orthographic projection of the storage capacitor C on the base substrate. In an embodiment of the present disclosure, the first scan signal line 51 serves as the control electrode of the first transistor T1, the third initial signal line 610 serves as the first electrode of the eighth transistor T8, the eighth transistor T8 receives a low-level signal from the third initial signal line 610 during initialization of the third node N3, and the effective signal of the control electrode of the first transistor T1 is a high-level signal, that is, one of the effective signals of the first initial signal line 610 and the control electrode of the first transistor T1 is high-level and the other is low-level, the first scan signal line 51 and the third initial signal line 610 in a same pixel row are disposed on both sides of the storage capacitor C in the second direction, so that a mutual interference between the low-level signal provided by the first initial signal line 610 and the high-level signal provided by the first scan signal line 51 can be avoided. As shown in FIG. 14 to FIG. 18, the first scan signal line 51 and the third initial signal line 610 in any one of the pixel rows are respectively located on both sides of the pixel row in the second direction, so that a mutual interference between high-level signal and low-level signal on two signal lines in a same pixel row can be greatly reduced.

In an exemplary embodiment, as shown in FIG. 12 and FIG. 15 to FIG. 18, the second electrode plate is provided with an opening, the opening is located in the middle of the second electrode plate 43, the opening 44 may be in a shape of rectangular so that the second electrode plate 43 forms an annular structure, the opening 44 exposes a third insulation layer covering the first electrode plate 33, and an orthographic projection of the first electrode plate 33 on the base substrate includes an orthographic projection of the opening 44 on the base substrate;

the active layers of the first transistor to the eighth transistor each includes a first region and a second region; the fifth insulation layer and the sixth insulation layer are provided with a first via V1, a second via V2 and a third via V3; the second insulation layer, the third insulation layer, the fourth insulation layer, the fifth insulation layer and the sixth insulation layer are provided with a fourth via V4, a fifth via V5, a sixth via V6, a seventh via V7, an eighth via V8, a ninth via V9, a tenth via V10 and an eleventh via V11; the third insulation layer, the fourth insulation layer, the fifth insulation layer and the sixth insulation layer are provided with a twelfth via V12 and a fourteenth via V14;

the fourth insulation layer, the fifth insulation layer and the sixth insulation layer are provided with a thirteenth via V13; the sixth insulation layer is provided with a fifteenth via V15; the seventh insulation layer and the first planarization layer are provided with a sixteenth via V16, a seventeenth via V17, an eighteenth via V18 and a nineteenth via V19;

The first via V1 exposes a first region 21-1 of the active layer 21 of the first transistor T1, the second via V2 exposes a second region 22-2 of the active layer 22 of the second transistor T2, the third via V3 exposes a first region 22-1 of the active layer 22 of the second transistor T2 and a second region 21-2 of the active layer 21 of the first transistor T1; the fourth via V4 exposes a second region 23-2 of the active layer 23 of the third transistor T3, a first region 26-1 of the active layer 26 of the sixth transistor T6, and a second region 24-1 of the active layer 24 of the fourth transistor T4; the fifth via V5 exposes a first region 24-1 of the active layer 24 of the fourth transistor T4; the sixth via V6 exposes a first region 25-1 of the active layer 25 of the fifth transistor T5; the seventh via V7 exposes a second region 25-2 of the active layer 25 of the fifth transistor T5 and a first region 23-1 of the active layer 23 of the third transistor T3; the eighth via V8 exposes a second region 26-2 of the active layer 26 of the sixth transistor T6 and the second region 27-2 of the active layer 27 of the seventh transistor T7; the ninth via V9 exposes a first region 27-1 of the active layer 27 of the seventh transistor T7; the tenth via V10 exposes a first region 28-1 of the active layer 28 of the eighth transistor T8; the eleventh via V11 exposes a second region 28-2 of the active layer 28 of the eighth transistor T8; the twelfth via V12 exposes the first electrode plate 33; the thirteenth via V13 exposes the second electrode plate 43; the fourteenth via V14 exposes the first initial signal line 35; the fifteenth via V15 exposes the second initial signal line 53; the sixteenth via V16 exposes the first electrode of the fourth transistor T4; The seventeenth via V17 exposes the connection electrode of the second electrode plate 43; the eighteenth via V18 exposes the second electrode of the sixth transistor T6 and the second electrode of the seventh transistor T7; the nineteenth via V19 exposes the first electrode of the fifth transistor T5;

The first electrode of the first transistor T1 is connected with the active layer 21 of the first transistor T1 through the first via V1; the second electrode of the second transistor T2 is connected with the second active layer through the second via V2; the second electrode of the first transistor T1 is connected with the active layer 21 of the first transistor T1 through the third via V3, the first electrode of the second transistor T2 is connected with the active layer 22 of the second transistor T2 through the third via V3; the second electrode of the third transistor T3 is connected with the active layer 23 of the third transistor T3 through the fourth via V4, the second electrode of the fourth transistor T4 is connected with the active layer 24 of the fourth transistor T4 through the fourth via V4, and the first electrode of the sixth transistor T6 is connected with the active layer 26 of the sixth transistor T6 through the fourth via V4; the first electrode of the active layer 24 of the fourth transistor T4 is connected with the active layer 24 of the fourth transistor T4 through the fifth via V5; the first electrode of the fifth transistor T5 is connected with the active layer 25 of the fifth transistor T5 through the sixth via V6; the second electrode of the fifth transistor T5 is connected with the active layer 25 of the fifth transistor T5 through the seventh via V7, the first electrode of the third transistor T3 is connected with the active layer 23 of the third transistor T3 through the seventh via V7; the second electrode of the sixth transistor T6 is connected with the active layer 26 of the sixth transistor T6 through the eighth via V8, the second electrode of the seventh transistor T7 is connected with the active layer 27 of the seventh transistor T7 through the eighth via V8; the first electrode of the seventh transistor T7 is connected with the active layer 27 of the seventh transistor T7 through the ninth via V9; the third initial signal line is connected with the active layer 28 of the eighth transistor T8 through the tenth via V10; the second electrode of the eighth transistor T8 is connected with the active layer 28 of the eighth transistor T8 through the eleventh via V11; the second electrode of the first transistor T1 is connected with the first electrode plate 33 through the twelfth via V12; the connection electrode of the second electrode plate is connected with the second electrode plate 43 through the thirteenth via V13; the first electrode of the first transistor T1 is connected with the first initial signal line 35 through the fourteenth via V14; the first electrode of the seventh transistor T7 is connected with the first initial signal line 35 through the fifteenth via V15; the data signal line is connected with the first electrode of the fourth transistor T4 through the sixteenth via V16; the first power line is connected with the connection electrode of the second electrode plate 43 through a seventeenth via V17; the second electrode of the sixth transistor T6 and the second electrode of the seventh transistor T7 are connected with the anode connection electrode through the eighteenth via V18; and the first power line is connected with the first electrode of the fifth transistor T5 through the nineteenth via V19.

The display substrate provided in an embodiment of the present disclosure, the first transistor T1 and the second transistor T2 in the pixel drive circuit are N-type transistors, which can avoid the leakage of electricity of the second node N2 during the light emitting stage. The layout design mode of the first transistor T1 and the second transistor T2 provided by an embodiment of the present disclosure saves layout space to a certain extent, and is beneficial to the achievement of low power consumption and narrow bezel of display products. In the reset stage, an initial signal of the third initial signal line is provided to the first electrode and the second electrode of the third transistor T3 as a drive transistor through the eighth transistor, it can improve or even eliminate the hysteresis deviation caused by the gray level difference between adjacent pixels, reduce the hysteresis deviation, and avoid abnormal display in the case of black-and-white switching; in the retention stage, the first electrode and the second electrode of the third transistor T3 are periodically initialized by the eighth transistor T8 using an initial signal provided by the third initial signal line, so that the potential difference between the retention frame and the refresh frame at the third node N3 and the hysteresis deviation between the retention frame and the refresh frame can be alleviated, the potential difference at the third node N3 and the hysteresis deviation of the drive transistor T3 can be reduced, and display abnormality can be avoided in the case of black-and-white switching. The signal provided by the second initial signal line can periodically reset the OLED through the seventh transistor, which can improve the flicker problem at low frequency.

A pixel drive circuit provided by an exemplary embodiment will be described below through a working process of the pixel drive circuit.

FIG. 7b is an equivalent circuit diagram of a pixel drive circuit provided by an exemplary embodiment and FIG. 8 is a working timing diagram of the pixel drive circuit provided by an exemplary embodiment. As shown in FIG. 7b, a pixel drive circuit according to an exemplary embodiment may include eight switching transistors (T1 to T8), one capacitor unit (C1), and the pixel drive circuit may be connected with 11 signal lines (a first scan signal line S1, a second scan signal line S2, a third scan signal line S3, a fourth scan signal line S4, a data signal line D, a light emitting signal line E, a first initial signal line Vinit1, a second initial signal line Vinit2, a third initial signal line Vinit3, a first power line VDD and a second power line VSS), the first transistor T1 and the second transistor T2 are N-type oxide transistors, and the third transistor T3 to the eighth transistors T8 are P-type low temperature poly-crystalline silicon transistors. As shown in FIG. 8, the working process of a pixel drive circuit provided by an exemplary embodiment may include a refresh stage and a retention stage and the refresh stage may include a first stage P1 to a third stage P3:

The first stage P1 may be referred to as a reset stage, in which the signals of the first scan signal line S1, the fourth scan signal line S4 and the light emitting signal line E are at a high-level, and the signals of the second scan signal line S2 and the third scan signal line S3 are at a low-level. Because the signal of the first scan signal line S1 is at a high-level, the first transistor T1 is turned-on, and the signal of the first initial signal line Vinit1 is supplied to the second node N2 through the first transistor T1, and the second node N2 is at a low-level, so that the storage capacitor C is initialized (Reset), the original charge in the storage capacitor is cleaned; because the signal of the third scan signal line S3 is at a low-level, the second transistor T2 is turned-off, and the potential of the second node N2 cannot be written to the first node N1 via the second transistor T2; because the signal of the second scan signal line S2 is at a low-level, the seventh transistor T7 and the eighth transistor T8 are turned-on, and the signal of the second initial signal line Vinit2 is provided to the first electrode of the OLED through the seventh transistor T7, the first electrode of the OLED is initialized (reset), its internal pre-stored voltage is cleaned, to complete initialization, and ensure that the OLED does not emit light, because the second node N2 is at a low-level, the third transistor T3 is turned-on, the signal of the third initial signal line Vinit3 is provided to the third node N3 and the first node N1 through the eighth transistor T8, and the third node N3 and the first node N1 are initialized (reset), so that hysteresis deviation caused by gray level difference between adjacent pixels can be improved or even eliminated, hysteresis deviation can be reduced, and display abnormality can be avoided in the case of black-and-white switching; because the signal of the fourth scan signal line S4 is at a high-level and the fourth transistor T4 is turned-off, the signal of the data signal line D cannot be written to the third node N3 via the fourth transistor T4; because the signal of the light emitting signal line E is at a high-level, the fifth transistor T5 and the sixth transistor T6 are turned-off, the first power line VDD cannot be written to the first node N1 via the fifth transistor T5, and the OLED does not emit light at this stage.

In the second stage P2, referred to as a data write-in stage or a threshold compensation stage, the signals of the first scan signal line S1 and the fourth scan signal line S4 are at a low-level, signals of the second scan signal line S2, the third scan signal line S3 and the light emitting signal line E are at a high-level, and the data signal line D outputs a data voltage. The signal of first scan signal line S1 is a low-level signal, the first transistor T1 is turned-off, the signal of the first initial signal line Vinit1 cannot be written into the second node N2 via the first transistor T1, the second node N2 maintains the low-level of the previous frame, and the first electrode plate of the storage capacitor C is at a low-level, so the third transistor T3 is turned-on; the signal of the second scan signal line S2 is at a high-level, the seventh transistor T7 and the eighth transistor T8 are turned-off, the signal of the second initial signal line Vinit2 cannot be written into the first electrode of the OLED via the seventh transistor T7, and the signal of the third initial signal line Vinit3 cannot be written into the third node N3 via the eighth transistor T8; because the signal of the third scan signal line S3 is at a high-level, the second transistor T2 is turned-on, and because the signal of the fourth scan signal line S4 is at a low-level, the fourth transistor T4 is turned-on, and the data voltage output from the data signal line D is provided to the second node N2 through the fourth transistor T4, the third node N3, the turned-on third transistor T3, the first node N1 and the turned-on second transistor T2, and the difference between the data voltage output from the data signal line D and the threshold voltage of the third transistor T3 is charged into the storage capacitor C, a voltage of the first electrode plate (the second node N2) of the storage capacitor C is Vd+Vth, Vd is a data voltage output from the data signal line D, and Vth is a threshold voltage of the third transistor T3. Because the light emitting signal line E is at a high-level, the fifth transistor T5 and the sixth transistor T6 are turned-off, and the first electrode of the OLED maintains a low-level of the previous frame, and the OLED does not emit light at this stage.

In the third stage P3, referred to as a light emitting stage, a signal of the light emitting signal line E is a turned-on signal, and signals of the first scan signal line S1, the second scan signal line S2, the third scan signal line S3, and the fourth scan signal line S4 are turned-off signals. The turned-off signals of the first scan signal line S1, the second scan signal line S2, the third scan signal line S3 and the fourth scan signal line S4 enable the first transistor T1, the second transistor T2, the fourth transistor T4, the seventh transistor T7 and the eighth transistor T8 to be turned-off, the signal of the first initial signal line Vinit1 cannot be written into the second node N2 via the first transistor T1, the signal of the second initial signal line Vinit2 cannot be written into the first electrode of the OLED via the seventh transistor T7, the signal of the third initial signal line Vinit3 cannot be written into the third node N3 via the eighth transistor T8, and the signal output from the data signal line D cannot be written into the third node N3 via the fourth transistor. The turned-on signal of the light emitting signal line E enables the fifth transistor T5 and the sixth transistor T6 to be turned-on, and a power voltage output by the first power line VDD provides a drive voltage to the first electrode of the OLED through the turned-on fifth transistor T5, the third transistor T3, and the sixth transistor T6 to drive the OLED to emit light.

The retention phase may include a first phase M1 to a third phase M3:

In the first stage M1, a signal of the second scan signal line S2 is a turned-on signal, and signals of the first scan signal line S1, the third scan signal line S3, the fourth scan signal line S4 and the light emitting signal line E are turned-off signals. A turned-on signal of the second scan signal line S2 enables the seventh transistor T7 and the eighth transistor T8 to be turned-on, a signal of the third initial signal line Vinit3 is provided to the third node N3 through the eighth transistor T8 to initialize (reset) the third node N3, because the third transistor T3 is turned-on, a signal of the third node N3 is written into the first node through the third transistor T3 to initialize the first electrode and the second electrode of the third transistor T3, which can improve or even eliminate hysteresis deviation caused by gray level difference between adjacent pixels, reduce hysteresis deviation and avoid display abnormality in the case of black-and-white switching; a signal of the second initial signal line Vinit2 is provided to the first electrode of the OLED through the seventh transistor T7, the first electrode of the OLED is initialized (reset) and its internal pre-stored voltage is emptied, so as to complete initialization, and ensure that the OLED does not emit light, so OLED can be reset to improve the flicker problem at low frequency; turned-off signals of the first scan signal line S1, the third scan signal line S3, the fourth scan signal line S4, and the light emitting signal line E enable the first transistor T1, the second transistor T2, the fourth transistor T4, the fifth transistor T5, and the sixth transistor T6 to be turned-off.

In the second stage M2, a signal of the fourth scan signal line S4 is a turned-on signal, and signals of the first scan signal line S1, the second scan signal line S2, the third scan signal line S3 and the light emitting signal line E are turned-off signals. The turned-on signal of the fourth scan signal line S4 enables the fourth transistor T4 to be turned-on and the data voltage output by the data signal line D is written to the third node N3.

In a third stage M3, a signal of the light emitting signal line E is a turned-on signal, and signals of the first scan signal line S1, the second scan signal line S2, the third scan signal line S3, and the fourth scan signal line S4 are turned-off signals. The turned-on signal of the light emitting signal line E enables the fifth transistor T5 and the sixth transistor T6 to be turned-on, and because the third transistor T3 is maintained to be turned-on, a power voltage output by the first power line VDD provides a drive voltage to the first electrode of the OLED through the turned-on fifth transistor T5, the third transistor T3, and the sixth transistor T6 to drive the OLED to emit light.

In general, different drive transistors T3 may have different threshold voltages due to preparation process, resulting in differences in the drive current driving the OLED compared to the expected current storage, the embodiment of the present disclosure uses the third initial signal line Vinit3 to initialize the third node N3 before writing the data signal of the data signal line D, which can avoid the difference of drive current applied to the first electrode of OLED due to the deviation of the threshold voltage of the drive transistor T3, and can improve the display effect.

In an embodiment of the present disclosure, as shown in FIG. 8, the second scanning signal line S2 is periodically refreshed. On one hand, the signal of the third initial signal line Vinit3 can be used to periodically initialize the third node N3, which can avoid hysteresis deviation caused by gray level difference between adjacent pixels and reduce hysteresis deviation; on the other hand, the voltage left over from the previous frame of the third node N3 can be avoided from affecting the current drive current, so as to avoid the occurrence of abnormal display during black-and-white switching; the first electrode of the OLED can be periodically initialized by using the signal of the second initial signal line Vinit2, so that the OLED can be periodically reset and the flicker problem at low frequency can be improved.

Figure 8A:
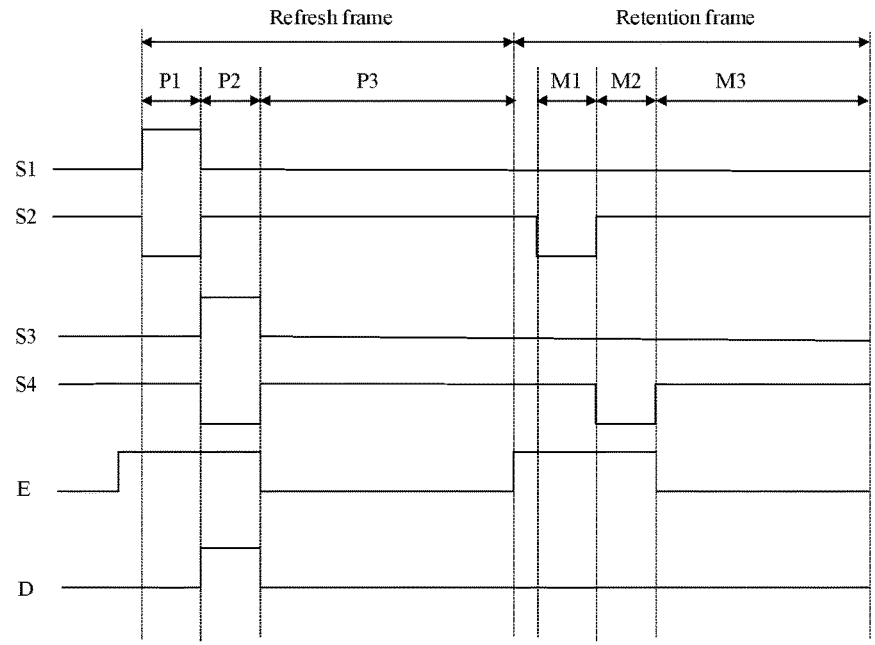
FIG. 8a is a working timing diagram of a pixel drive circuit provided by an exemplary embodiment of the present disclosure.
Figure 8B:
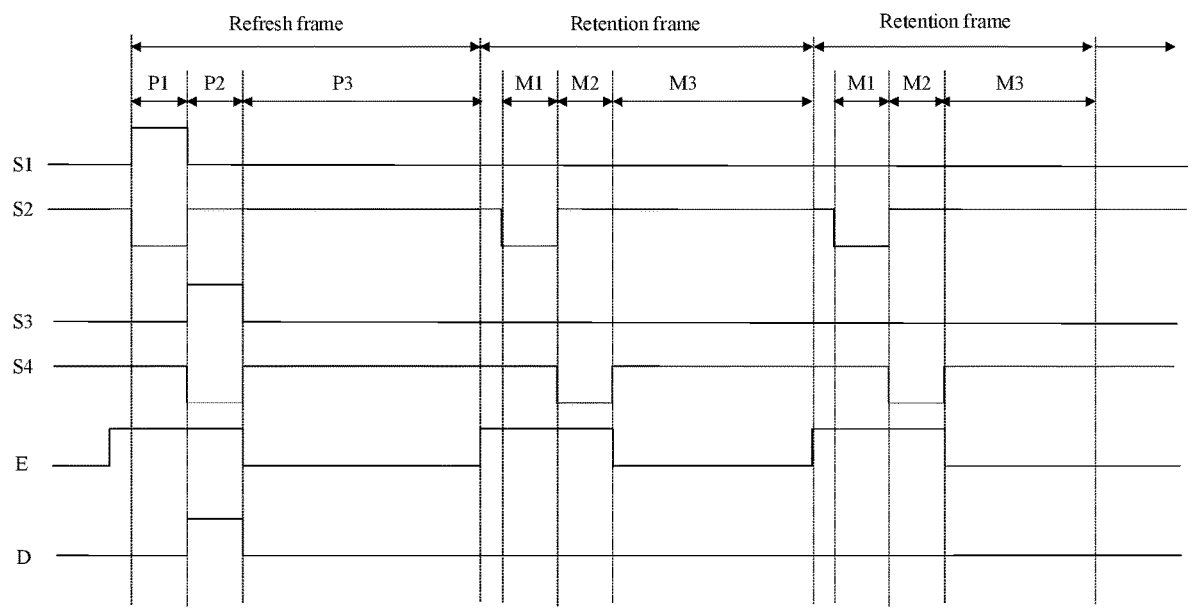
FIG. 8b is a working timing diagram of a pixel drive circuit provided by an exemplary embodiment of the present disclosure.

In an embodiment of the present disclosure, as shown in FIG. 8a, the refresh frame and the retention frame may have a 1:1 relationship, i.e. one refresh frame corresponds to one retention frame, or one refresh frame may correspond to a plurality of retention frames as shown in FIG. 8b.

Figure 8C:
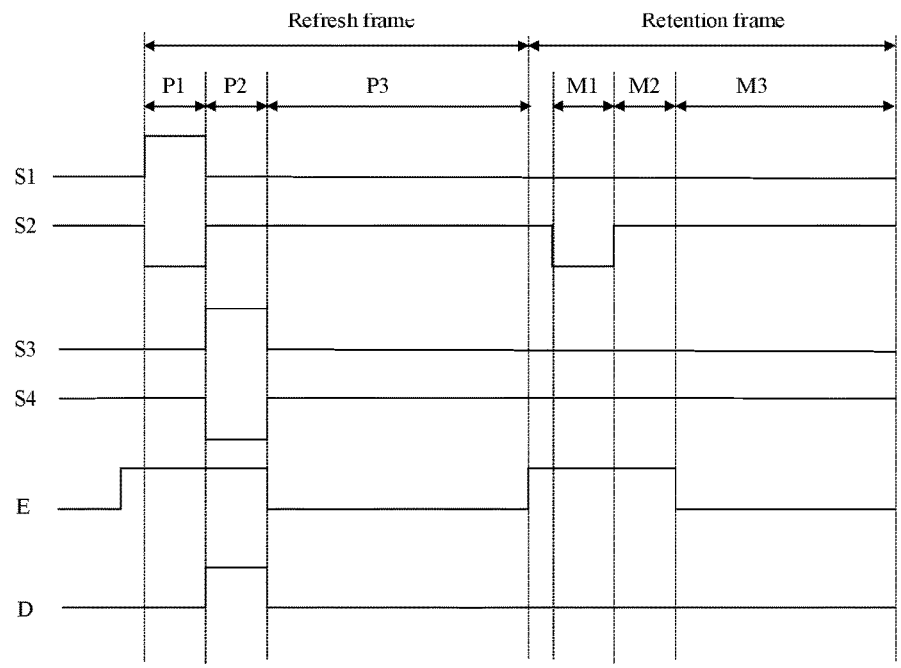
FIG. 8c is a working timing diagram of a pixel drive circuit provided by an exemplary embodiment of the present disclosure.

In an embodiment of the present disclosure, as shown in FIG. 8a and FIG. 8b, in order to achieve a low power consumption display, in the retention frame stage, the first scan signal line S1 and the third scan signal line S3 do not perform a refresh operation, and only the second scan signal line S2 and the fourth scan signal line S4 are refreshed. In some other exemplary embodiments, as shown in FIG. 8c, in the retention frame stage, in order to further reduce power consumption, only the first scan signal line S1 may be refreshed, and none of the second scan signal line S2, the third scan signal line S3, and the fourth scan signal line S4 performs a refresh operation.

Exemplary description is made below through a manufacturing process for a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate (or underlayment base substrate) using deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being arranged on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A coincides with the boundary of the orthographic projection of B.

In an exemplary implementation, taking eight circuit units (2 unit rows and 4 unit columns) as an example, the preparation process of the drive circuit layer may include the following acts. In an embodiment of the present disclosure, a circuit unit can be understood as a pixel drive circuit.

(1) A base substrate on a glass carrier plate is prepared. In an exemplary embodiment, the base substrate may be a flexible base substrate, or may be a rigid base substrate. The rigid base substrate may include, but be not limited to, one or more of glass and quartz. The flexible base substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible base substrate may include a first flexible material layer, a first inorganic material layer, a semiconductor layer, a second flexible material layer, and a second inorganic material layer that are stacked on the glass carrier plate. Materials of the first flexible material layer and the second flexible material layer may be Polyimide (PI), Polyethylene Terephthalate (PET), or a polymer soft film subjected to a surface treatment, etc. Materials of the first inorganic material layer and the second inorganic material layer may be Silicon Nitride (SiNx), Silicon Oxide (SiOx), or the like, so as to improve a water-oxygen resistance capability of the base substrate. The first inorganic material layer and the second inorganic material layer are also referred to as barrier layers. A material of the semiconductor layer may be amorphous silicon (a-si). In exemplary an embodiment, taking a stacked structure PI1/Barrier1/a-si/PI2/Barrier2 as an example, its manufacturing process may include: firstly coating a layer of polyimide on a glass carrier plate, and curing it into a film to form a first flexible material (PI1) layer; then depositing a layer of barrier thin film on the first flexible layer to form a first barrier (Barrier1) layer overlying the first flexible material layer; then depositing a layer of amorphous silicon thin film on the first barrier layer to form an amorphous silicon (a-si) layer overlying the first barrier layer; then coating a layer of polyimide on the amorphous silicon layer, and curing it into a film to form a second flexible material (PI2) layer; and then depositing a barrier thin film on the second flexible layer to form a second barrier (Barrier2) layer overlying the second flexible layer, thus completing the manufacturing of the base substrate.

(2) A pattern of a shielding layer is formed. In an exemplary embodiment, forming the pattern of the shielding layer may include depositing a first conductive film on a base substrate, patterning the first conductive layer through a patterning process, and forming the pattern of the shielding layer on the base substrate, as shown in FIG. 9, which is a planar structure view of the pattern of the shielding layer in eight circuit units.

In an exemplary embodiment, the pattern of the shielding layer of each circuit unit may include a first shielding structure 11, a second shielding structure 12, a third shielding structure 13 and a shielding block 14. A shape of the shielding block 14 may be rectangular, and the corners of the rectangular may be chamfered. The first shielding structure 11 may be a strip shape extending along the first direction X and the first shielding structure 11 is disposed on a side of the shielding block 14 in the first direction X and connected with the shielding block 14. The second shielding structure 12 may be a strip shape extending along the second direction Y and the second shielding structure 12 is disposed on a side of the shielding block 14 in the second direction Y and connected with the shielding block 14. The third shielding structure 13 may be in a shape of a bend line extending along the second direction Y and the third shielding structure 13 is disposed on a side of the shielding block 14 in a direction opposite to the second direction Y and connected with the shielding block 14.

In an exemplary embodiment, the first shielding structure 11 of each circuit unit is connected with the shielding blocks 14 of adjacent circuit units in the first direction X such that the shielding layers in a circuit unit row are connected as a whole to form an integrated structure and be connected with each other.

In an exemplary embodiment, the second shielding structure 12 of each circuit unit is connected with the third shielding structures 13 of adjacent circuit units in the second direction Y such that the shielding layers in a circuit unit column are connected as a whole to form an integrated structure and be connected with each other.

In an exemplary embodiment, the shielding layers in the circuit unit rows and the circuit unit columns are connected into a whole, which can ensure that the shielding layers in the display substrate have the same potential and is beneficial for improving the uniformity of the panel, avoiding poor display of the display substrate and ensuring the display effect of the display substrate.

In an exemplary embodiment, the shielding layer of the Nth column and the shielding layer of the (N+1)-th column may be mirror symmetrical with respect to a first centerline, the shielding layer of the (N+1)-th column and the shielding layer of the (N+2)-th column may be mirror symmetrical with respect to a second centerline, the shielding layer of the (N+2)-th column and the shielding layer of the (N+3)-th column may be mirror symmetrical with respect to a third centerline, and the first centerline, the second centerline, and the third centerline may respectively be a straight line extending in the second direction Y between adjacent circuit unit columns.

In an exemplary embodiment, shapes of the shielding layers in a plurality of circuit unit rows can be the same.

(3) A pattern of a first semiconductor layer is formed. In an exemplary embodiment, forming the pattern of the first semiconductor layer may include depositing sequentially a first insulation thin film and a first semiconductor thin film on the base substrate, on which the aforementioned pattern is formed, the first semiconductor thin film is patterned through a patterning process a to form a first insulation layer covering the pattern of the shielding layer, and the pattern of the first semiconductor layer disposed on the first insulation layer, as shown in FIG. 10, FIG. 10a is a planar structure view of eight circuit units, and FIG. 10b is a planar schematic view of the first semiconductor layer in FIG. 10a.

In an exemplary embodiment, the pattern of the first semiconductor layer of each circuit unit may include the active layer 23 of the third transistor T3 to the active layer 28 of the eighth transistor T8, and the active layer 23 of the third transistor T3 to the active layer 27 of the seventh transistor T7 are connected with each other and of an integrated structure.

In an exemplary embodiment, in the first direction X, the active layer 24 of the fourth transistor T4 and the active layer 26 of the sixth transistor T6 are located on a same side of the active layer 23 of the third transistor T3, and the active layer 25 of the fifth transistor T5 is located on the other side of the active layer 23 of the third transistor T3; in the second direction Y, the active layer 24 of the fourth transistor T4 and the active layer 26 of the sixth transistor T6 are located on both sides of the active layer 23 of the third transistor T3, and the active layer 25 of the fifth transistor T5, the active layer 26 of the sixth transistor T6, the active layer 27 of the seventh transistor T7 and the active layer 28 of the eighth transistor T8 are located on a same side of the active layer 23 of the third transistor T3, and the active layer 27 of the seventh transistor T7 is located on a side of the active layer 26 of the sixth transistor T6 away from the active layer 24 of the fourth transistor T4; in the first direction X, the active layer 28 of the eighth transistor T8 is located between the active layer 25 of the fifth transistor T5 and the active layer 27 of the seventh transistor T7.

In an exemplary embodiment, illustration is made by taking the Mth row and (N+1)th circuit unit as an example: in the first direction X, the active layer 24 of the fourth transistor T4 and the active layer 26 of the sixth transistor T6 are located on a side of the active layer 23 of the third transistor T3 away from the Nth column circuit unit and the active layer 25 of the fifth transistor T5 is located on a side of the active layer 23 of the third transistor T3 away from the (N+2)th column circuit unit; in the second direction Y, the active layer 24 of the fourth transistor T4 is located on a side of the active layer 23 of the third transistor T3 away from the (M+1)th row circuit unit, the active layer 25 of the fifth transistor T5, the active layer 26 of the sixth transistor T6, the active layer 27 of the seventh transistor T7 and the active layer 28 of the eighth transistor T8 are located on a side of the active layer 23 of the third transistor T3 away from the (M-1)th row circuit unit, and the active layer 27 of the seventh transistor T7 is located on a side of the active layer 26 of the sixth transistor T6 away from the active layer 24 of the fourth transistor T4; in the first direction X, the active layer 28 of the eighth transistor T8 is located between the active layer 25 of the fifth transistor T5 and the active layer 27 of the seventh transistor T7.

In an exemplary embodiment, a shape of the active layer 23 of the third transistor T3 may be an inverted "Ω" shape and a shape of the active layer 24 of the fourth transistor T4 to the active layer 28 of the eighth transistor T8 may be an "I" shape.

In an exemplary embodiment, an active layer of each transistor may include a first region, a second region and a channel region located between the first region and the second region. In an exemplary embodiment, the first region 23-1 of the active layer 23 of the third transistor T3 may simultaneously serve as the second region 25-2 of the active layer 25 of the fifth transistor T5, the second region 23-2 of the active layer 23 of the third transistor T3 may simultaneously serve as the second region 24-2 of the active layer 24 of the fourth transistor T4 and the first region 26-1 of the active layer 26 of the sixth transistor T6, the second region 26-2 of the active layer 26 of the sixth transistor T6 may simultaneously serve as the second region 27-2 of the active layer 27 of the seventh transistor T7, the first region 28-1 and the second region 28-2 of the active layer 28 of the eighth transistor T8 may be separately disposed, and the first region 24-1 of the active layer 24 of the fourth transistor T4, the first region 25-1 of the active layer 25 of the fifth transistor T5, and the first region 27-1 of the active layer 27 of the seventh transistor T7 may be separately disposed.

In an exemplary embodiment, an orthographic projection of the active layer 23 of the third transistor T3 on the base substrate is at least partially overlapped with an orthographic projection of the shielding block 14 on the base substrate. In an exemplary embodiment, an orthographic projection of the channel region of the active layer 23 of the third transistor T3 on the base substrate is within the range of the orthographic projection of the shielding block 14 on the base substrate.

In an exemplary embodiment, the first semiconductor layer may be made of poly-crystalline silicon (p-Si), i.e., the third transistor T3 to the eighth transistor T8 are LTPS thin film transistors. In an exemplary embodiment, patterning of the first semiconductor thin film through the patterning process may include: forming an amorphous silicon (a-si) thin film on the first insulation thin film, dehydrogenating the amorphous silicon thin film, and crystallizing the dehydrogenated amorphous silicon thin film to form a poly-crystalline silicon thin film. Subsequently, the poly-crystalline silicon thin film is patterned to form a pattern of the first semiconductor layer.

(4) A pattern of a first conductive layer is formed. In an exemplary embodiment, forming a pattern of a first conductive layer may include: depositing sequentially a second insulation thin film and a first conductive thin film on the base substrate, on which the aforementioned patterns are formed, and patterning the first conductive thin film through a patterning process to form a second insulation layer that covers a pattern of the first semiconductor layer and form a pattern of the first conductive layer disposed on the second insulation layer, as shown in FIG. 11a and FIG. 11b, and FIG. 11b is a planar schematic view of the first conductive layer in FIG. 11a. In an exemplary embodiment, the first conductive layer may be referred to as a first gate metal (GATE1) layer.

In an exemplary embodiment, the pattern of the first conductive layer may at least include: a second scan signal line 31 (i.e., the aforementioned second scan signal line S2), a light emitting control line 32, a first electrode plate 33 of a storage capacitor, a fourth scan signal line 34, and a first initial signal line 35. The main body parts of the second scan signal line 31, the light emitting control line 32, the fourth scan signal line 34 and the first initial signal line 35 may extend along the first direction X, in a same circuit unit, the second scan signal line 31, the light emitting control line 32, the first electrode plate 33 of the storage capacitor, the fourth scan signal line 34, and the first initial signal line 35 are arranged in a direction opposite to the second direction Y.

In an exemplary embodiment, in the second direction Y, a second scan signal line 31 and a light emitting control line 32 are located on a side of the first electrode plate 33 of the storage capacitor, a fourth scan signal line 34 and a first initial signal line 35 are located on the other side of the first electrode plate 33 of the storage capacitor, the light emitting control line 32 is located between the first electrode plate 33 of the storage capacitor and the second scan signal line 31, and the fourth scan signal line 34 is located between the first electrode plate 33 of the storage capacitor and the first initial signal line 35.

Illustration is made by taking a circuit unit in the Mth row and Nth column as an example: in the second direction Y, the second scan signal line 31 and the light emitting control line 32 may be located on a side of the first electrode plate 33 of the storage capacitor of the circuit unit close to the circuit unit of the (M+1)th row, and the second scan signal line 31 may be located on a side of the light emitting control line 32 away from the first electrode plate 33 of the storage capacitor; the fourth scan signal line 34 and the first initial signal line 35 may be located on a side of the first electrode plate 33 of the storage capacitor of the circuit unit away from the (M+1)th row circuit unit, and the first initial signal line 35 may be located on a side of the fourth scan signal line 34 away from the first electrode plate 33 of the storage capacitor.

In an exemplary embodiment, the first electrode plate 33 may be located between the light emitting control line 32 and the fourth scan signal line 34, the first electrode plate 33 may be in a rectangular shape, the corners of the rectangular may be chamfered, and an orthographic projection of the first electrode plate 33 on the base substrate is overlapped with an orthographic projection of the active layer of the third transistor on the base substrate. In an exemplary embodiment, the first electrode plate 33 may simultaneously serve as an electrode plate of the storage capacitor and a control electrode of the third transistor T3.

In an exemplary embodiment, an overlapping area between the fourth scan signal line 34 and the active layer of the fourth transistor T4 serves as the control electrode of the fourth transistor T4, an overlapping area between the light emitting control line 32 and the active layer of the fifth transistor T5 serves as the control electrode of the fifth transistor T5, an overlapping area between the light emitting control line 32 and the active layer of the sixth transistor T6 serves as the control electrode of the sixth transistor T6, an overlapping area between the second scan signal line 31 and the active layer of the seventh transistor T7 serves as the control electrode of the seventh transistor T7, and an overlapping area between the second scan signal line 31 and the active layer of the eighth transistor T8 serves as the control electrode of the eighth transistor T8.

In an exemplary embodiment, the second scan signal line 31, the light emitting control line 32, the fourth scan signal line 34, and the first initial signal line 35 may be designed for equal width or non-equal width, thereby not only the layout of the pixel structure can be facilitated, but also a parasitic capacitance between the signal lines can be reduced.

In an exemplary embodiment, after the pattern of the first conductive layer is formed, the semiconductor layer may be conductorized by using the first conductive layer as a shield. A region of the semiconductor layer, which is shielded by the first conductive layer, forms the channel areas of the third transistor T3 to the eighth transistor T8, and an area of the semiconductor layer, which is not shielded by the first conductive layer, is conductorized, that is, the first regions and the second regions of the active layer 23 of the third transistor T3 to the active layer 28 of the eighth transistor T8 are all conductorized.

(5) A pattern of a second conductive layer is formed. In an exemplary embodiment, forming the pattern of the second conductive layer may include: depositing sequentially a third insulation thin film and a second conductive thin film on the base substrate, on which the aforementioned patterns are formed, the second conductive thin film is patterned through a pattern process to form a third insulation layer covering the first conductive layer and the pattern of the second conductive layer disposed on the third insulation layer, as shown in FIG. 12a to FIG. 12b, wherein FIG. 12a is a planar structure view of eight circuit units, and FIG. 12b is a planar schematic view of the second conductive layer in FIG. 12a. In an exemplary embodiment, the second conductive layer may be referred to as a second gate metal (GATE2) layer.

In an exemplary embodiment, the pattern of the second conductive layer at least includes: a first shielding line 41, a second shielding line 42, and a second electrode plate 43 of the storage capacitor. And the main body parts of the first shielding line 41 and the second shielding line 42 may extend along the first direction X. The second electrode plate 43 of the storage capacitor serves as the other plate of the storage capacitor. In the second direction Y, the second shielding line 42 is located between the first shielding line 41 and the second electrode plate 44. For example, the first shielding line 41, the second shielding line 42, and the second electrode plate 43 of the storage capacitor are sequentially arranged along the second direction Y.

In an exemplary embodiment, the first shielding line 41 is configured as a shielding layer of the first transistor T1 to shield the channel of the first transistor T1, and the second shielding line 42 is configured as a shielding layer of the second transistor T2 to shield the channel of the second transistor T2, thereby ensuring electrical performances of a first oxide transistor T1 and a second oxide transistor T2.

In an exemplary embodiment, a profile of the second electrode plate 43 may be in a shape of a rectangle and corners of the rectangular may be chamfered. An orthographic projection of the second electrode plate 43 on the base substrate is overlapped with an orthographic projection of the first electrode plate 33 on the base substrate, the first electrode plate 33 and the second electrode plate 43 form the storage capacitor of the pixel drive circuit. The second electrode plate 43 is provided with an opening 44, and the opening 44 may be located in the middle of the second electrode plate 43. The opening 44 may be rectangular and makes the second electrode plate 43 form an annular structure. The opening 44 exposes the third insulation layer covering the first electrode plate 33 and an orthographic projection of the first electrode plate 33 on the base substrate includes an orthographic projection of the opening 44 on the base substrate. In an exemplary embodiment, the opening 44 is configured to accommodate a first via subsequently formed, the first via is located in the opening 44 and exposes the first electrode plate 33, so that a second electrode of the first transistor T1 subsequently formed is connected with the first electrode plate 33.

(6) A pattern of a second semiconductor layer is formed.
In an exemplary embodiment, forming the pattern of the second semiconductor layer may include: depositing sequentially a fourth insulation thin film and a second semiconductor thin film on a base substrate, on which the aforementioned patterns are formed, patterning the second semiconductor thin film by a patterning process to form a fourth insulation layer covering the base substrate and the pattern of the second semiconductor layer disposed on the fourth insulation layer, as shown in FIG. 13a to FIG. 13b, wherein FIG. 13a is a planar structure view of eight circuit units and FIG. 13b is a planar schematic view of the second semiconductor layer in FIG. 13a.

In an exemplary embodiment, the pattern of the second semiconductor layer in each circuit unit at least includes: an active layer 21 of the first transistor T1 and an active layer 22 of the second transistor T2, and the active layer 21 of the first transistor T1 and the active layer 22 of the second transistor T2 are of an integrated structure and connected to each other.

In an exemplary embodiment, the active layer 21 of the first transistor T1 and the active layer 22 of the second transistor T2 may be an "I" shape, the second region 21-2 of the active layer 21 of the first transistor T1 may serve as the first region 22-1 of the active layer 22 of the second transistor T2, and the first region 21-1 of the active layer 21 of the first transistor T1 and the second region 22-2 of the second active layer 22 may be separately disposed.

In an exemplary embodiment, the second semiconductor layer in the Nth column and the second semiconductor layer in the (N+1)th column may be mirror symmetrical with respect to the first centerline, the second semiconductor layer in the (N+1)th column and the second semiconductor layer in the (N+2)th column may be mirror symmetrical with respect to the second centerline, and the second semiconductor layer in the (N+2)th column and the second semiconductor layer in the (N+3)th column may be mirror symmetrical with respect to the third centerline.

In an exemplary embodiment, shapes of the second semiconductor layers in a plurality of circuit units may be the same.

In an exemplary embodiment, in a plane where the display substrate is located and in the first direction X, the active layer 21 of the first transistor T1 and the active layer 22 of the second transistor T2 are located on a side of the active layer 23 of the third transistor T3 away from the active layer 24 of the fourth transistor T4; in the second direction Y, the active layer 21 of the first transistor T1 and the active layer 22 of the second transistor T2 are located on a side of the active layer 23 of the third transistor T3 away from the active layer 25 of the fifth transistor T5, and the active layer 21 of the first transistor T1 is located on a side of the active layer 22 of the second transistor T2 away from the active layer 23 of the third transistor T3.

In an exemplary embodiment, the second semiconductor layer may be made of an oxide, that is, the first transistor T1 and the second transistor T2 are oxide thin film transistors. In an exemplary embodiment, the oxide may be any one or more of Indium Gallium Zinc Oxide (InGaZnO), Indium Gallium Zinc Oxynitride (InGaZnON), Zinc Oxide (ZnO), Zinc Oxynitride (ZnON), Zinc Tin Oxide (ZnSnO), Cadmium Tin Oxide (CdSnO), Gallium Tin Oxide (GaSnO), Titanium Tin Oxide (TiSnO), Copper Aluminum Oxide (CuAlO), Strontium Copper Oxide (SrCuO), Lanthanum Copper Oxysulfide (LaCuOS), Gallium Nitride (GaN), Indium Gallium Nitride (InGaN), Aluminum Gallium Nitride (AlGaN), and Indium Gallium Aluminum Nitride (InGaAlN). In some possible embodiments, the second semiconductor thin film may be made of indium gallium zinc oxide (IGZO), wherein an electron mobility of indium gallium zinc oxide (IGZO) is higher than an electron mobility of amorphous silicon. Due to the leakage current of IGZO TFT is relatively small and both the first transistor T1 and the second transistor T2 are N-type transistors, which can avoid the leakage of electricity of the second node N2 in the light emitting stage.

(7) A pattern of a third conductive layer is formed. In an exemplary embodiment, forming the pattern of the third conductive layer may include: depositing sequentially a fifth insulation thin film and a third conductive thin film on a base substrate, on which the aforementioned patterns are formed, patterning the third conductive thin film through a patterning process to form a fifth insulation layer covering the second semiconductor layer and the pattern of the third conductive layer disposed on the fifth insulation layer, as shown in FIG. 14a to FIG. 14b, wherein FIG. 14a is a planar structure view of eight circuit units, and FIG. 14b is a planar schematic view of the third conductive layer in FIG. 14a. In an exemplary embodiment, the third conductive layer may be referred to as a third gate metal (GATE3) layer.

In an exemplary embodiment, the pattern of the third conductive layer at least includes: a first scan signal line 51 (i.e., the aforementioned first scan signal line S1), a third scan signal line 52 (i.e., the aforementioned third scan signal line S3) and a second initial signal line 53. The main body parts of the first scan signal line 51, the third scan signal line 52, and the second initial signal line 53 may extend along the first direction X, and in the second direction Y, the third scan signal line 52 is located between the first scan signal line 51 and the second initial signal line 53. In an exemplary mode, the first scan signal line 51, the third scan signal line 52 and the second initial signal line 53 are sequentially arranged along the second direction Y.

In an exemplary embodiment, an overlapping area between the first scan signal line 51 and the active layer 21 of the first transistor T1 serves as the control electrode of the first transistor T1 and an overlapping area between the third scan signal line 52 and the active layer 22 of the second transistor T2 serves as the control electrode of the second transistor T2.

In an exemplary embodiment, the signals of the first shielding line 41 and the first scan signal line 51 may be the same, i.e. both are connected with a same signal source, so that the first shielding line 41 may serve as a bottom gate electrode (i.e., a bottom control electrode) of the first transistor T1, forming the first transistor T1 of a double gate structure.

In an exemplary embodiment, the signals of the second shielding line 42 and the third scan signal line 52 may be the same, i.e. both are connected with a same signal source, so that the second shielding line 42 may serve as a bottom gate electrode (i.e., a bottom control electrode) of the second transistor T2, forming the second transistor T2 of a double gate structure.

Figure 15:
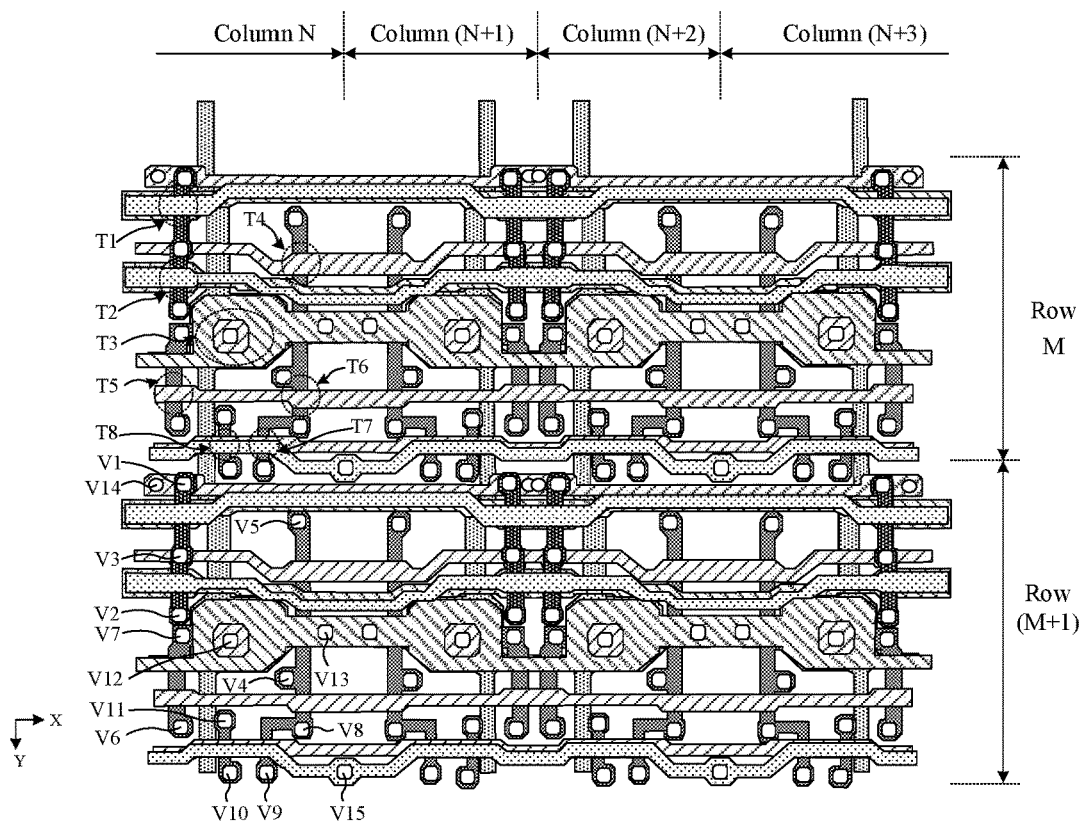
FIG. 15 is a schematic diagram after a sixth insulation layer pattern is formed according to an exemplary embodiment of the present disclosure.

(8) A pattern of a sixth insulation layer is formed. In an exemplary embodiment, forming a pattern of a sixth insulation layer may include: depositing a sixth insulation thin film on a base substrate, on which the aforementioned patterns are formed, patterning the sixth insulation thin film through a patterning process to form a sixth insulation layer covering the third conductive layer, and the sixth insulation layer is provided with a plurality of vias, as shown in FIG. 15, wherein FIG. 15 is a planar structure view of eight circuit units.

In an exemplary embodiment, a plurality of vias in each circuit unit at least include: a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, a thirteenth via V13, a fourteenth via V14, and a fifteenth via V15.

In an exemplary embodiment, an orthographic projection of the first via V1 on the base substrate is located within a range of an orthographic projection of the active layer 21 of the first transistor on the base substrate, the sixth insulation layer and the fifth insulation layer inside the first via V1 are etched away, exposing a surface of a first region 21-1 of the active layer 21 of the first transistor T1. The first via V1 is configured to connect the first electrode of the first transistor T1 subsequently formed to the active layer 21 of the first transistor T1 through the first via V1.

In an exemplary embodiment, an orthographic projection of the second via V2 on the base substrate is located within a range of an orthographic projection of the active layer 22 of the second transistor T2 on the base substrate, the sixth insulation layer and the fifth insulation layer inside the second via V2 are etched away, exposing a surface of a second region 22-2 of the active layer 22 of the second transistor T2. The second via V2 is configured to connect the second electrode of the second transistor T2 subsequently formed to the active layer 22 of the second transistor T2 through the second via V2.

In an exemplary embodiment, an orthographic projection of the third via V3 on the base substrate is located within a range of an orthographic projection of the active layer 22 of the second transistor T2 on the base substrate, the sixth insulation layer and the fifth insulation layer inside the third via V3 are etched away, exposing a surface of a first region 22-1 of the active layer 22 of the second transistor T2 (it is also a second region 21-2 of the active layer 21 of the first transistor T1). The third via V3 is configured to connect the second electrode of the first transistor T1 subsequently formed to the active layer 21 of the first transistor T1 through the third via and connect the first electrode of the second transistor T2 subsequently formed to the active layer 22 of the second transistor T2 through the third via V3.

In an exemplary embodiment, an orthographic projection of the fourth via V4 on the base substrate is located within a range of an orthographic projection of the active layer 23 of the third transistor T3 on the base substrate, and the sixth insulation layer, the fifth insulation layer, the fourth insulation layer, the third insulation layer, and the second insulation layer inside the fourth via V4 are etched away, exposing a surface of a second region 23-2 of the active layer 23 of the third transistor T3 (it is also a first region 26-1 of the active layer 26 of the sixth transistor T6 and a second region 24-2 of the active layer 24 of the fourth transistor T4). The fourth via V4 is configured to connect the second electrode of the third transistor T3 subsequently formed to the active layer 23 of the third transistor T3 through the fourth via, connect the second electrode of the fourth transistor T4 subsequently formed to the active layer 24 of the fourth transistor T4 through the fourth via, and connect the first electrode of the sixth transistor T6 subsequently formed to the active layer 26 of the sixth transistor T6 through the fourth via V4.

In an exemplary embodiment, an orthographic projection of the fifth via V5 on the base substrate is located within a range of an orthographic projection of the active layer 24 of the fourth transistor T4 on the base substrate, and the sixth insulation layer, the fifth insulation layer, the fourth insulation layer, the third insulation layer, and the second insulation layer inside the fifth via V5 are etched away, exposing a surface of a first region 24-1 of the active layer 24 of the fourth transistor T4. The fifth via V5 is configured to connect the first electrode of the fourth transistor T4 subsequently formed to the active layer 24 of the fourth transistor T4 through the fifth via V5.

In an exemplary embodiment, an orthographic projection of the sixth via V6 on the base substrate is located within a range of an orthographic projection of the active layer 25 of the fifth transistor T5 on the base substrate, and the sixth insulation layer, the fifth insulation layer, the fourth insulation layer, the third insulation layer, and the second insulation layer inside the sixth via V6 are etched away, exposing a surface of a first region 25-1 of the active layer 25 of the fifth transistor T5. The sixth via V6 is configured to connect the first electrode of the fifth transistor T5 subsequently formed to the active layer 25 of the fifth transistor T5 through the sixth via V6.

In an exemplary embodiment, an orthographic projection of the seventh via V7 on the base substrate is located within a range of an orthographic projection of the active layer 25 of the fifth transistor T5 on the base substrate, and the sixth insulation layer, the fifth insulation layer, the fourth insulation layer, the third insulation layer, and the second insulation layer inside the seventh via V7 are etched away, exposing a surface of a second region 25-2 of the active layer 25 of the fifth transistor T5 (it is also a first region 23-1 of the active layer 23 of the third transistor T3). The seventh via V7 is configured to connect the second electrode of the fifth transistor T5 subsequently formed to the active layer 25 of the fifth transistor T5 through the seventh via and connect the first electrode of the third transistor T3 subsequently formed to the active layer 23 of the third transistor T3 through the seventh via V7.

In an exemplary embodiment, an orthographic projection of the eighth via V8 on the base substrate is located within a range of an orthographic projection of the active layer 26 of the sixth transistor T6 on the base substrate, and the sixth insulation layer, the fifth insulation layer, the fourth insulation layer, the third insulation layer, and the second insulation layer inside the eighth via V8 are etched away, exposing a surface of a second region 26-2 of the active layer 26 of the sixth transistor T6 (it is also a second region 27-2 of the active layer 27 of the seventh transistor T7). The eighth via V8 is configured to connect the second electrode of the sixth transistor T6 subsequently formed to the active layer 26 of the sixth transistor T6 through the eighth via and connect the second electrode of the seventh transistor T7 subsequently formed to the active layer 27 of the seventh transistor T7 through the eighth via V8.

In an exemplary embodiment, an orthographic projection of the ninth via V9 on the base substrate is located within a range of an orthographic projection of the active layer 27 of the seventh transistor T7 on the base substrate, and the sixth insulation layer, the fifth insulation layer, the fourth insulation layer, the third insulation layer, and the second insulation layer inside the ninth via V9 are etched away, exposing a surface of a first region 27-1 of the active layer 27 of the seventh transistor T7. The ninth via V9 is configured to connect the first electrode of the seventh transistor T7 subsequently formed to the active layer 27 of the seventh transistor T7 through the ninth via V9.

In an exemplary embodiment, an orthographic projection of the tenth via V10 on the base substrate is located within a range of an orthographic projection of the active layer 28 of the eighth transistor T8 on the base substrate, and the sixth insulation layer, the fifth insulation layer, the fourth insulation layer, the third insulation layer, and the second insulation layer inside the tenth via V10 are etched away, exposing a surface of a first region 28-1 of the active layer 28 of the eighth transistor T8. The tenth via V10 is configured to connect the subsequently formed third initial signal line to the active layer 28 of the eighth transistor T8 through the tenth via V10.

In an exemplary embodiment, an orthographic projection of the eleventh via V11 on the base substrate is located within a range of an orthographic projection of the active layer 28 of the eighth transistor T8 on the base substrate, and the sixth insulation layer, the fifth insulation layer, the fourth insulation layer, the third insulation layer, and the second insulation layer inside the eleventh via V11 are etched away, exposing a surface of a second region 28-2 of the active layer 28 of the eighth transistor T8. The eleventh via V11 is configured to connect the second electrode of the eighth transistor T8 subsequently formed to the active layer 28 of the eighth transistor T8 through the eleventh via V11.

In an exemplary embodiment, an orthographic projection of the twelfth via V12 on the base substrate is located within a range of an orthographic projection of an opening 44 on the base substrate, and the sixth insulation layer, the fifth insulation layer, the fourth insulation layer, and the third insulation layer in the twelfth via V12 are etched away to expose a surface of the first electrode plate 33. The twelfth via V12 is configured to connect the second electrode of the first transistor T1 subsequently formed to the first electrode plate 33 through the twelfth via V12.

In an exemplary embodiment, an orthographic projection of the thirteenth via V13 on the base substrate is located within a range of an orthographic projection of the second electrode plate 43 on the base substrate, and the sixth insulation layer, the fifth insulation layer, and the fourth insulation layer in the thirteenth via V13 are etched away to expose a surface of the second electrode plate 43. The thirteenth via V13 is configured to connect the ninth connection electrode subsequently formed to the second electrode plate 43 through the thirteenth via V13. In an exemplary embodiment, there may be a plurality of the thirteenth via V13 served as power vias, and the plurality of thirteenth vias V13 may be sequentially arranged along the second direction Y or the first direction X, thereby increasing the connection reliability between the first power line and the second electrode plate 43.

In an exemplary embodiment, an orthographic projection of the fourteenth via V14 on the base substrate is located within a range of an orthographic projection of the first initial signal line on the base substrate, and the sixth insulation layer, the fifth insulation layer, the fourth insulation layer, and the third insulation layer in the fourteenth via V14 are etched away to expose a surface of the first initial signal line 35. The fourteenth via V14 is configured to connect the first electrode of the first transistor T1 subsequently formed to the first initial signal line 35 through the fourteenth via V14.

In an exemplary embodiment, an orthographic projection of the fifteenth via V15 on the base substrate is located within a range of an orthographic projection of the second initial signal line 53 on the base substrate, and the sixth insulation layer in the fifteenth via V15 is etched away to expose a surface of the second initial signal line 53. The fifteenth via V15 is configured to connect the first electrode of the seventh transistor T7 subsequently formed to the first initial signal line 35 through the fifteenth via V15.

(9) A pattern of a fourth conductive layer is formed. In an exemplary embodiment, forming the fourth conductive layer may include: depositing a fourth conductive thin film on the base substrate, on which the aforementioned patterns are formed, patterning the fourth conductive thin film by a patterning process to form the fourth conductive layer disposed on the sixth insulation layer, as shown in FIG. 16a to FIG. 16b, wherein FIG. 16a is a planar structure view of eight circuit units, and FIG. 16b is a planar schematic view of the fourth conductive layer in FIG. 16a. In an exemplary embodiment, the fourth conductive layer may be referred to as a first source-drain metal (SD1) layer.

In an exemplary embodiment, the fourth conductive layer at least includes: a first connection electrode 61, a second connection electrode 62, a third connection electrode 63, a fourth connection electrode 64, a fifth connection electrode 65, a sixth connection electrode 66, a seventh connection electrode 67, an eighth connection electrode 68, a ninth connection electrode 69, and a third initial signal line 610 (i.e., the aforementioned third initial signal line vinit3).

In an exemplary embodiment, the first connection electrode 61 is in a shape of a bend line in which the main body part extends along the second direction Y, and a first end thereof is connected with the second region 21-2 of the active layer 21 of the first transistor T1 (it is also the first region 22-1 of the active layer 22 of the second transistor T2) through the third via V3, a second end thereof is connected with the first electrode plate through the twelfth via V12, so that the first electrode plate 33, the second electrode of the first transistor T1 and the first electrode of the second transistor T2 have a same potential. In an exemplary embodiment, the first connection electrode 61 may be used as the second electrode of the first transistor T1 and the first electrode of the second transistor T2.

In an exemplary embodiment, a first end of the second connection electrode 62 is connected with the first initial signal line 35 through a fourteenth via V14, a second end thereof is connected with a first region 21-1 of the active layer 21 of the first transistor T1, so that the initial voltage transmitted by the first initial signal line 35 is written to the first transistor T1. In an exemplary embodiment, the second connection electrode 62 may serve as the first electrode of the first transistor T1.

In an exemplary embodiment, the second connection electrode 62 in the Nth column and the second connection electrode 62 in the (N+1)th column are connected to each other, the second connection electrode 62 in the (N+1)th column and the second connection electrode 62 in the (N+2)th column are connected to each other, and the second connection electrode 62 in the (N+3)th column and the second connection electrode 62 in the (N+4)th column are connected to each other. In an exemplary embodiment, because the first initial signal lines 35 in each circuit unit are connected with the first initial signal lines 35, it may ensure that the second connection electrodes 62 of the adjacent circuit units have a same potential by allowing the second connection electrodes 62 of the adjacent circuit units to be connected to each other to form an integrated structure, which is beneficial to improving the uniformity of the panel, avoiding poor display of the display substrate, and ensuring the display effect of the display substrate.

In an exemplary embodiment, one end of the third connection electrode 63 is connected with the second region 22-2 of the active layer 22 of the second transistor T2 through the second via V2, and the other end of the third connection electrode 63 is connected with the first region 23-1 of the active layer 23 of the third transistor T3 (it is also the second region 25-2 of the active layer 25 of the fifth transistor T5) through the seventh via V7. In an exemplary embodiment, the third connection electrode 63 may simultaneously serve as the second electrode of the second transistor T2, the first electrode of the third transistor T3, and the second electrode of the fifth transistor T5, so that the second electrode of the second transistor T2, the first electrode of the third transistor T3, and the second electrode of the fifth transistor T5 have a same potential.

In an exemplary embodiment, the fourth connection electrode 64 is connected with the first region 24-1 of the active layer 24 of the fourth transistor T4 through the fifth via V5. In an exemplary embodiment, the fourth connection electrode 64 may serve as the first electrode of the fourth transistor T4, and is configured to be connected with a data signal line formed subsequently.

In an exemplary embodiment, the first end of the fifth connection electrode 65 is connected with the second region 24-2 of the active layer 24 of the fourth transistor T4 (it is also the second region 22-2 of the active layer 23 of the third transistor T3, and the first region 26-1 of the active layer 26 of the sixth transistor T6) through the fourth via V4; the second end of the fifth connection electrode 65 is connected with the second region 28-2 of the active layer 28 of the eighth transistor T8 through the eleventh via V11. In an exemplary embodiment, the fifth connection electrode 65 may simultaneously serve as the second electrode of the fourth transistor T4, the second electrode of the third transistor T3, the first electrode of the sixth transistor T6, and the second electrode of the eighth transistor T8, so that the second electrode of the fourth transistor T4, the second electrode of the third transistor T3, the first electrode of the sixth transistor T6, and the second electrode of the eighth transistor T8 have a same potential.

In an exemplary embodiment, the sixth connection electrode 66 is connected with the first region 25-1 of the active layer 25 of the fifth transistor T5 through the sixth via V6. In an exemplary embodiment, the sixth connection electrode 66 may serve as a first electrode of the fifth transistor T5, and is configured to be connected with a first power line formed subsequently.

In an exemplary embodiment, in each circuit unit row, the sixth connection electrode 66 in Nth column and the sixth connection electrode 66 in (N−1)th column are connected to each other, the sixth connection electrode 66 in (N+1)th column and the sixth connection electrode 66 in (N+2)th d are connected to each other, and the sixth connection electrode 66 in (N+3)th column and the sixth connection electrode 66 in (N+4)th column are connected to each other. In an exemplary embodiment, due to the sixth connection electrode 66 in each circuit unit is connected with the subsequently formed first power line, by connecting the sixth connection electrodes 66 of adjacent circuit units into an integrated structure, so that the sixth connection electrodes 66 of the adjacent circuit units can be guaranteed to have a same potential, which is beneficial to improving the uniformity of the panel, avoiding poor display of the display substrate, and ensuring the display effect of the display substrate.

In an exemplary embodiment, the seventh connection electrode 67 is connected with a second region 26-2 of the active layer 26 of the sixth transistor T6 (it is also the second region 27-2 of the active layer 27 of the seventh transistor T7). In an exemplary embodiment, the seventh connection electrode 67 may serve as the second electrode of the sixth transistor T6 and the second electrode of the seventh transistor T7, and the sixth connection electrode 66 is configured to be connected with an anode connection electrode formed subsequently.

In an exemplary embodiment, the eighth connection electrode 68 may be in a strip shape in which the main body part extends along the first direction X, and the eighth connection electrode 68 is connected with the first region 27-1 of the active layer 27 of the seventh transistor T7 through the ninth via V9, and the eighth connection electrode 68 is connected with a second initial signal line 53 in a circuit unit row through the fifteenth via V15 in that circuit unit row. In an exemplary embodiment, the eighth connection electrode 68 may serve as the first electrode of the seventh transistor T7, and the eighth connection electrode 68 is configured to be connected with the second initial signal line 53 and the active layer 27 of the seventh transistor T7.

In an exemplary embodiment, in each circuit unit row, the Nth column and the (N+1)th column share a same eighth connection electrode 68 and the (N+2)th column and the (N+3)th column share a same eighth connection electrode 68. In an exemplary embodiment, because the eighth connection electrode 68 in each circuit unit is connected with the second initial signal line 53, by sharing a same eighth connection electrode 68 with adjacent circuit units to form an integrated structure and connect with each other, it may ensure that the eighth connection electrodes 68 of the adjacent circuit units have a same potential, which is beneficial to improving the uniformity of the panel, avoiding poor display of the display substrate, and ensuring the display effect of the display substrate.

In an exemplary embodiment, the ninth connection electrode 69 may be in a shape of a bend line in which the main body part extends along the first direction X, the ninth connection electrode 69 may be connected with the second electrode plate 43 through the thirteenth via V13, and the ninth connection electrode 69 may serve as a connection electrode of the second electrode plate 43. In an exemplary embodiment, the ninth connection electrode 69 may be configured to connect with the first power line formed subsequently.

In an exemplary embodiment, in each circuit unit row, the ninth connection electrode 69 of the Nth column and the ninth connection electrode 69 of the (N+1)th column are connected to each other, and the ninth connection electrode 69 of the (N+2)th column and the ninth connection electrode 69 of the (N+3)th column are connected to each other. In an exemplary embodiment, because the ninth connection electrode 69 in each circuit unit is connected with the first power line formed subsequently, by allowing the ninth connection electrodes 69 of adjacent circuit units to form an integrated structure and connect with each other, it may ensure that the ninth connection electrodes 69 of the adjacent circuit units have a same potential, which is beneficial to improving the uniformity of the panel, avoiding poor display of the display substrate, and ensuring the display effect of the display substrate.

In an exemplary embodiment, the third initial signal line 610 may be in a shape of a bend line in which the main body part extends along the first direction X, and the third initial signal line 610 is connected with the first region 28-1 of the active layer 28 of the plurality of eighth transistors T8 through a plurality of tenth vias V10 in one circuit unit row, and the initial voltage is written to a plurality of eighth transistors T8 in a circuit unit row. In an exemplary embodiment, due to the third initial signal line 610 is connected with all the first regions 28-1 of the active layers 28 of the eighth transistors T8 in a circuit unit row, it may ensure that all the first electrodes of the eighth transistors T8 in a circuit unit row have a same potential, which is beneficial to improving the uniformity of the panel, avoiding poor display of the display substrate, and ensuring the display effect of the display substrate. In an exemplary embodiment, the third initial signal line 610 may serve as the first electrode of the eighth transistor T8.

Figure 17:
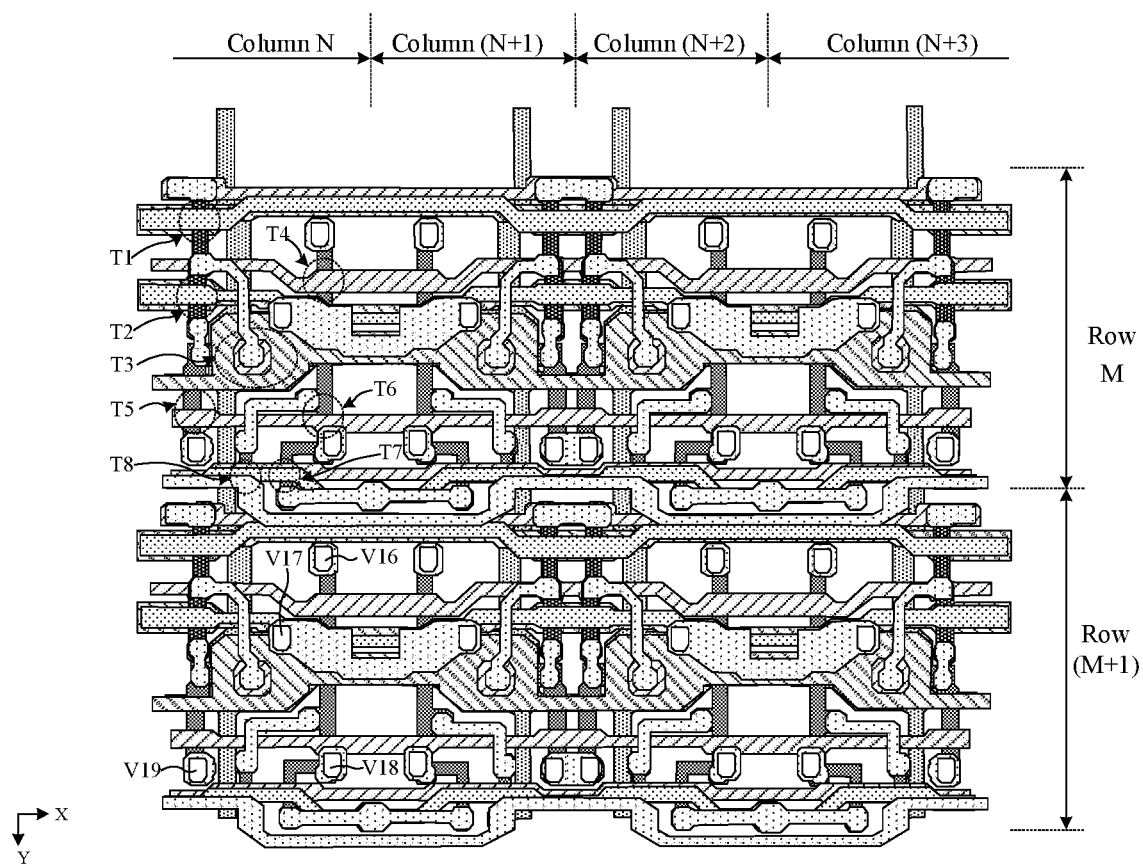
FIG. 17 is a schematic diagram after a first planarization layer pattern is formed according to an exemplary embodiment of the present disclosure.

(10) A pattern of a seventh insulation layer and a pattern of a first planarization layer are formed. In an exemplary embodiment, forming the pattern of the seventh insulation layer and the pattern of the first planarization layer may include: depositing a seventh insulation thin film on a base substrate, on which the aforementioned patterns are formed, then coating a first planarization thin film, patterning the seventh insulation thin film and the first planarization thin film through a patterning process to form the seventh insulation layer covering the pattern of the fourth conductive layer and the first planarization layer disposed on the seventh insulation layer, and the seventh insulation layer and the first planarization layer are provided with a plurality of vias, as shown in FIG. 17, wherein FIG. 17 is a planar structure view of eight circuit units.

In an exemplary embodiment, the plurality of vias in each circuit unit at least includes: a sixteenth via V16, a seventeenth via V17, an eighteenth via V18, and a nineteenth via V19.

In an exemplary embodiment, an orthographic projection of the sixteenth via V16 on the base substrate is located within a range of an orthographic projection of a fourth connection electrode 64 on the base substrate. The first planarization layer and the seventh insulation layer in the sixteenth via V16 are etched away to expose a surface of the fourth connection electrode 64. The sixteenth via V16 is configured to connect the data signal line formed subsequently with the fourth connection electrode 64 through the sixteenth via V16.

In an exemplary embodiment, an orthographic projection of the seventeenth via V17 on the base substrate is located within a range of an orthographic projection of a ninth connection electrode 69 on the base substrate. The first planarization layer and the seventh insulation layer in the seventeenth via V17 are etched away to expose a surface of the ninth connection electrode 69. The seventeenth via V17 is configured to connect the first power line formed subsequently with the ninth connection electrode 69 through the seventeenth via V17.

In an exemplary embodiment, an orthographic projection of the eighteenth via V18 on the base substrate is located within a range of an orthographic projection of a seventh connection electrode 67 on the base substrate. The first planarization layer and the seventh insulation layer in the eighteenth via V18 are etched away to expose a surface of the seventh connection electrode 67. The eighteenth via V18 is configured to connect the anode connection electrode formed subsequently with the seventh connection electrode 67 through the eighteenth via V18.

In an exemplary embodiment, an orthographic projection of the nineteenth via V19 on the base substrate is within a range of an orthographic projection of a sixth connection electrode 66 on the base substrate. The first planarization layer and the seventh insulation layer in the nineteenth via V19 are etched away to expose a surface of the sixth connection electrode 66.

The nineteenth via V19 is configured to connect the first power line formed subsequently with the sixth connection electrode 66 through the nineteenth via V19.

(11) A pattern of a fifth conductive layer is formed. In an exemplary embodiment, forming the fifth conductive layer may include: depositing a fifth conductive thin film on the base substrate, on which the aforementioned patterns are formed, and patterning the fifth conductive thin film through a patterning process to form the fifth conductive layer disposed on the first planarization layer, as shown in FIG. 18a to FIG. 18b, wherein FIG. 18a is a planar structure view of eight circuit units, and FIG. 18b is a schematic planar view of the fifth conductive layer in FIG. 18a. In an exemplary embodiment, the fifth conductive layer may be referred to as a second source-drain metal (SD2) layer.

In an exemplary embodiment, the fifth conductive layer at least includes: a data signal line 71 (i.e., the aforementioned data signal line D), a first power line 72, and an anode connection electrode 73.

In an exemplary embodiment, the data signal line 71 is in a shape of a bend line in which the main body part extends along the second direction Y, and the data signal line 71 is connected with the fourth connection electrode 64 through the sixteenth via V16. Because the fourth connection electrode 64 is connected with the first region 24-1 of the active layer 24 of the fourth transistor T4 through a via, a connection between the data signal line 71 and the first electrode of the fourth transistor T4 is achieved, and a data signal is written into the the fourth transistor T4.

In an exemplary embodiment, the first power line 72 is in a shape of a bend line in which the main body part extends along the second direction Y, the first power line 72 is connected with the ninth connection electrode 69 through the seventeenth via V17, and the first power line 72 is connected with the sixth connection electrode 66 through the nineteenth via V19. Because the ninth connection electrode 69 is connected with the second electrode plate 43 through a via, a connection between the first power line 72 and the second electrode plate 43 is achieved, and a power signal is written into the second electrode plate 43. Because the sixth connection electrode 66 is connected with a first region 25-1 of the active layer 25 of the fifth transistor T5 through a via, a connection between the first power line 72 and the first electrode of the fifth transistor T5 is achieved, and a power signal is written into the fifth transistor T5.

In an exemplary embodiment, the anode connection electrode 73 is connected with the seventh connection electrode 67 through the eighteenth via V18. Because the seventh connection electrode 67 is connected with a second region 26-2 of the active layer 26 of the sixth transistor T6 (it is also a second region 27-2 of the active layer 27 of the seventh transistor T7) through a via, connections between the anode connection electrode 73 and the second electrode of the sixth transistor T6 as well as the second electrode of the seventh transistor are achieved.

So far, the preparation for the drive circuit layer is completed on the base substrate. In an exemplary embodiment, in a plane perpendicular to the display substrate, the drive circuit layer may include a shielding layer, a first semiconductor layer, a first conductive layer, a second conductive layer, a second semiconductor layer, a third conductive layer, a fourth conductive layer, and a fifth conductive layer that are sequentially disposed on the base substrate.

In an exemplary embodiment, the drive circuit layer may include the first insulation layer, the second insulation layer, the third insulation layer, the fourth insulation layer, the fifth insulation layer, the sixth insulation layer, the seventh insulation layer, and the first planarization layer, the first insulation layer is disposed between the shielding layer and the first semiconductor layer, the second insulation layer is disposed between the first semiconductor layer and the first conductive layer, the third insulation layer is disposed between the first conductive layer and the second conductive layer, the fourth insulation layer is disposed between the second conductive layer and the second semiconductor layer, the fifth insulation layer is disposed between the second semiconductor layer and the third conductive layer, and the sixth insulation layer is disposed between the third conductive layer and the fourth conductive layer, and the seventh insulation layer and the first planarization layer are disposed between the fourth conductive layer and the fifth conductive layer.

In an exemplary embodiment, after the preparation of the drive circuit layer is completed, a light emitting structure layer is prepared on the drive circuit layer, and the preparation process of the light emitting structure layer may include the following acts. A pattern of a second planarization layer is formed and at least an anode via is disposed on the second planarization layer. A pattern of an anode is formed and the anode is connected with the anode connection electrode through the anode via. An anode pixel definition layer, and the pixel definition layer is provided with a pixel opening, and the pixel opening exposes the anode. An organic emitting layer is formed using an evaporation or ink-jet printing process, and a cathode is formed on the organic emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is disposed between the first encapsulation layer and the third encapsulation layer, so as to prevent external water vapor from entering the light emitting structure layer.

In an exemplary embodiment, the shielding layer, the first conductive layer, the second conductive layer, the third conductive layer, the fourth conductive layer and the fifth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, the fourth insulation layer, the fifth insulation layer, the sixth insulation layer, and the seventh insulation layer may be made of any one or more of silicon oxide (SiOx), silicon nitride (SiNx), and silicon oxynitride (SiON), and may be single layers, multiple layers, or composite layers. The first insulation layer may be referred to as a Buffer layer, which is used for improving the water and oxygen resistance of the base substrate. The second insulation layer, the third insulation layer, the fourth insulation layer, and the fifth insulation layer may be referred to as a gate insulation (GI) layer, the sixth insulation layer may be referred to as an interlayer insulation (ILD) layer, and the seventh insulation layer may be referred to as a passivation (PVX) layer.

The structure and preparation process shown in the aforementioned embodiments of the present disclosure are only an exemplary explanation. In an exemplary embodiment, the corresponding structure can be changed and the patterning process can be increased or reduced according to actual needs. The display substrate of an embodiment of the present disclosure may be applied to other display devices with a pixel drive circuit, such as a quantum dot display. The present disclosure is not limited herein.

The present disclosure further provides a display apparatus which includes the display substrate according to the aforementioned embodiments. The display device may be any product or component with a display function, such as a mobile phone, a tablet computer, a television, a display, a laptop computer, a digital photo frame, or a navigator.

The present disclosure further provides a working method of a display substrate. The display substrate includes K pixel rows, and K is a positive integer greater than 1; at least a pixel row includes an initial signal line, a scan signal line, and a plurality of sub-pixels disposed sequentially along an extension direction of the initial signal line and the scan signal line; the initial signal line includes a third initial signal line, the scan signal line includes a second scan signal line, and at least one sub-pixel includes a pixel drive circuit, the pixel drive circuit at least includes a third transistor as a drive transistor and an eighth transistor as an initialization transistor; in at least a pixel row, the eighth transistor is connected with the third initial signal line, the second scan signal line, and the second electrode of the drive transistor; the working method includes:

The eighth transistor supplies an initial signal of the third initial signal line to a second electrode of the drive transistor under the control of the second scan signal line.

An embodiment of the present disclosure provides the base substrate and its working method, as well as the display device. The display substrate includes a third initial signal line, a second scan signal line and a plurality of sub-pixels, at least one sub-pixel includes a pixel drive circuit, the pixel drive circuit includes a third transistor as a drive transistor and an eighth transistor as an initialization transistor, the eighth transistor is connected with the third initial signal line, the second scan signal line and a second electrode of the drive transistor, and is configured to provide the initial signal of the third initial signal line to the second electrode of the drive transistor under the control of the second scan signal line. An solution provided by an embodiment of the present disclosure, the eighth transistor as an initialization transistor supplies the initial signal of the third initial signal to the second electrode of the drive transistor under the control of the second scan signal line, which can overcome the display abnormality in the case of black-and-white switching, improve the hysteresis deviation caused by the gray level difference between adjacent pixels, and reduce the hysteresis deviation.

The drawings of the embodiments of the present disclosure only involve structures involved in the embodiments of the present disclosure, and for other structures, reference may be made to usual designs.

The embodiments of the present disclosure, that is, features in the embodiments, may be combined with each other to obtain new embodiments if there is no conflict.

Although the implementation modes disclosed in the embodiments of the present disclosure are described above, contents are only implementation modes for facilitating understanding the embodiments of the present disclosure, which are not intended to limit the embodiments of the present disclosure. Any person skilled in the art to which the embodiments of the present disclosure pertain may make any modifications and variations in forms and details of implementation without departing from the spirit and scope disclosed in the embodiments of the present disclosure. Nevertheless, the scope of patent protection of the embodiments of the present disclosure shall still be subject to the scope defined by the appended claims.

The invention claimed is:

1. A display substrate, comprising K pixel rows, wherein:
K is a positive integer greater than 1; at least one pixel row of the K pixel rows comprises an initial signal line, a scan signal line, and a plurality of sub-pixels disposed sequentially along an extension direction of the initial signal line and the scan signal line;
the initial signal line comprises a third initial signal line, the scan signal line comprises a second scan signal line, and at least one sub-pixel of the plurality of sub-pixels comprises a pixel drive circuit, and the pixel drive circuit comprises at least a third transistor as a drive transistor and an eighth transistor as an initialization transistor;
in the at least one pixel row, the eighth transistor is connected with the third initial signal line, the second scan signal line, and a second electrode of the drive transistor, and is configured to supply an initial signal of the third initial signal line to the second electrode of the drive transistor under control of the second scan signal line;
the display substrate further comprises a plurality of light emitting elements corresponding to a plurality of pixel drive circuits, a first scan signal line, a third scan signal line, a fourth scan signal line, a first initial signal line, a second initial signal line, a first power line, a light emitting control line, and a data signal line;
the pixel drive circuits are configured to drive the light emitting elements to emit light, and the pixel drive circuit comprises a first reset sub-circuit, a second reset sub-circuit, a third reset sub-circuit, a write-in sub-circuit, a compensation sub-circuit, a drive sub-circuit and a light emitting sub-circuit;
the first reset sub-circuit is respectively connected with the first initial signal line, a second node and the first scan signal line, and is configured to write an initial signal of the first initial signal line into the second node under control of the first scan signal line;
the second reset sub-circuit is respectively connected with the second initial signal line, the second scan signal line and a first electrode of a light emitting element, and is configured to write an initial signal of the second initial signal line into the first electrode of the light emitting element under control of the second scan signal line;

the third reset sub-circuit is respectively connected with the third initial signal line, a third node and the second scan signal line, and is configured to write the initial signal of the third initial signal line into the third node under control of the second scan signal line;

the write-in sub-circuit is respectively connected with the fourth scan signal line, the data signal line and the third node, and is configured to write a data signal of the data signal line to the third node under control of the fourth scan signal line;

the compensation sub-circuit is respectively connected with the first power line, the third scan signal line, a first node and the second node, and is configured to provide a signal of the first node to the second node under control of the third scan signal line until a signal of the second node meets a threshold condition;

the drive sub-circuit is electrically connected with the first node, the second node and the third node respectively, and is configured to provide a drive current to the third node according to the signal of the first node and the signal of the second node;

the light emitting sub-circuit is respectively connected with the first power line, the first node, the third node, the light emitting control line and the first electrode of the light emitting element, and is configured to write a signal of the first power line into the first node and a signal of the third node into the first electrode of the light emitting element under control of the light emitting control line;

the first reset sub-circuit comprises a first transistor, the second reset sub-circuit comprises a seventh transistor, the third reset sub-circuit comprises the eighth transistor, the write-in sub-circuit comprises a fourth transistor, the compensation sub-circuit comprises a second transistor and a storage capacitor, the drive sub-circuit comprises the third transistor, and the light emitting sub-circuit comprises a fifth transistor and a sixth transistor;

in a direction perpendicular to the display substrate, the display substrate comprises a base substrate and a shielding layer, a first insulation layer, a first semiconductor layer, a second insulation layer, a first conductive layer, a third insulation layer, a second conductive layer, a fourth insulation layer, a second semiconductor layer, a fifth insulation layer, a third conductive layer, a sixth insulation layer, a fourth conductive layer, a seventh insulation layer, a first planarization layer and a fifth conductive layer which are sequentially stacked on the base substrate; and the first semiconductor layer comprises active layers of the third transistor to the eighth transistor; the first conductive layer comprises control electrodes of the third transistor to the eighth transistor, a first electrode plate of the storage capacitor, and the first initial signal line; the second conductive layer comprises a second electrode plate of the storage capacitor; the second semiconductor layer comprises active layers of the first transistor and the second transistor; the third conductive layer comprises the first scan signal line, the third scan signal line, and the second initial signal line; the fourth conductive layer comprises first electrodes and second electrodes of the first transistor to the eighth transistor, and a connection electrode of the second electrode plate, and the third initial signal line; and the fifth conductive layer comprises the data signal line, the first power line and an anode connection electrode of the light emitting element.

2. The display substrate according to claim 1, wherein third initial signal lines in two adjacent pixel rows provide different initial signals, sub-pixels located in a same pixel row emit light of a same color, and sub-pixels located in two adjacent pixel rows emit light of different colors.

3. The display substrate according to claim 1, wherein:
a control electrode of the first transistor is connected with the first scan signal line, the first electrode of the first transistor is connected with the first initial signal line, and the second electrode of the first transistor is connected with the second node;

the control electrode of the eighth transistor is connected with the second scan signal line, the first electrode of the eighth transistor is connected with the third initial signal line, and the second electrode of the eighth transistor is connected with the third node; and the control electrode of the seventh transistor is connected with the second scan signal line, the first electrode of the seventh transistor is connected with the second initial signal line, and the second electrode of the seventh transistor is connected with the first electrode of the light emitting element.

4. The display substrate according to claim 1, wherein:
the control electrode of the fourth transistor is connected with the fourth scan signal line, the first electrode of the fourth transistor is connected with the data signal line, and the second electrode of the fourth transistor is connected with the third node.

5. The display substrate according to claim 1, wherein:
a control electrode of the second transistor is connected with the third scan signal line, the first electrode of the second transistor is connected with the second node, and the second electrode of the second transistor is connected with the first node; and the first electrode plate of the storage capacitor is connected with the second node and the second electrode plate of the storage capacitor is connected with the first power line.

6. The display substrate according to claim 1, wherein:
the drive sub-circuit comprises the third transistor; and
the control electrode of the third transistor is connected with the second node, the first electrode of the third transistor is connected with the first node, and the second electrode of the third transistor is connected with the third node.

7. The display substrate according to claim 1, wherein:
the control electrode of the fifth transistor is connected with the light emitting control line, the first electrode of the fifth transistor is connected with the first power line, and the second electrode of the fifth transistor is connected with the first node; and the control electrode of the sixth transistor is connected with the light emitting control line, the first electrode of the sixth transistor is connected with the third node, and the second electrode of the sixth transistor is connected with the first electrode of the light emitting element.

8. The display substrate according to claim 1, wherein:
the control electrode of the first transistor is connected with the first scan signal line, the first electrode of the first transistor is connected with the first initial signal line, and the second electrode of the first transistor is connected with the second node;

the control electrode of the second transistor is connected with the third scan signal line, the first electrode of the second transistor is connected with the second node, and the second electrode of the second transistor is connected with the first node;

the control electrode of the third transistor is connected with the second node, the first electrode of the third transistor is connected with the first node, and the second electrode of the third transistor is connected with the third node;

the control electrode of the fourth transistor is connected with the fourth scan signal line, the first electrode of the fourth transistor is connected with the data signal line, and the second electrode of the fourth transistor is connected with the third node;

the control electrode of the fifth transistor is connected with the light emitting control line, the first electrode of the fifth transistor is connected with the first power line, and the second electrode of the fifth transistor is connected with the first node;

the control electrode of the sixth transistor is connected with the light emitting control line, the first electrode of the sixth transistor is connected with the third node, and the second electrode of the sixth transistor is connected with the first electrode of the light emitting element;

the control electrode of the seventh transistor is connected with the second scan signal line, the first electrode of the seventh transistor is connected with the second initial signal line, and the second electrode of the seventh transistor is connected with the first electrode of the light emitting element;

the control electrode of the eighth transistor is connected with the second scan signal line, the first electrode of the eighth transistor is connected with the third initial signal line, and the second electrode of the eighth transistor is connected with the third node; and the first electrode plate of the storage capacitor is connected with the second node and the second electrode plate of the storage capacitor is connected with the first power line.

9. The display substrate according to claim 8, wherein the first transistor and the second transistor are oxide transistors and the third to eighth transistors are low temperature poly-crystalline silicon transistors.

10. The display substrate according to claim 1, wherein: the third conductive layer further comprises control electrodes of the first transistor and the second transistor.

11. The display substrate according to claim 1, wherein: the shielding layer comprises a first shielding structure, a second shielding structure, a third shielding structure, and a shielding block;

in a plane where the display substrate is located, the first shielding structure is a strip shape extending along a first direction, the first shielding structure is disposed at a side of the shielding block in the first direction and connected with the shielding block; the second shielding structure is a strip shape extending along the second direction, the second shielding structure is disposed at a side of the shielding block in the second direction and connected with the shielding block; the third shielding structure is in a shape of bend line extending along a second direction, the third shielding structure is disposed on an opposite side of the second direction Y of the shielding block and connected with the shielding block; and an orthographic projection of a channel region of the active layer of the third transistor on the base substrate is within a range of an orthographic projection of the shielding block on the base substrate.

12. The display substrate according to claim 11, wherein the first shielding structure of each pixel drive circuit is connected with the shielding block of a pixel drive circuit adjacent in the first direction; the second shielding structure of each pixel drive circuit is connected with the third shielding structure of a pixel drive circuit adjacent in the second direction.

13. The display substrate according to claim 1, wherein: the active layer of the third transistor to the active layer of the seventh transistor are connected to each other and form an integrated structure;

the active layer of the third transistor is in an inverted "Ω" shape, and an active layer of the fourth transistor to an active layer of the eighth transistor each is in an "I" shape; and in a plane where the first semiconductor is located, in a first direction, the active layer of the fourth transistor, the active layer of the sixth transistor are located on a same side of the active layer of the third transistor, the active layer of the fifth transistor is located on the other side of the active layer of the third transistor, and the active layer of the eighth transistor is located between the active layer of the fifth transistor and the active layer of the seventh transistor; in a second direction, the active layer of the fourth transistor, the active layer of the sixth transistor are located on both sides of the active layer of the third transistor, the active layer of the fifth transistor, the active layer of the sixth transistor, the active layer of the seventh transistor, the active layer of the eighth transistor are located on a same side of the active layer of the third transistor, and the active layer of the seventh transistor is located on a side of the active layer of the sixth transistor away from the active layer of the fourth transistor.

14. The display substrate according to claim 1, wherein: in a plane where the first conductive layer is located, main body parts of the second scan signal line, the light emitting control line, the fourth scan signal line and the first initial signal line extend along the first direction, and in a same pixel drive circuit, the second scan signal line, the light emitting control line, the first electrode plate of the storage capacitor, the fourth scan signal line and the first initial signal line are sequentially arranged along the second direction;

the first electrode plate is in a shape of a rectangle and corners of the rectangular are provided with chamfers, an orthographic projection of the first electrode plate on the base substrate is overlapped with an orthographic projection of the active layer of the third transistor on the base substrate, and the first electrode plate is multiplexed as the control electrode of the third transistor; and an overlapping area between the fourth scan signal line and the active layer of the fourth transistor serves as the control electrode of the fourth transistor, an overlapping area between the light emitting control line and the active layer of the fifth transistor serves as the control electrode of the fifth transistor, an overlapping area between the light emitting control line and the active layer of the sixth transistor serves as the control electrode of the sixth transistor, an overlapping area between the second scan signal line and the active layer of the seventh transistor serves as the control electrode of the seventh transistor, and an overlapping area between the second scan signal line and the active layer of the eighth transistor serves as the control electrode of the eighth transistor.

15. The display substrate according to claim 1, wherein: the second conductive layer further comprises a first shielding line and a second shielding line;

in a plane where the second conductive layer is located, main body parts of the first shielding line and the second shielding line extend along a first direction; in a second direction, the second shielding line is located between the first shielding line and the second electrode plate;

the first shielding line is configured as a shielding layer of the first transistor, shielding a channel of the first transistor; the second shielding line is configured as a shielding layer of the second transistor, shielding a channel of the second transistor; and the second electrode plate is in a shape of a rectangle and corners of the rectangular is provided with chamfers, an orthographic projection of the second electrode plate on the base substrate is overlapped with an orthographic projection of the first electrode plate on the base substrate.

16. The display substrate according to claim 1, wherein:

the active layer of the first transistor and the active layer of the second transistor are connected to each other and form an integrated structure;

the active layer of the first transistor and the active layer of the second transistor each is in an "I" shape, the first transistor and the second transistor each comprises a first region and a second region, and the second region of the active layer of the first transistor serves as the first region of the active layer of the second transistor; and in a plane where the display substrate is located, in a first direction, the active layer of the first transistor and the active layer of the second transistor are located on a side of the active layer of the third transistor away from the active layer of the fourth transistor; in a second direction, the active layer of the first transistor and the active layer of the second transistor are located on a side of the active layer of the third transistor away from the active layer of the fifth transistor, and the active layer of the first transistor is located on a side of the active layer of the second transistor away from the active layer of the third transistor.

17. The display substrate according to claim 1, wherein:

in a plane where the third conductive layer is located, main body parts of the first scan signal line, the third scan signal line, and the second initial signal line extend along a first direction, in a second direction, the third scan signal line is located between the first scan signal line and the second initial signal line; and an overlapping area between the first scan signal line and the active layer of the first transistor serves as the control electrode of the first transistor and an overlapping area between the third scan signal line and the active layer of the second transistor serves as the control electrode of the second transistor.

18. A display device, comprising the display substrate according to claim 1.

* * * * *